(12) United States Patent
Kim et al.

(10) Patent No.: US 12,133,384 B2
(45) Date of Patent: Oct. 29, 2024

(54) SEMICONDUCTOR DEVICE

(71) Applicant: SAMSUNG ELECTRONICS CO., LTD., Suwon-si (KR)

(72) Inventors: Junhyoung Kim, Seoul (KR); Jisung Cheon, Ansan-si (KR); Yoonhwan Son, Seoul (KR); Seungmin Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/352,182

(22) Filed: Jul. 13, 2023

(65) Prior Publication Data

US 2023/0363157 A1 Nov. 9, 2023

Related U.S. Application Data

(63) Continuation of application No. 17/897,255, filed on Aug. 29, 2022, now Pat. No. 11,737,270, which is a
(Continued)

(30) Foreign Application Priority Data

Mar. 26, 2020 (KR) ........................ 10-2020-0037079

(51) Int. Cl.
*H10B 43/20* (2023.01)
*H10B 43/30* (2023.01)
*H10B 43/40* (2023.01)

(52) U.S. Cl.
CPC ............. *H10B 43/20* (2023.02); *H10B 43/30* (2023.02); *H10B 43/40* (2023.02)

(58) Field of Classification Search
CPC ........ H10B 43/20; H10B 43/30; H10B 43/40; H10B 43/27; H10B 43/10; H10B 43/00;
(Continued)

(56) References Cited

U.S. PATENT DOCUMENTS 8,476,713 B2 7/2013 Lee et al.
8,951,859 B2 2/2015 Higashitani et al.
(Continued)

OTHER PUBLICATIONS

Office Action in Korean Appln. No. 10-2020-0037079, mailed on Sep. 11, 2024, 12 pages (with English translation).

*Primary Examiner* — Allison Bernstein
(74) *Attorney, Agent, or Firm* — Fish & Richardson P.C.

(57) ABSTRACT

A semiconductor device includes a lower structure; a first upper structure including lower gate layers on the lower structure; a second upper structure including upper gate layers on the first upper structure; separation structures penetrating the first and second upper structures on the lower structure; a memory vertical structure penetrating the lower and upper gate layers between the separation structures; and a first contact plug penetrating the first and second upper structures and spaced apart from the lower and upper gate layers. Each of the first contact plug and the memory vertical structure includes a lateral surface having a bent portion. The bent portion of the lateral surface is disposed between a first height level on which an uppermost gate layer of the lower gate layers is disposed and a second height level on which a lowermost gate layer of the upper gate layers is disposed.

20 Claims, 56 Drawing Sheets

Related U.S. Application Data continuation of application No. 17/032,128, filed on Sep. 25, 2020, now Pat. No. 11,437,396.

(58) Field of Classification Search
CPC ... H10B 43/50; H10B 43/35; H01L 29/66833; H01L 29/792
See application file for complete search history.

(56) References Cited

U.S. PATENT DOCUMENTS

| | | |
|---|---|---|
| 9,281,317 B2 | 3/2016 | Higashitani et al. |
| 9,859,422 B2 | 1/2018 | Nishikawa et al. |
| 10,032,787 B2 | 7/2018 | Shin et al. |
| 10,115,667 B2 | 10/2018 | Yun et al. |
| 10,319,729 B2 | 6/2019 | Hasegawa et al. |
| 10,388,666 B1 | 8/2019 | Kai et al. |
| 10,651,197 B2 * | 5/2020 | Hong ................. H10B 43/10 |
| 2018/0366487 A1 | 12/2018 | Okizumi et al. |
| 2019/0280003 A1 | 9/2019 | Mushiga et al. |
| 2021/0151462 A1 * | 5/2021 | Baek ................. H10B 41/50 |
| 2021/0384218 A1 * | 12/2021 | Baek ................. H10B 43/50 |

* cited by examiner

SEMICONDUCTOR DEVICE

CROSS-REFERENCE TO RELATED APPLICATIONS

This is application is a continuation of U.S. application Ser. No. 17/897,255, filed Aug. 29, 2022, which is continuation of U.S. application Ser. No. 17/032,128, filed Sep. 25, 2020, and a claim of priority is made to Korean Patent Application No. 10-2020-0037079 filed on Mar. 26, 2020, in the Korean Intellectual Property Office, the disclosures of which are incorporated herein by reference in their entireties.

BACKGROUND

Example embodiments of the present disclosure relate to a semiconductor device, and particularly, to a semiconductor device including a memory vertical structure and a method of manufacturing the same.

As the demand for high performance, high speed, and/or multifunctionality of a semiconductor device has increased, integration density of a semiconductor device has been increased. To increase integration density of a semiconductor device, a method of disposing gates in a vertical direction has been suggested, rather than disposing gates on a two-dimensional plane.

SUMMARY

An example embodiment of the present disclosure provides a semiconductor device which may improve integration density.

An example embodiment of the present disclosure provides a semiconductor device which may improve integration density and may also secure reliability.

According to an example embodiment of the present disclosure, a semiconductor device includes: a lower structure; a first upper structure including lower gate layers on the lower structure; a second upper structure including upper gate layers on the first upper structure; separation structures penetrating the first and second upper structures on the lower structure; a memory vertical structure penetrating the first and second upper structures and penetrating the lower and upper gate layers between the separation structures; and a first contact plug penetrating the first and second upper structures and spaced apart from the lower and upper gate layers. The memory vertical structure includes a lateral surface having at least one bent portion. The first contact plug includes a lateral surface having at least one bent portion. The at least one bent portion of the lateral surface of the memory vertical structure and the at least one bent portion of the lateral surface of the first contact plug are disposed between a first height level on which an uppermost gate layer of the lower gate layers is disposed and a second height level on which a lowermost gate layer of the upper gate layers is disposed.

According to an example embodiment of the present disclosure, a semiconductor device includes: a lower structure including a substrate, a circuit structure including lower pads on the substrate, a lower insulating layer covering the circuit structure, and a pattern structure and a first intermediate insulating layer on the lower structure; a first pad pattern including a first pad portion in the first intermediate insulating layer and a first via portion extending downwardly from the first pad portion and electrically connected to a first lower pad of the lower pads; a contact pattern including a contact portion overlapping the pattern structure and in contact with the pattern structure, an extension portion extending from the contact portion into an intermediate insulating layer, and a second via portion extending downwardly from the extension portion and electrically connected to a second lower pad of the lower pads; lower gate layers stacked in order on the pattern structure and upper gate layers stacked in order on the lower gate layers; a memory vertical structure penetrating the lower and upper gate layers on the pattern structure; and a first contact plug spaced apart from the lower and upper gate layers on the first pad pattern. The contact pattern and the pad pattern have upper surfaces coplanar with each other. The contact portion of the contact pattern has a first thickness. At least a portion of the extension portion and at least a portion of the pad portion has a second thickness greater than the first thickness.

According to an example embodiment of the present disclosure, a semiconductor device includes: a lower structure; a first upper structure including lower gate layers on the lower structure; a second upper structure including upper gate layers on the first upper structure; separation structures penetrating the first and second upper structures and extending into the lower structure on the lower structure; a memory vertical structure penetrating the first and second upper structures and penetrating the lower and upper gate layers between the separation structures; and a contact plug penetrating the first and second upper structures and spaced apart from the lower and upper gate layers. The memory vertical structure includes a lateral surface having at least one bent portion. The first contact plug includes a lateral surface having at least one bent portion. The at least one bent portion of the lateral surface of the memory vertical structure and the at least one bent portion of the lateral surface of the contact plug are disposed between a first height level on which an uppermost gate layer of the lower gate layers is disposed and a second height level on which a lowermost gate layer of the upper gate layers is disposed. Each of the separation structures includes a vertical portion penetrating the first and second upper structures and a lower portion extending into the lower structure. In the separation structures, a maximum width of the lower portion adjacent to the vertical portion is greater than a width of the vertical portion adjacent to the lower portion.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the accompanying drawings.

Figure 1:
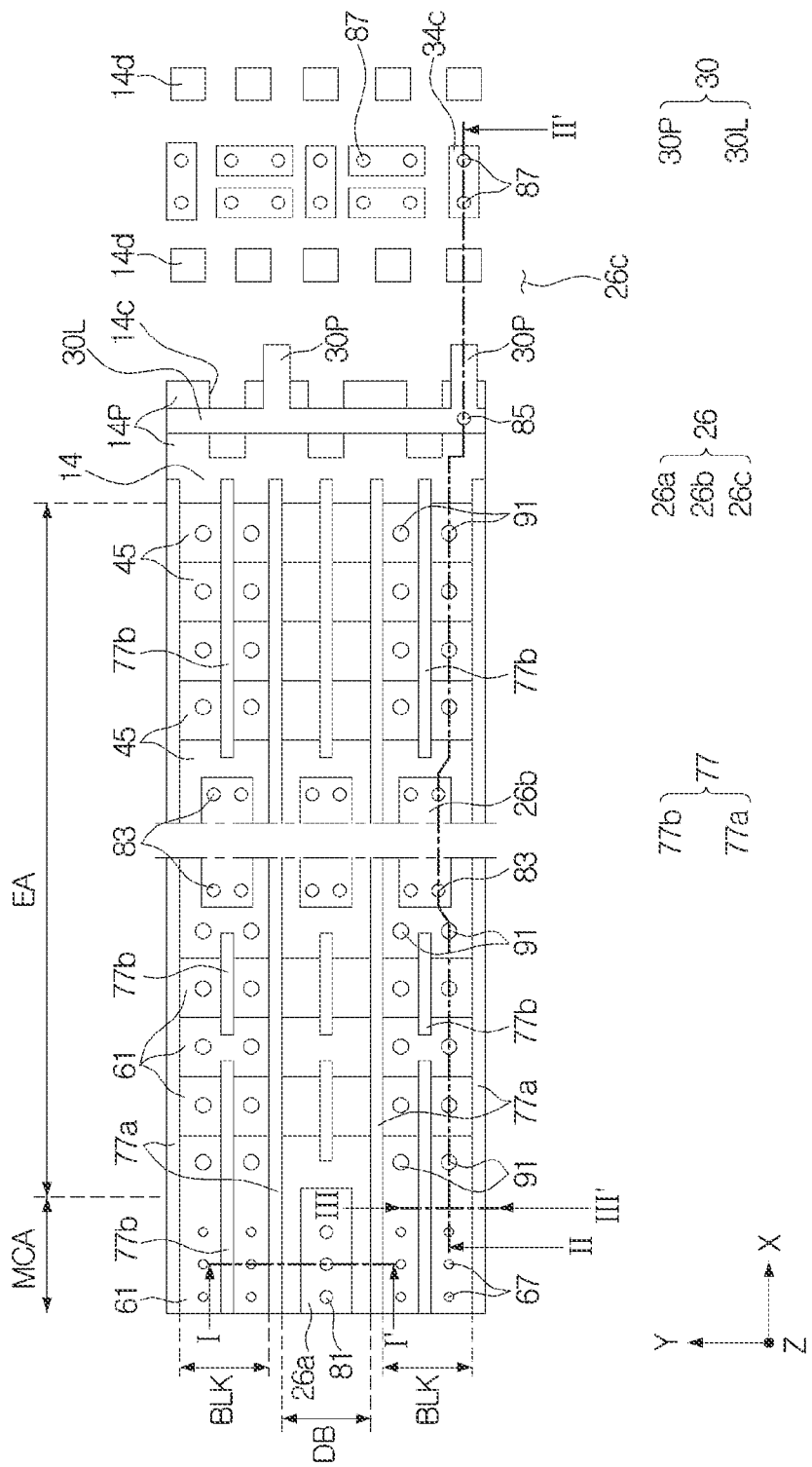
FIG. 1 is a plan diagram illustrating a semiconductor device according to an example embodiment of the present disclosure.
Figure 2A:
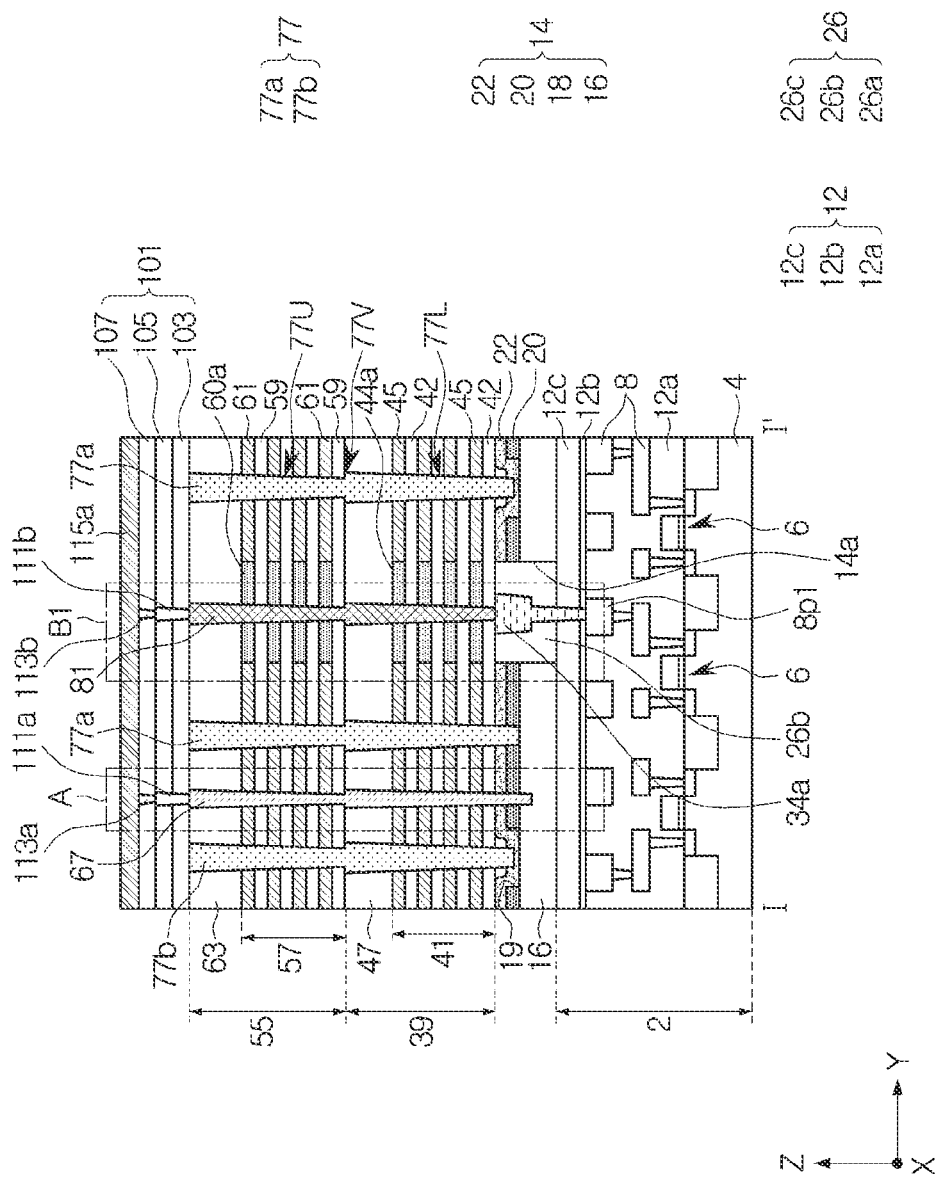
FIGS. 2A and 2B are cross-sectional diagrams illustrating a semiconductor device according to an example embodiment of the present disclosure.
Figure 2B:
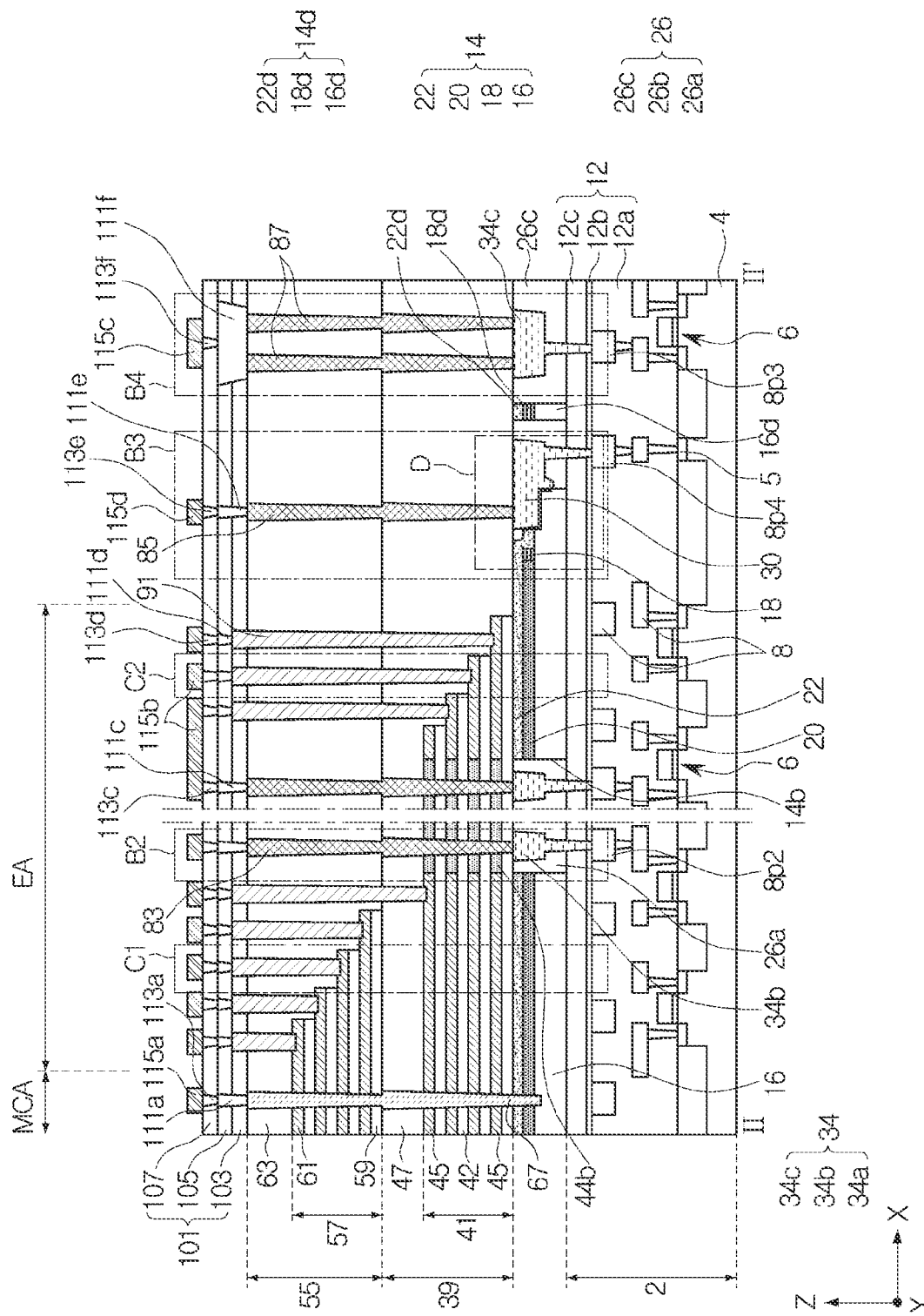

FIG. 1 is a plan diagram illustrating a semiconductor device according to an example embodiment. FIGS. 2A and 2B are cross-sectional diagrams illustrating a semiconductor device according to an example embodiment. FIG. 2A is a cross-sectional diagram along line I-I' in FIG. 1 and FIG. 2B is a cross-sectional diagram along line II-II' in FIG. 1.

Referring to FIGS. 1, 2A, and 2B, a lower structure 2 may be provided. The lower structure 2 may include a substrate 4, a lower integration circuit 6 on the substrate 4, a lower wiring structure 8, and a lower insulating structure 12. The substrate 4 may be a semiconductor substrate such as single crystalline silicon. The lower integration circuit 6 may include a circuit for operating a memory cell array which may store data in a memory device such as a flash memory or a variable resistive memory. The lower wiring structure 8 may include first to fourth lower pads 8p1, 8p2, 8p3, and 8p4.

The lower insulating structure 12 may include a first lower insulating layer 12a covering the lower integration circuit 6 and the lower wiring structure 8, an etch stop layer 12b on the first lower insulating layer 12a, and a second lower insulating layer 12c on the etch stop layer 12b.

A pattern structure 14 and a dummy pattern 14d may be disposed on the lower insulating structure 12.

In an example embodiment, the pattern structure 14 may include a lower pattern layer 16, an intermediate pattern layer 20 having an opening 19 on the lower pattern layer 16, and an upper pattern layer 22 covering the intermediate pattern layer 20 on the lower pattern layer 16.

In an example embodiment, the pattern structure 14 may further include a sacrificial pattern layer 18 surrounded by the lower pattern layer 16, the upper pattern layer 22, and the intermediate pattern layer 20 in a region adjacent to an edge of the lower pattern layer 16.

In an example embodiment, the lower pattern layer 16 may include a first polysilicon, the intermediate pattern layer 20 may include a second polysilicon, and the upper pattern layer 22 may include a third polysilicon. For example, the lower pattern layer 16, the intermediate pattern layer 20, and the upper pattern layer 22 may include polysilicon having N-type conductivity.

In an example embodiment, the pattern structure 14 may include a first portion at which the lower pattern layer 16 is directly in contact with the upper pattern layer 22, and a second portion in which the intermediate pattern layer 20 is interposed between the lower pattern layer 16 and the upper pattern layer 22. In the pattern structure 14, the first portion at each of which the lower pattern layer 16 is directly in contact with the upper pattern layer 22 may be configured as a plurality of first portions spaced apart from each other.

The dummy pattern 14d may include a lower dummy pattern layer 16d, a sacrificial dummy pattern layer 18d, and an upper dummy pattern layer 22d stacked in order and having lateral surfaces vertically aligned.

The lower dummy pattern layer 16d may be formed with a material and/or to a thickness the same as those of the lower pattern layer 16. The sacrificial dummy pattern layer 18d may be formed with a material and/or a thickness the same as those of the sacrificial pattern layer 18. The upper dummy pattern layer 22d may be formed with a material and/or a thickness the same as those of the upper pattern layer 22.

At least a portion of the pattern structure 14 may have a thickness substantially the same as a thickness of the dummy pattern 14d. For example, a thickness of a second portion of the pattern structure 14 at which the intermediate pattern layer 20 is interposed between the lower pattern layer 16 and the upper pattern layer 22 may be substantially the same as a thickness of the dummy pattern 14d.

The pattern structure 14 may include a first internal opening 14a and a second internal opening 14b.

An intermediate insulating structure 26 may be disposed on the lower structure 2. The intermediate insulating structure 26 may surround lateral surfaces of the pattern structure 14 and the dummy pattern 14d and may have an upper surface coplanar with upper surfaces of the pattern structure 14 and the dummy pattern 14d. The intermediate insulating structure 26 may include a first intermediate insulating layer 26a in the first internal opening 14a, a second intermediate insulating layer 26b in the second internal opening 14b, and an external intermediate insulating layer 26c surrounding an external surface of the pattern structure 14 and surrounding a lateral surface of the dummy pattern 14d. The intermediate insulating structure 26 may include silicon oxide.

A contact pattern 30 in contact with the pattern structure 14 and pad patterns 34 spaced apart from the pattern structure 14 may be disposed.

The contact pattern 30 and each of the pad patterns 34 may penetrate the intermediate insulating structure 26, may extend downwardly, and may penetrate the second lower insulating layer 12c and the etch stop layer 12b in order.

In an example embodiment, the contact pattern 30, the pad patterns 34, the pattern structure 14, the dummy pattern 14d, and the intermediate insulating structure 26 may have upper surfaces coplanar with one another.

The pad patterns 34 may include a first internal pad pattern 34a, a second internal pad pattern 34b, and an external pad pattern 34c. The first internal pad pattern 34a may penetrate the first intermediate insulating layer 26a, the second lower insulating layer 12c, and the etch stop layer 12b in order and may be in contact with the first lower pad 8p1. The second internal pad pattern 34b may penetrate the second intermediate insulating layer 26b, the second lower insulating layer 12c, and the etch stop layer 12b in order and may be in contact with the second lower pad 8p2. The external pad pattern 34c may penetrate the external intermediate insulating layer 26c, the second lower insulating layer 12c, and the etch stop layer 12b in order and may be in contact with the third lower pad 8p3. Each of the pad patterns 34 may include a pad portion and a via portion extending downwardly from a portion of the pad portion.

The contact pattern 30 may include a contact portion and a via portion extending downwardly from a portion of the contact portion. In the contact pattern 30, a portion of the contact portion may be in contact with the pattern structure 14, and the via portion may be in contact with the fourth lower pad 8p4. The contact pattern 30 may be electrically connected to a ground region 5 of the substrate 4 through the lower wiring structure 8 including the fourth lower pad 8p4. The substrate 4 may be a semiconductor substrate, and the ground region 5 may have N-type conductivity. Accordingly, the pattern structure 14 including the lower pattern layer 16 may be grounded to the substrate 4 through the contact pattern 30. The contact pattern 30 which may ground the pattern structure 14 may improve reliability of the semiconductor device.

The contact pattern 30 and the pad patterns 34 may include a common conductive material. For example, the contact pattern 30 and the pad patterns 34 may include a barrier material layer such as metal nitride (e.g., TiN) and a gap-fill material layer such as a metal (e.g., W, or the like).

In an example embodiment, the contact pattern 30 may further include a metal-semiconductor compound layer (e.g., a metal-silicide such as TiSi, TaSi, WSi, CoSi, NiSi, or the like) in contact with the pattern structure 14, rather than the pad patterns 34. The pad patterns 34 may not include the metal-semiconductor compound layer.

On a plane illustrated in FIG. 1, the pattern structure 14 may include external openings 14c (in FIG. 1) configured as open-type openings, and protrusions 14p (in FIG. 1) spaced apart from each other by the external openings 14c (in FIG. 1), on an edge portion thereof.

On a plane illustrated in FIG. 1, the contact pattern 30 may include a line portion 30L (in FIG. 1) crossing the protrusions 14p (in FIG. 1) and the external openings 14c (in FIG. 1), and an extension portion 30P (in FIG. 1) extending from the line portion 30L (in FIG. 1) to an external side of the pattern structure 14.

A first upper structure 39 and a second upper structure 55 may be stacked in order on the pattern structure 14 and the intermediate insulating structure 26.

The first upper structure 39 may include a lower stack structure 41 disposed on the pattern structure 14, and a lower capping insulating layer 47 covering the lower stack structure 41 and the external intermediate insulating layer 26c.

The second upper structure 55 may include an upper stack structure 57 overlapping the lower stack structure 41 on the lower capping insulating layer 47, and an upper capping insulating layer 63 covering the upper stack structure 57 and the lower capping insulating layer 47.

The lower stack structure 41 may include lower interlayer insulating layers 42 and lower gate layers 45 alternately stacked on the pattern structure 14. The lower stack structure 41 may further include a lower mold layer. The lower mold layer may include first lower mold layers 44a overlapping the first intermediate insulating layer 26a and disposed on a level the same as a level of the lower gate layers 45, and second lower mold layers 44b in contact with the second intermediate insulating layer 26b and disposed on a level the same as a level of the lower gate layers 45.

The upper stack structure 57 may include upper interlayer insulating layers 59 and upper gate layers 61 alternately stacked. The upper stack structure 57 may further include upper mold layers 60a disposed on a level the same as a level of the upper gate layers 61. For example, the upper mold layers 60a may overlap the first intermediate insulating layer 26a and the first lower mold layers 44a.

In an example embodiment, a memory cell array region MCA and an extension region EA adjacent to the memory cell array region MCA may be disposed on the pattern structure 14.

The memory cell array region MCA may be a region in which the lower gate layers 45 and the upper gate layers 61 are stacked in order, and the extension region EA may be a region in which the lower gate layers 45 and the upper gate layers 61 stacked in order in the memory cell array region MCA may extend and may form gate pads having a staircase structure. Accordingly, the lower gate layers 45 may have first gate pads arranged in a first staircase structure in the extension region EA, and the upper gate layers 61 may have second gate pads arranged in a second staircase structure in the extension region EA.

In example embodiments, each of the first and second staircase structures may have various shapes such as a shape descending in one direction or in two directions perpendicular to each other.

Separation structures 77 penetrating the first and second upper structures 39 and 55 may be disposed.

The separation structures 77 may include main separation structures 77a, and auxiliary separation structures 77b disposed between the main separation structures 77a. The main separation structures 77a may extend in a first horizontal direction X and may separate or divide the first and second stack structures 41 and 57 in a second horizontal direction Y. A length of each of the main separation structures 77a in the first horizontal direction X may be greater than a length of each of the auxiliary separation structures 77b in the first horizontal direction X. In an example embodiment, each of the separation structures 77 may be formed of an insulating material. In another example embodiment, each of the separation structures 77 may include a conductive material layer and an insulating material layer surrounding a lateral surface of the conductive material layer.

Memory vertical structures 67 penetrating the first and second upper structures 39 and 55 may be disposed in the memory cell array region MCA. Each of the memory vertical structures 67 may include a data storage layer which may store data. The memory vertical structures 67 may be disposed on the pattern structure 14. The memory vertical structures 67 may be in contact with the pattern structure 14.

In the memory cell array region MCA, a memory block region BLK may be defined between a pair of main separation structures adjacent to each other among the main separation structures 77a. The memory block region BLK may include the lower and upper gate layers 45 and 61 and the memory vertical structures 67. A plurality of the memory block regions BLK may be disposed. The lower and upper mold layers 44a, 44b, and 60a may be disposed in a connection region DB adjacent to the memory block region BLK in the second horizontal direction Y.

On a plane illustrated in FIG. 1, the first intermediate insulating layer 26a may be adjacent to the memory block region BLK in the second horizontal direction Y. On a plane illustrated in FIG. 1, the second intermediate insulating layer 26b may be disposed in the extension region EA adjacent to the memory block region BLK in the first horizontal direction X.

A first internal contact plug 81 extending in a vertical direction Z on the first internal pad pattern 34a and penetrating the first and second upper structures 39 and 55, a second internal contact plug 83 extending in the vertical direction Z on the second internal pad pattern 34b and penetrating the first and second upper structures 39 and 55, a source contact plug 85 extending in the vertical direction Z on the contact pattern 30 and penetrating the first and second upper structures 39 and 55, and an external contact plug 87 extending in the vertical direction Z on the external pad pattern 34c and penetrating the first and second upper structures 39 and 55 may be disposed.

The first internal contact plug 81 may be in contact with the first internal pad pattern 34a, may extend in the vertical direction Z, and may penetrate the lower interlayer insulating layers 42, the first lower mold layers 44a, the lower capping insulating layer 47, the upper interlayer insulating layers 59, the upper mold layers 60a, and the upper capping insulating layer 63. The second internal contact plug 83 may be in contact with the second internal pad pattern 34b, may extend in the vertical direction Z and may penetrate the lower interlayer insulating layers 42, the second lower mold layers 44b, the lower capping insulating layer 47, and the upper capping insulating layer 63. The source contact plug 85 may be in contact with the contact pattern 30, may extend in the vertical direction Z, and may penetrate the lower and upper capping insulating layers 47 and 63. The external contact plug 87 may be in contact with the external pad pattern 34c, may extend in the vertical direction Z, and may penetrate the lower and upper capping insulating layers 47 and 63.

The first internal contact plug 81, the second internal contact plug 83, the source contact plug 85, and the external contact plug 87 may be formed of the same conductive material.

In an example embodiment, the separation structures 77, the memory vertical structures 67, the first internal contact plug 81, the second internal contact plug 83, the source contact plug 85, and the external contact plug 87 may have upper surfaces coplanar with one another.

In an example embodiment, a lower surface of the memory vertical structures 67 may be disposed to be lower than lower surfaces of the first internal contact plug 81, the second internal contact plug 83, the source contact plug 85, and the external contact plug 87.

In an example embodiment, a lower surface of the memory vertical structures 67 may be disposed to be lower than lower surfaces of the separation structures 77.

In an example embodiment, the lower surfaces of the separation structures 77 may be disposed to be lower than lower surfaces of the first internal contact plug 81, the second internal contact plug 83, the source contact plug 85, and the external contact plug 87.

In example embodiments, in the comparison between heights of one element and the other element, the heights may be defined with reference to an upper surface of the lower structure 2. For example, the configuration in which the lower surface of the memory vertical structures 67 is disposed to be lower than a lower surface of the first internal contact plug 81 may indicate that a level of the lower surface of the memory vertical structures 67 is lower than a level of the lower surface of the first internal contact plug 81 with reference to the upper surface of the lower structure 2.

In an example embodiment, each of the separation structures 77, the memory vertical structures 67, the first internal contact plug 81, the second internal contact plug 83, the source contact plug 85, and the external contact plug 87 may have a lateral surface having at least one bent portion.

In an example embodiment, the at least one bent portion in the separation structures 77, the memory vertical structures 67, the first internal contact plug 81, the second internal contact plug 83, the source contact plug 85, and the external contact plug 87 may be disposed between a first height level on which an uppermost gate layer of the lower gate layers 45 is disposed and a second height level on which a lowermost gate layer of the upper gate layers 61 is disposed.

In an example embodiment, each of the separation structures 77, the memory vertical structures 67, the first internal contact plug 81, the second internal contact plug 83, the source contact plug 85, and the external contact plug 87 may include a lower vertical portion in the first upper structure 39, an upper vertical portion in the second upper structure 55, and an intermediate portion disposed between the lower vertical portion and the upper vertical portion. The intermediate portion may be a portion between the lower vertical portion and the upper vertical portion at which a width may change. The intermediate portion may be referred to as a width changing portion or a stepped portion. For example, each of the separation structures 77 may include a lower vertical portion 77L in the first upper structure 39, an upper vertical portion 77U in the second upper structure 55, and an intermediate portion 77V between the lower vertical portion 77L and the upper vertical portion 77U at which a stepped portion is formed and/or a width changes.

An upper insulating structure 101 may be disposed on the second upper structure 55. The upper insulating structure 101 may include a first upper insulating layer 103, a second upper insulating layer 105, and a third upper insulating layer 107 stacked in order. The first to third upper insulating layers 103, 105, and 107 may be formed of silicon oxide.

Gate contact plugs 91 penetrating the first upper insulating layer 103, extending downwardly, and in contact with gate pads of the lower and upper gate layers 45 and 61 may be disposed. The gate contact plugs 91 may be formed of a conductive material.

Bit lines 115a, gate connection wirings 115b, a source connection wiring 115d, and an external connection wiring 115c may be disposed on the third upper insulating layer 107.

In the description below, one of the memory vertical structures 67, one of the bit lines 115a, one of the gate connection wirings 115b, and one of the gate contact plugs 91 will be described for ease of description.

A first lower connection plug 111a and a first upper connection plug 113a for electrically connecting the bit lines 115a to the memory vertical structures 67 may be disposed. A second lower connection plug 111b and a second upper connection plug 113b for electrically connecting the bit lines 115a to the first internal contact plug 81 may be disposed.

A third lower connection plug 111c and a third upper connection plug 113c for electrically connecting the gate connection wirings 115b to the second internal contact plug 83 may be disposed. A fourth lower connection plug 111d and a fourth upper connection plug 113d for electrically connecting the gate connection wirings 115b to the gate contact plugs 91 may be disposed. A fifth lower connection plug 111e and a fifth upper connection plug 113e for electrically connecting the source connection wiring 115d to the source contact plug 85 may be disposed. A sixth lower connection plug 111f and a sixth upper connection plug 113f for electrically connecting the external connection wiring 115c to the external contact plug 87 may be disposed.

The first to sixth upper connection plugs 113a to 113f may be disposed on the first to sixth lower connection plugs 111a to 111f.

In an example embodiment, one or a plurality of the external contact plugs 87 may be disposed on a single external pad pattern 34c. For example, a plurality of the external contact plugs 87 may be disposed on one of the external pad patterns 34c.

In an example embodiment, the plurality of external contact plugs 87 may be disposed on one of the external pad patterns 34c, and a single sixth lower connection plug 111f may be disposed on the plurality of external contact plugs 87. Accordingly, the plurality of external contact plugs 87 may be disposed between the single external pad patterns 34c and the single sixth lower connection plug 111f. Each of the single external pad pattern 34c and the sixth lower connection plug 111f may have a width greater than a width of each of the plurality of external contact plugs 87.

In another example embodiment, the lower structure 2, the pattern structure 14, and the intermediate insulating structure 26 may be replaced with a single semiconductor substrate. For example, the separation structures 77, the memory vertical structures 67, the first internal contact plug 81, the second internal contact plug 83, the source contact plug 85, and the external contact plug 87 may be disposed on the semiconductor substrate.

Figure 3:
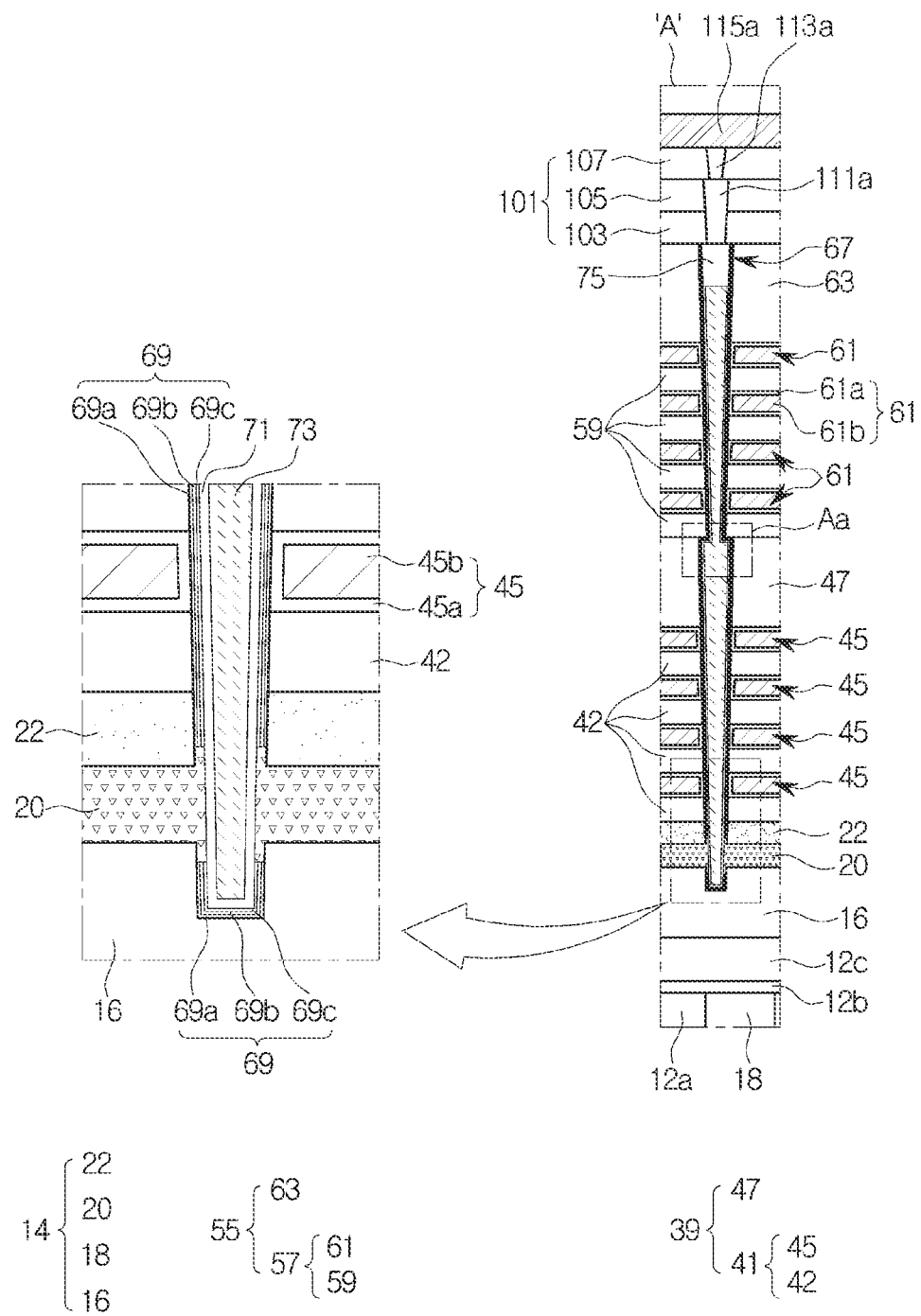
FIGS. 3, 4, 5, 6A, 6B, 7, 8A, 8B, 9, 10, 11, 12, 13, and 14 are cross-sectional diagrams illustrating portions of various examples of a semiconductor device.

In the description below, example embodiments of the memory vertical structures 67, the gate layers 45 and 59 and the pattern structure 14 described with reference to FIGS. 1, 2A, and 2B will be described with reference to FIGS. 3 and 4. FIG. 3 is an enlarged diagram illustrating a portion of region marked "A" in FIG. 2A, and FIG. 4 is an enlarged diagram illustrating a portion of region marked "Aa" in FIG. 3.

Figure 4:
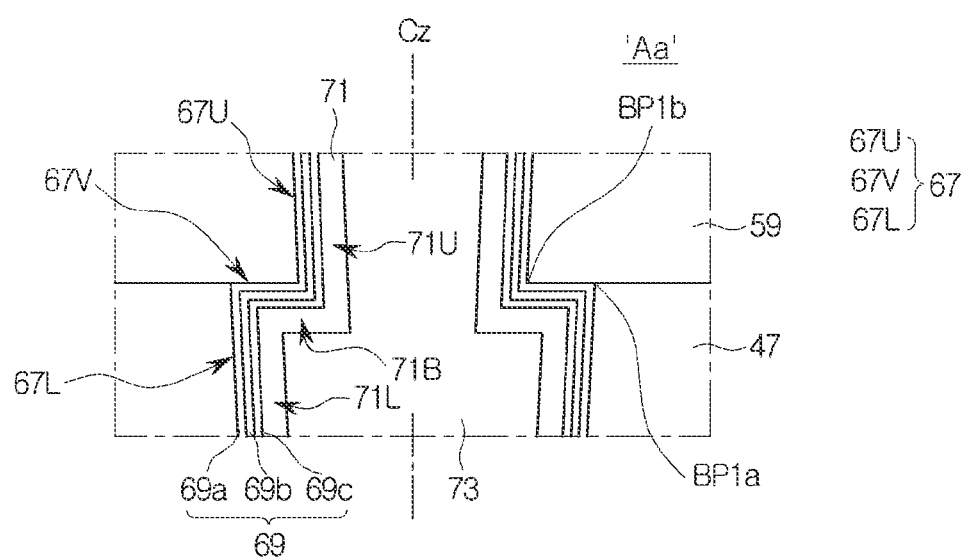

Referring to FIGS. 2A, 3, and 4, the memory vertical structure 67 may penetrate the upper pattern layer 22 and the intermediate pattern layer 20 in order and may extend into the lower pattern layer 16. The memory vertical structure 67 may include a core region 73, a channel layer 71, a channel pad 75, and a data storage structure 69.

The channel layer 71 may cover a lateral surface and a bottom surface of the core region 73. The channel layer 71 may be formed of a semiconductor material such as silicon. The channel pad 75 may be disposed on the core region 73 and may be in contact with the channel layer 71. The channel pad 75 may be formed of polysilicon having N-type conductivity. The data storage structure 69 may be interposed between the channel layer 71 and the first and second upper structures 39 and 55. A portion of the data storage structure 69 may be interposed between the channel layer 71 and the lower pattern layer 16. The intermediate pattern layer 20 may be in contact with the channel layer 71. A portion of the data storage structure 69 may be interposed between the upper pattern layer 22 and the channel layer 71.

The data storage structure 69 may include a first dielectric layer 69a, a second dielectric layer 69c, and a data storage layer 69b disposed between the first dielectric layer 69a and the second dielectric layer 69c. At least one of the first and second dielectric layers 69a and 69c may include silicon oxide and/or a high-k dielectric.

In an example embodiment, the data storage layer 69b may include regions which may store data in a semiconductor device such as a NAND flash memory device. For example, the data storage layer 69b may include regions which may store data between gate layers of the lower and upper gate layers 45 and 61 which may be word lines, and the channel layer 71. The data storage layer 69b may include a material which may trap an electric charge, such as silicon nitride, for example.

Each of the lower gate layers 45 may include a first lower gate layer 45a and a second lower gate layer 45b. The first lower gate layer 45a may cover an upper surface and a lower surface of the second lower gate layer 45b and may extend to a region between the memory vertical structures 67 and a lateral surface of the second lower gate layer 45b. Each of the upper gate layers 61 may include a first upper gate layer 61a and a second upper gate layer 61b. The first upper gate layer 61a may cover an upper surface and a lower surface of the second upper gate layer 61b and may extend to a region between the memory vertical structures 67 and a lateral surface of the second upper gate layer 61b.

In an example embodiment, the first lower gate layer 45a and the first upper gate layer 61a may include a dielectric material, and the second lower gate layer 45b and the second upper gate layer 61b may include a conductive material. For example, the first lower gate layer 45a and the first upper gate layer 61a may include a high-k dielectric such as AlO, or the like, and the second lower gate layer 45b and the second upper gate layer 61b may include a conductive material such as TiN, WN, Ti, or W.

In another example embodiment, the first lower gate layer 45a and the first upper gate layer 61a may include a first conductive material (e.g., TiN or W), and the second lower gate layer 45b and the second upper gate layer 61b may include a second conductive material (e.g., Ti or W) different from the first conductive material.

In another example embodiment, each of the lower and upper gate layers 45 and 61 may be formed of a doped polysilicon, a metal-semiconductor compound (e.g., TiSi, TaSi, CoSi, NiSi, or WSi), metal nitride (e.g., TiN, TaN, or WN), or a metal (e.g., Ti or W).

Referring to FIG. 4, the memory vertical structure 67 may include a lower vertical portion 67L penetrating the first upper structure 39, an upper vertical portion 67U penetrating the second upper structure 55, and an intermediate portion 67V disposed between the lower vertical portion 67L and the upper vertical portion 67U.

In the memory vertical structure 67, the intermediate portion 67V may be a width changing portion, a stepped portion, or a bent portion.

The memory vertical structure 67 may include a lateral surface having at least one bent portion. For example, with reference to a central vertical axis Cz disposed between both lateral surfaces of the memory vertical structure 67, the memory vertical structure 67 may include a first bent portion BP1a bent from an upper end of a lateral surface of the lower vertical portion 67L towards the central vertical axis Cz, and a second bent portion BP1b bent from a lower end of a lateral surface of the upper vertical portion 67U towards the central vertical axis Cz.

At least one of the data storage structure 69 and the channel layer 71 of the memory vertical structures 67 may include a bent portion below the second upper structure 55. For example, as illustrated in the cross-sectional surface in FIG. 4, the channel layer 71 may include a lower linear portion 71L disposed in the first upper structure 39, an upper linear portion 71U disposed in the second upper structure 55, and a bent portion 71B bent from an upper portion of the lower linear portion 71L and extending up to a lower portion of the upper linear portion 71U. The upper linear portion 71U and the lower linear portion 71L may not be vertically aligned or may not be self-aligned. The bent portion 71B may be disposed further below than a lowermost layer 59 of the first upper structure 39.

Figure 5:
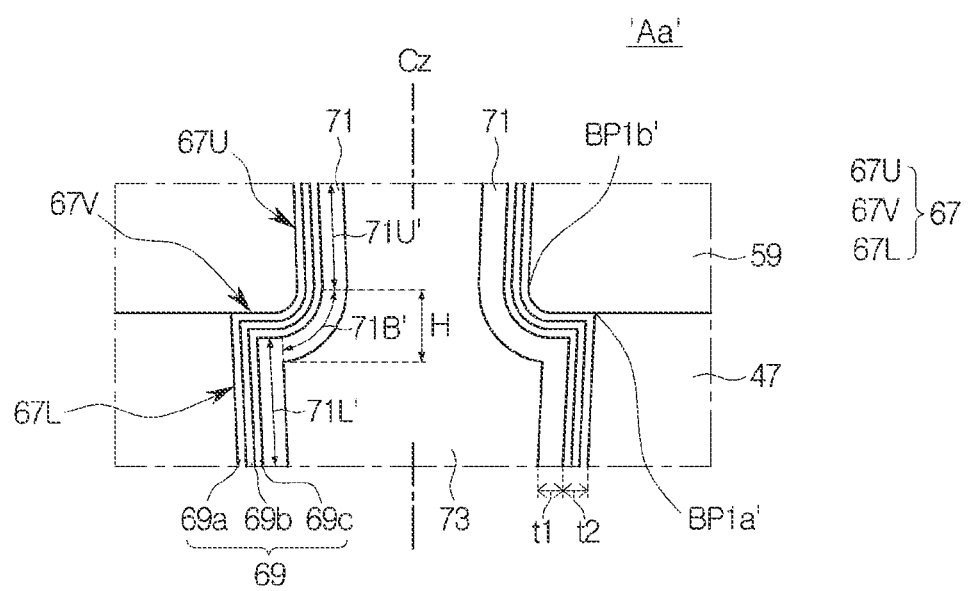

In the description below, a modified example of the memory vertical structures 67 described with reference to FIG. 4 will be described with reference to FIG. 5. FIG. 5 is an enlarged diagram illustrating a modified example of portion marked "Aa" in FIG. 3.

In the modified example, referring to FIGS. 3 and 5, with reference to the central vertical axis Cz disposed between both lateral surfaces of the memory vertical structures 67, each of the memory vertical structures 67 may include a lateral surface including a first bent portion BP1$a'$ bent from an upper end of a lateral surface of the lower vertical portion 67L towards the central vertical axis Cz, and a second bent portion BP1$b'$ bent from a lower end of a lateral surface of the upper vertical portion 67U towards the central vertical axis Cz. In the memory vertical structures 67, the intermediate portion 67V may be a region disposed between the first bent portion BP1$a'$ and the second bent portion BP1$b'$. The second bent portion BP1$b'$ may be disposed on a level different from a level of the first bent portion BP1$a'$. For example, the second bent portion BP1$b'$ may be disposed on a level higher than the first bent portion BP1$a'$. In an example, the bent portion may be an inflection portion.

At least one of the data storage structure 69 and the channel layer 71 may include a bent portion disposed in the first and second upper structures 39 and 55 adjacent to each other. For example, as illustrated in the cross-sectional surface in FIG. 5, the channel layer 71 may include a lower linear portion 71L' disposed in the first upper structure 39, an upper linear portion 71U' disposed in the second upper structure 55, and a bent portion 71B' bent from an upper portion of the lower linear portion 71L' and extending up to a lower portion of the upper linear portion 71U'. The upper linear portion 71U' and the lower linear portion 71L' may not be vertically aligned or may not be self-aligned.

A region of the bent portion 71B' bent from an upper portion of the lower linear portion 71L' may be disposed further below than a boundary surface between the first and second upper structures 39 and 55, and a region of the bent portion 71B' bent from a lower portion of the upper linear portion 71U' may be disposed further above a boundary surface between the first and second upper structures 39 and 55. A height difference H between a lower portion and an upper portion of the bent portion 71B' may be greater than a thickness t1 of the channel layer 71. A height difference H between a lower portion and an upper portion of the bent portion 71B' may be greater than a thickness t2 of the data storage structure 69.

Figure 6A:
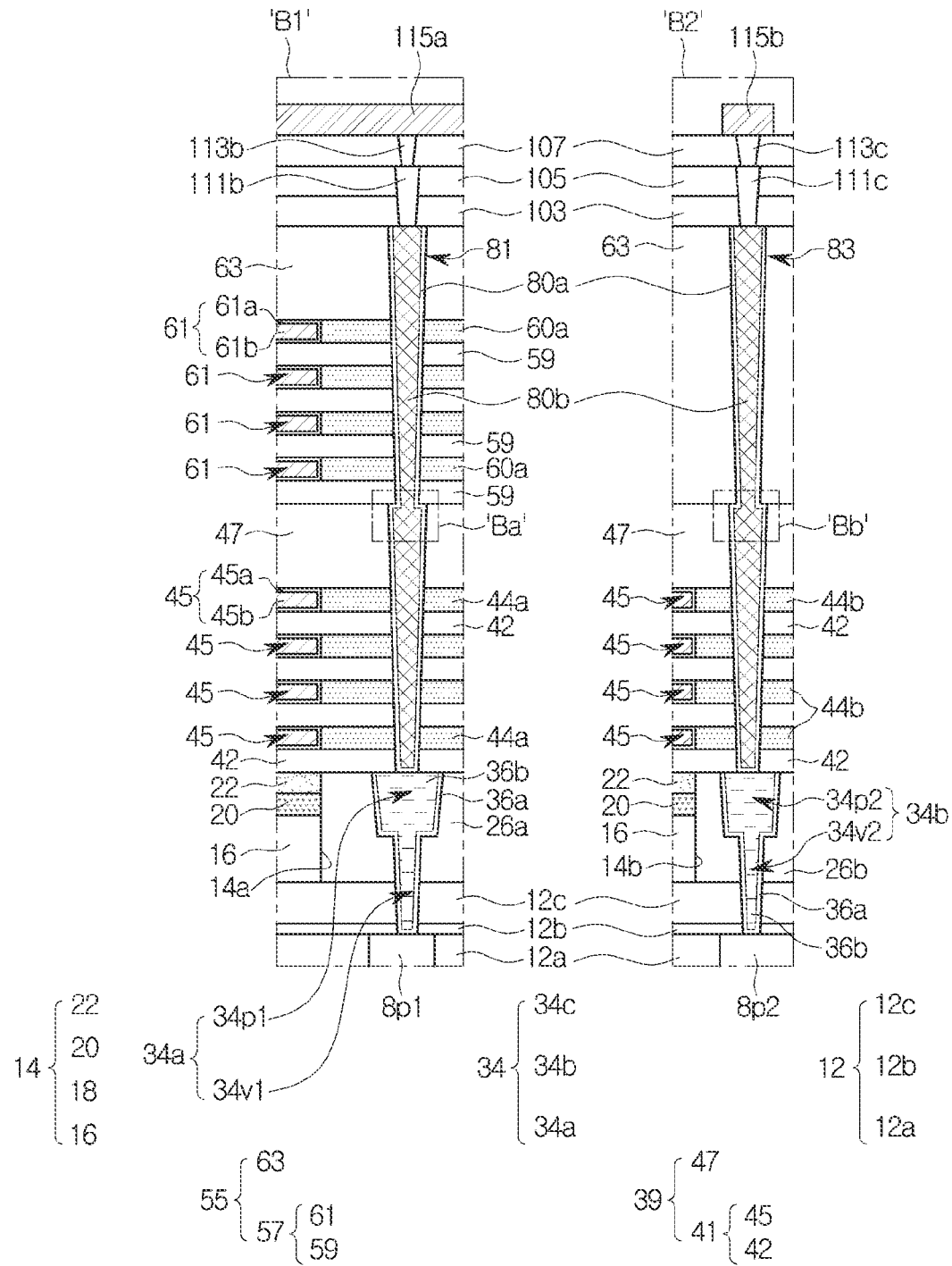
Figure 6B:
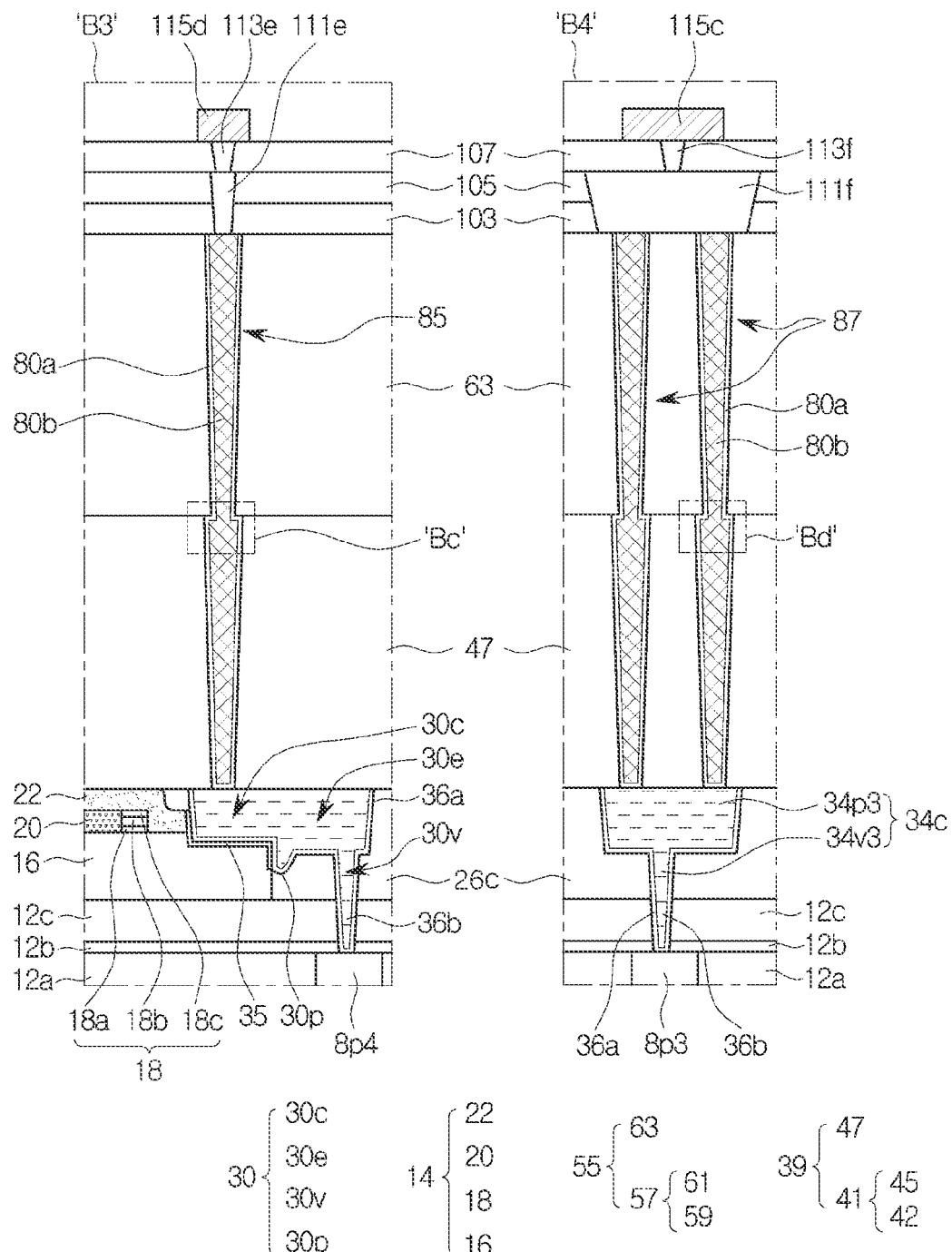
Figure 7:
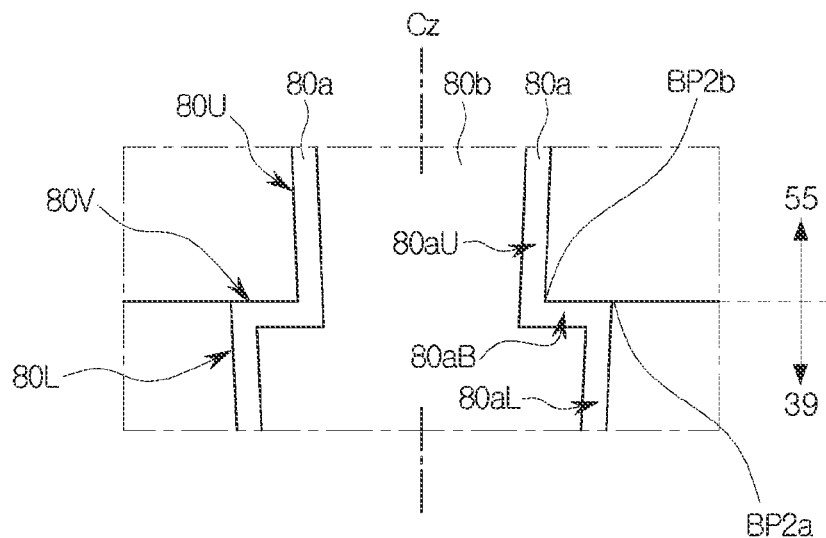

In the description below, example embodiments of the first and second internal pad patterns 34$a$ and 34$b$, the contact pattern 30, the external pad pattern 34$c$, the first and second internal contact plugs 81 and 83, the source contact plug 85, the external contact plug 87, and the sacrificial pattern layer 18, described with reference to FIGS. 2A and 2B, will be described with reference to FIGS. 6A, 6B, and 7. FIG. 6A is an enlarged diagram illustrating portions of region marked "B1" in FIG. 2A and region marked "B2" in FIG. 2B. FIG. 6B is an enlarged diagram illustrating portions of regions marked "B3" and "B4" in FIG. 2B. FIG. 7 is an enlarged diagram illustrating common characteristics of regions marked "Ba," "Bb," "Bc," and "Bd" in FIGS. 6A and 6B.

Referring to FIGS. 2A, 2B, 6A, 6B, and 7, in an example embodiment, the sacrificial pattern layer 18 (in FIGS. 2B and 6B) may include a first layer 18$a$, a second layer 18$b$, and a third layer 18$c$ stacked in order. The first and third layers 18$a$ and 18$c$ may be formed of silicon oxide, and the second layer 18$b$ may be formed of silicon nitride. In another example embodiment, the second layer 18$b$ may be formed of polysilicon.

The first internal pad pattern 34$a$ (in FIGS. 2A and 6A) may include a first pad portion 34$p$1 and a first via portion 34$v$1 extending downwardly from the first pad portion 34$p$1 and integrated with the first pad portion 34$p$1. The second internal pad pattern 34$b$ (in FIGS. 2A and 6A) may include a second pad portion 34$p$2 and a second via portion 34$v$2 extending downwardly from the second pad portion 34$p$2 and integrated with the second pad portion 34$p$2. The external pad pattern 34$c$ (in FIGS. 2A and 6B) may include a third pad portion 34$p$3 and a third via portion 34$v$3 extending downwardly from the third pad portion 34$p$3 and integrated with the third pad portion 34$p$3.

The contact pattern 30 (in FIGS. 2A and 6B) may include a contact portion 30$c$ in contact with the pattern structure 14, an extension portion 30$e$ extending from the contact portion 30$c$ into the external intermediate insulating layer 26$c$, and a via portion 30$v$ extending downwardly from the extension portion 30$e$ and in contact with the fourth lower pad 8$p$4. The contact portion 30$c$ may overlap and be in contact with the pattern structure 14. The extension portion 30$e$ may extend from the contact portion 30$c$ into the external intermediate insulating layer 26$c$ and may be in contact with a portion of a lateral surface of the pattern structure 14. The via portion 30$v$ may extend downwardly from a lower portion of the extension portion 30$e$ and may be in contact with the fourth lower pad 8$p$4.

The contact pattern 30 may further include a lower protrusion 30$p$ protruding downwardly from a lower portion of the extension portion 30$e$. The contact portion 30$c$, the extension portion 30$e$, the via portion 30$v$, and the lower protrusion 30$p$ of the contact pattern 30 may be integrated with one another.

At least a portion of each of the first and second pad portions 34$p$1 and 34$p$2, at least a portion of the external pad 34$p$3, and at least a portion of the extension portion 30$e$ may have the same thickness.

Each of the first and second pad portions 34$p$1 and 34$p$2, the third pad portion 34$p$3, the contact portion 30$c$, and the extension portion 30$e$ may have a thickness less than a thickness of the pattern structure 14.

Each of the first and second internal pad patterns 34$a$ and 34$b$, the external pad pattern 34$c$, and the contact pattern 30 may include a pad gap-fill layer 36$b$ and a pad barrier layer 36$a$ covering a lateral surface and a bottom surface of the pad gap-fill layer 36$b$. The pad barrier layer 36$a$ may include metal nitride such as TiN, and the pad gap-fill layer 36$b$ may include a metal such as W (i.e., tungsten), or the like.

The contact pattern 30 may further include a metal-semiconductor compound layer 35 in contact with the pattern structure 14. The metal-semiconductor compound layer may include metal-silicide such as TiSi, TaSi, WSi, CoSi, or NiSi. In the contact pattern 30, the metal-semiconductor compound layer may be interposed between the pad barrier layer 36$a$ of the contact pattern 30 and the lower pattern layer 16, and between the pad barrier layer 36$a$ of the contact pattern 30 and the upper pattern layer 22.

Each of the first internal contact plug 81 (in FIGS. 2A and 6A), the second internal contact plug 83 (in FIGS. 2B and 6A), the source contact plug 85 (in FIGS. 2B and 6B), and the external contact plug 87 (in FIGS. 2B and 6B) may include a contact gap-fill layer 80b and a contact barrier layer 80a covering a lateral surface and a bottom surface of the contact gap-fill layer 80b. The contact barrier layer 80a may include metal nitride such as TiN, and may include a metal such as W, or the like.

As illustrated in the cross-sectional diagram illustrating a portion of the example embodiment in FIG. 7, each of the first internal contact plug 81, the second internal contact plug 83, the source contact plug 85, and the external contact plug 87 may include a contact lower vertical portion 80L penetrating the first upper structure 39, a contact upper vertical portion 80U penetrating the second upper structure 55, and a contact intermediate portion 80V disposed between the contact lower vertical portion 80L and the contact upper vertical portion 80U. The contact intermediate portion 80V may be a stepped portion. In an example embodiment, the contact intermediate portion 80V may be disposed below the second upper structure 55. A width of the contact lower vertical portion 80L adjacent to the contact upper vertical portion 80U may be greater than a width of the contact upper vertical portion 80U adjacent to the contact lower vertical portion 80L.

In the first internal contact plug 81, the second internal contact plug 83, the source contact plug 85, and the external contact plug 87, the contact barrier layer 80a may include a lower linear portion 80aL disposed in the first upper structure 39, an upper linear portion 80aU disposed in the second upper structure 55, and a bent portion 80aB bent from an upper portion of the lower linear portion 80aL and extending up to a lower portion of the upper linear portion 80aU. The upper linear portion 80aU and the lower linear portion 80aL may not be vertically aligned or may not be self-aligned. The bent portion 80aB may be disposed further below than the first upper structure 39.

In one of the first internal contact plug 81, the second internal contact plug 83, the source contact plug 85, and the external contact plug 87, with reference to the central vertical axis Cz disposed between both lateral surfaces of the plug, the plug may include a lateral surface including a first bent portion BP2a bent from an upper end of a lateral surface of the contact lower vertical portion 80L towards the central vertical axis Cz and a second bent portion BP2b bent from a lower end of a lateral surface of the contact upper vertical portion 80U in a direction of being spaced apart from the central vertical axis Cz.

In the description below, modified examples of the first internal contact plug 81, the second internal contact plug 83, the source contact plug 85, and the external contact plug 87 described with reference to FIG. 7 will be described with reference to FIG. 8A.

Figure 8A:
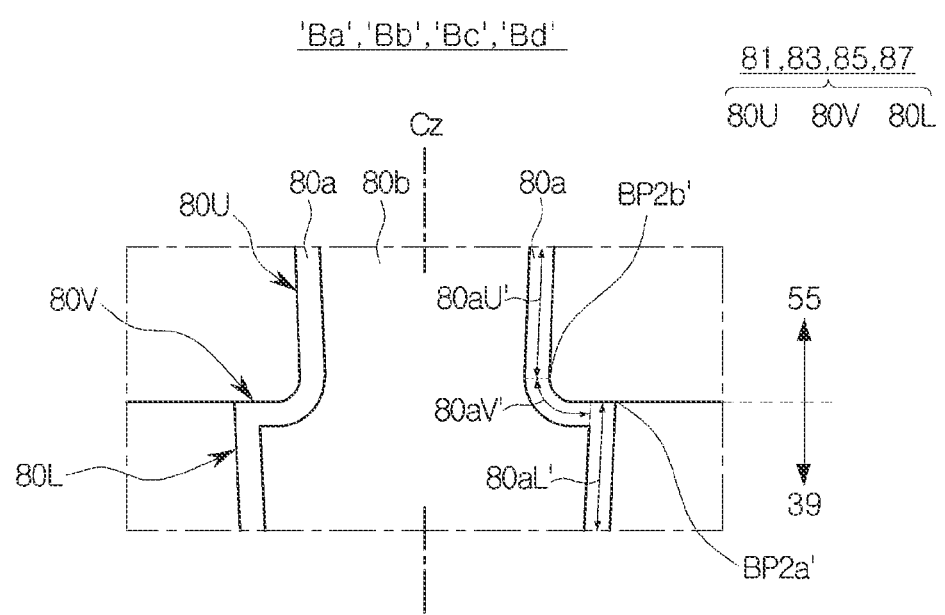

FIG. 8A is an enlarged diagram illustrating a modified example of a common characteristic of regions marked "Ba," "Bb," "Bc," and "Bd" in FIGS. 6A and 6B.

In the modified example, referring to FIGS. 6A, 6B, and 8A, in the first internal contact plug 81, the second internal contact plug 83, the source contact plug 85, and the external contact plug 87, the contact barrier layer 80a may include a lower linear portion 80aL' disposed in the first upper structure 39, an upper linear portion 80aU' disposed in the second upper structure 55, and a bent portion 80aV' extending from an upper portion of the lower linear portion 80aL' up to a lower portion of the upper linear portion 80aU'.

The bent portion 80aV' may be bent from an upper portion of the lower linear portion 80aL' in a horizontal direction towards the central vertical axis Cz of the contact gap-fill layer 80b, and may be bent from a lower portion of the upper linear portion 80aU' in a direction of being spaced apart from the central vertical axis Cz of the contact gap-fill layer 80b.

In one of the first internal contact plug 81, the second internal contact plug 83, the source contact plug 85, and the external contact plug 87, with reference to the central vertical axis Cz disposed between both lateral surfaces of the plug, the plug may include a lateral surface including a first bent portion BP2a' bent from an upper end of a lateral surface of the contact lower vertical portion 80L towards the central vertical axis Cz, and a second bent portion BP2b' bent from a lower end of a lateral surface of the contact upper vertical portion 80U in a direction of being spaced apart from the central vertical axis Cz. The second bent portion BP2b' may be disposed on a level different from a level of the first bent portion BP2a'. The second bent portion BP2b' may be disposed on a level higher than a level of the first bent portion BP2a'.

Figure 8B:
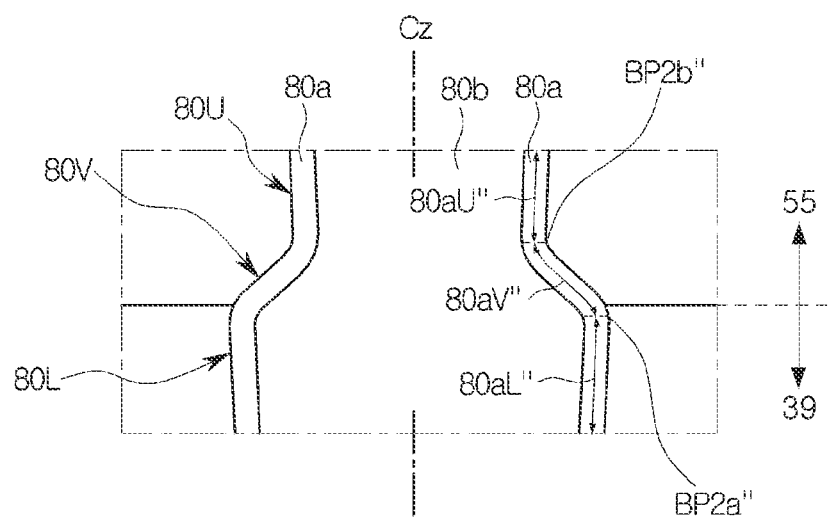

In the description below, other modified examples of the first internal contact plug 81, the second internal contact plug 83, the source contact plug 85, and the external contact plug 87 described with reference to FIG. 7 will be described with reference to FIG. 8B. FIG. 8B is an enlarged diagram illustrating another modified example of a common characteristic of the regions marked "Ba," "Bb," "Bc," and "Bd" in FIGS. 6A and 6B.

In a modified example, referring to FIGS. 6A, 6B, and 8B, in the first internal contact plug 81, the second internal contact plug 83, the source contact plug 85, and the external contact plug 87, the contact barrier layer 80a may include a lower linear portion 80aL" disposed in the first upper structure 39, an upper linear portion 80aU" disposed in the second upper structure 55, and a bent portion 80aV" extending from an upper portion of the lower linear portion 80aL" and up to a lower portion of the upper linear portion 80aU"'. The bent portion 80aV" may be bent from an upper portion of the lower linear portion 80aL" in a diagonal direction towards the central vertical axis Cz of the contact gap-fill layer 80b. In the bent portion 80aV", a portion bent from the lower linear portion 80aL" may be more adjacent to a boundary surface between the first and second upper structures 39 and 55 than a portion bent from the upper linear portion 80aU"'.

In one of the first internal contact plug 81, the second internal contact plug 83, the source contact plug 85, and the external contact plug 87, with reference to the central vertical axis Cz disposed between both lateral surfaces of the plug, the plug may include a lateral surface including a first bent portion BP2a" bent from an upper end of a lateral surface of the contact lower vertical portion 80L towards the central vertical axis Cz, and a second bent portion BP2b" bent from a lower end of a lateral surface of the contact upper vertical portion 80U in a direction of being spaced apart from the central vertical axis Cz. The second bent portion BP2b" may be disposed on a level higher than a level of the first bent portion BP2a", and the second bent portion BP2b" may be more spaced apart from a boundary surface between the first and second upper structures 39 and 55 than the first bent portion BP2a".

In the description below, other modified examples of the first internal contact plug 81, the second internal contact plug 83, the source contact plug 85, and the external contact plug 87 will be described with reference to FIGS. 9 and 10.

Figure 9:
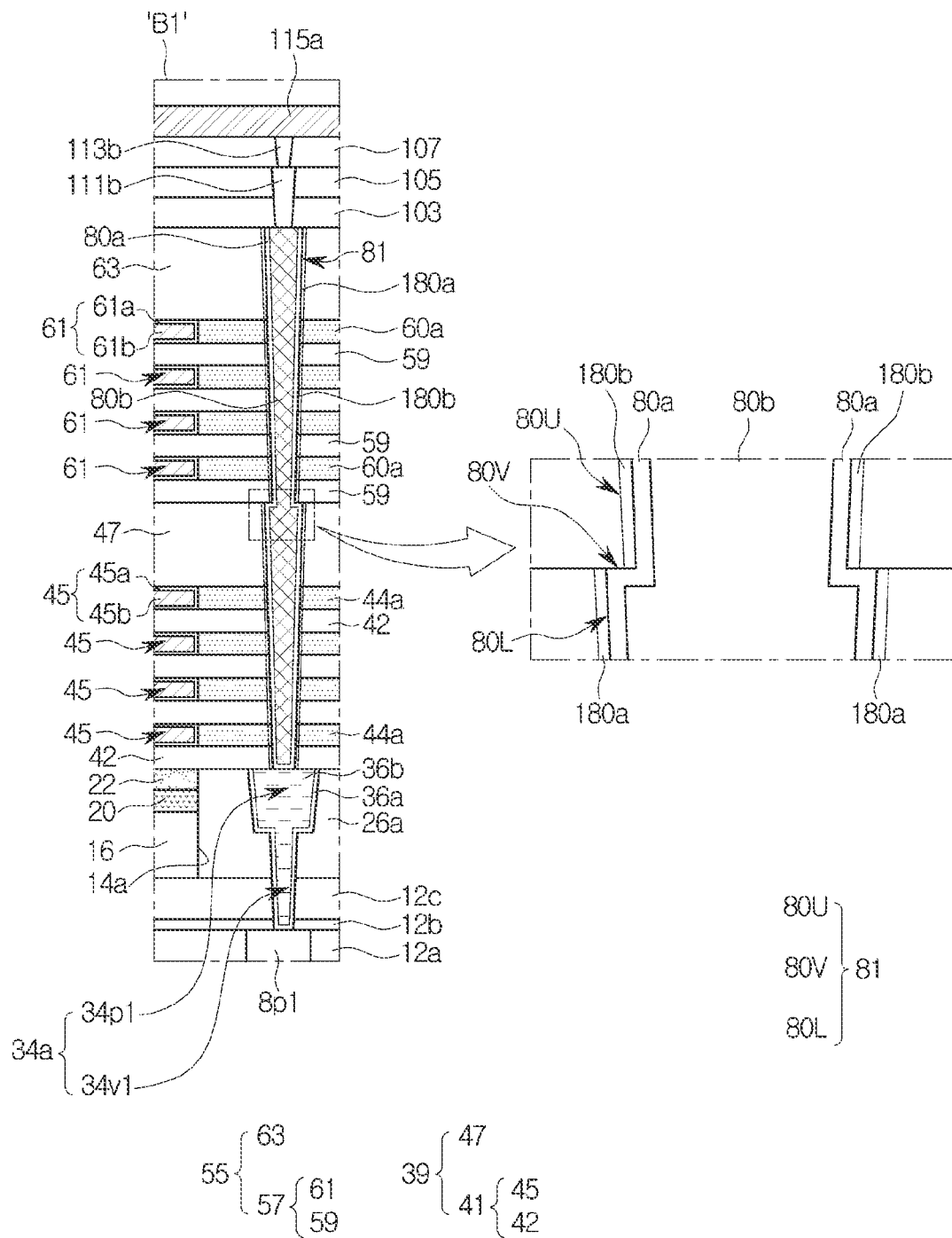
Figure 10:
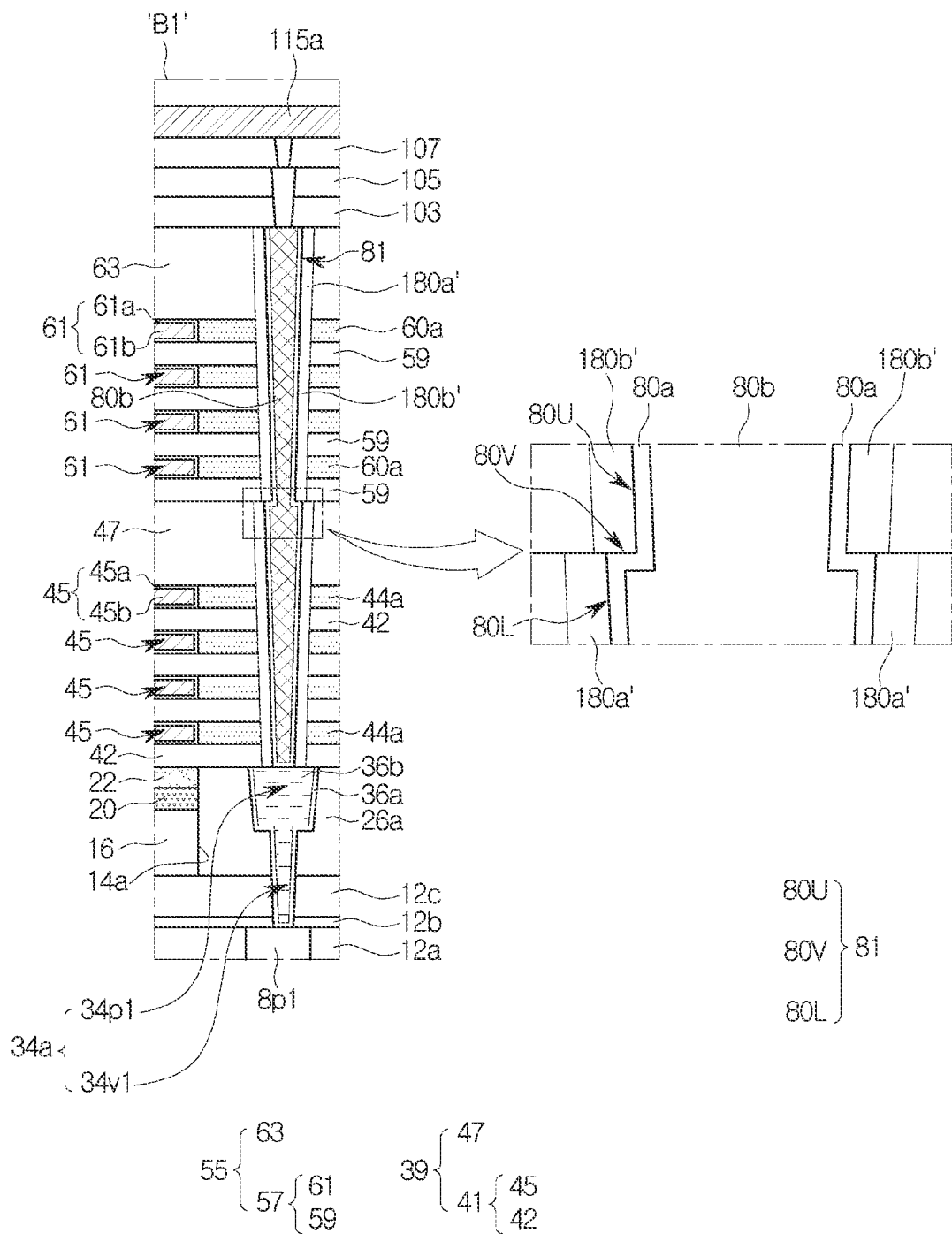

FIGS. 9 and 10 are enlarged diagrams illustrating a portion of region marked "B1" in FIG. 2A.

Referring to FIGS. 2A, 2B, and 9, the first internal contact plug 81 may include the contact lower vertical portion 80L, the contact upper vertical portion 80U, and the contact intermediate portion 80V as in the aforementioned example embodiment described with reference to FIG. 7.

The first internal contact plug 81 may include a lower contact spacer 180a surrounding a lateral surface of the contact lower vertical portion 80L and an upper contact spacer 180b surrounding a lateral surface of the contact upper vertical portion 80U. A difference in widths between the contact lower vertical portion 80L and the contact upper vertical portion 80U may be greater than a thickness of each of the lower contact spacer 180a and the upper contact spacer 180b.

The lower contact spacer 180a and the upper contact spacer 180b may be spaced apart from each other.

In an example embodiment, the lower contact spacer 180a and the upper contact spacer 180b may be formed of the same insulating material, silicon oxide or silicon nitride, for example.

In another example embodiment, the lower contact spacer 180a and the upper contact spacer 180b may be formed of different insulating materials. For example, one of the spacers may be formed of silicon oxide, and the other spacer may be formed of silicon nitride.

In an example embodiment, each of the second internal contact plug 83, the source contact plug 85, and the external contact plug 87 may have a cross-sectional surface structure the same as that of the first internal contact plug 81. Accordingly, each of the second internal contact plug 83, the source contact plug 85, and the external contact plug 87 may include the lower contact spacer 180a and the upper contact spacer 180b.

An upper end of the lower contact spacer 180a and a lower end of the upper contact spacer 180b may be disposed between a first height level on which an uppermost gate layer of the lower gate layers 45 is disposed and a second height level on which a lowermost gate layer of the upper gate layers 61 is disposed.

In the description below, referring to FIGS. 2A, 2B, and 10, the lower contact spacer 180a (in FIG. 9) and the upper contact spacer 180b (in FIG. 9) spaced apart from each other, illustrated in FIG. 9, may be modified to a lower contact spacer 180a' and an upper contact spacer 180b', respectively.

In an example embodiment, the lower contact spacer 180a' and the upper contact spacer 180b' may be formed of the same insulating material or different insulating materials, similarly to the lower contact spacer 180a (in FIG. 9) and the upper contact spacer 180b (in FIG. 9) illustrated in FIG. 9.

In an example embodiment, the lower contact spacer 180a' and the upper contact spacer 180b' may be in contact with each other and may form a boundary surface therebetween. The boundary surface between the lower contact spacer 180a' and the upper contact spacer 180b' may be disposed between a first height level on which an uppermost gate layer of the lower gate layers 45 is disposed and a second height level on which a lowermost gate layer of the upper gate layers 61 is disposed.

In the modified example, the lower contact spacer 180a' and the upper contact spacer 180b' may be formed of the same material and may be integrated with each other without a boundary surface therebetween.

In an example embodiment, the second internal contact plug 83, the source contact plug 85, and the external contact plug 87 may have a cross-sectional surface structure the same as that of the first internal contact plug 81. Accordingly, each of the second internal contact plug 83, the source contact plug 85, and the external contact plug 87 may include the lower contact spacer 180a' and the upper contact spacer 180b'.

Figure 11:
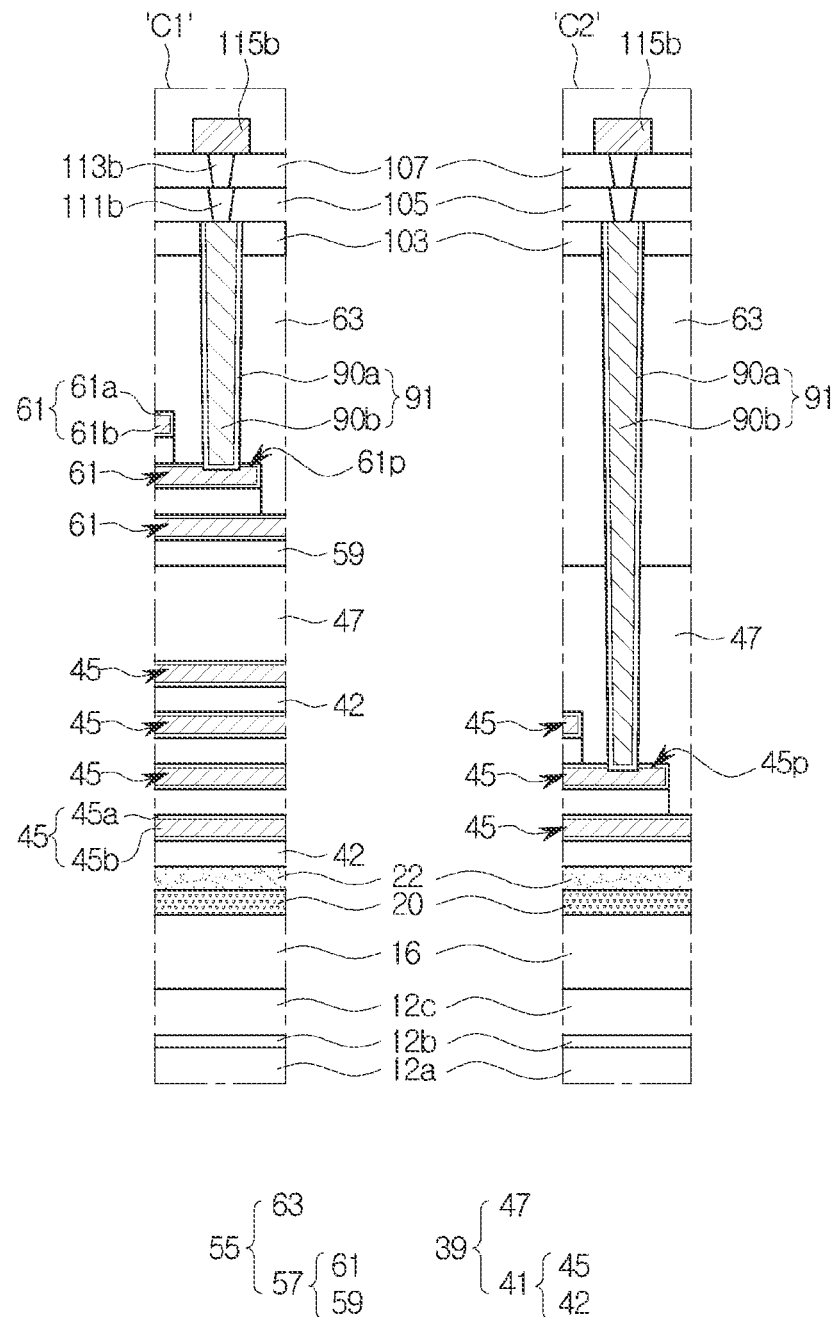

In the description below, an example embodiment of the gate contact plugs 91 described with reference to FIGS. 1, 2A, and 2B will be described with reference to FIG. 11. FIG. 11 is an enlarged diagram illustrating portions of regions marked "C1" and "C2" in FIG. 2B.

Referring to FIGS. 2B and 11, each of the gate contact plugs 91 may include a gap-fill layer 90b and a barrier layer 90a covering a lateral surface and a bottom surface of the gap-fill layer 90b. In the gate contact plug 91, the barrier layer 90a may include metal nitride such as TiN, and the gap-fill layer 90b may include a metal surface W. or the like.

A gate contact plug of the gate contact plugs 91 in contact with a lower gate pad 45p of the lower gate layer 45 may be a first gate contact plug, and a gate contact plug in contact with an upper gate pad 61p of the upper gate layer 61 may be a second gate contact plug. The first gate contact plug 91 on the lower gate pad 45p of the lower gate layer 45 may be in contact with the second lower gate layer 45b of the lower gate layer 45, and the second gate contact plug 91 on the upper gate pad 61p of the upper gate layer 61 may be in contact with the second upper gate layer 61b of the upper gate layer 61.

Figure 12:
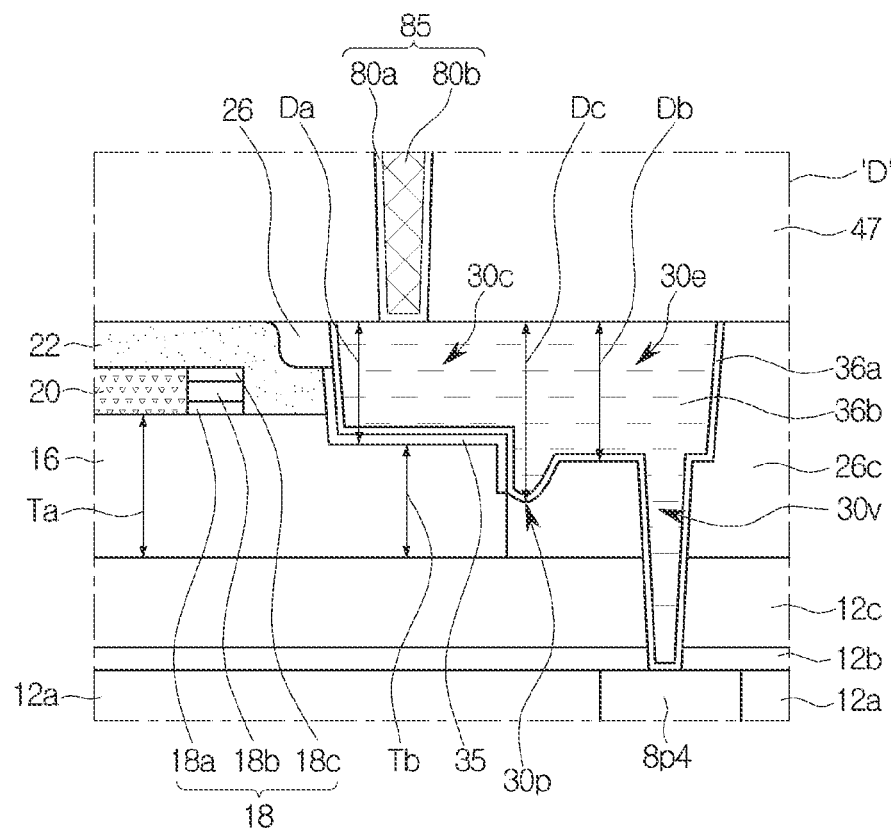

In the description below, an example embodiment of the contact pattern 30 described with reference to FIGS. 1, 2A, and 2B will be described with reference to FIGS. 6B and 12. FIG. 12 is an enlarged diagram illustrating a portion of region "D" in FIG. 2B. The contact pattern 30 has been described with reference to the region "B3" in FIG. 6B. Thus, the structure of the contact pattern 30 described with reference to FIG. 6B will be described in greater detail with reference to FIG. 12.

Referring to FIGS. 2B, 6B, and 12, the contact pattern 30 may include the upper contact portion 30c, the extension portion 30e, the lower protrusion 30p, and the via portion 30v, described in the aforementioned example embodiment with reference to FIG. 6B.

A thickness Da of the contact portion 30c may be greater than a sum of a thickness of the intermediate pattern layer 20 and a thickness of the upper pattern layer 22. The thickness Da of the contact portion 30c may be less than a maximum thickness Ta of the lower pattern layer 16. The thickness Da of the contact portion 30c may be less than a thickness Tb of the lower pattern layer 16 overlapping the contact portion 30c. The thickness Da of the extension portion 30e may be greater than a thickness of the contact portion 30c. A distance Dc between an upper surface of the extension portion 30e and a bottom surface of the lower protrusion 30p may be greater than a thickness Db of the extension portion 30e.

Figure 13:
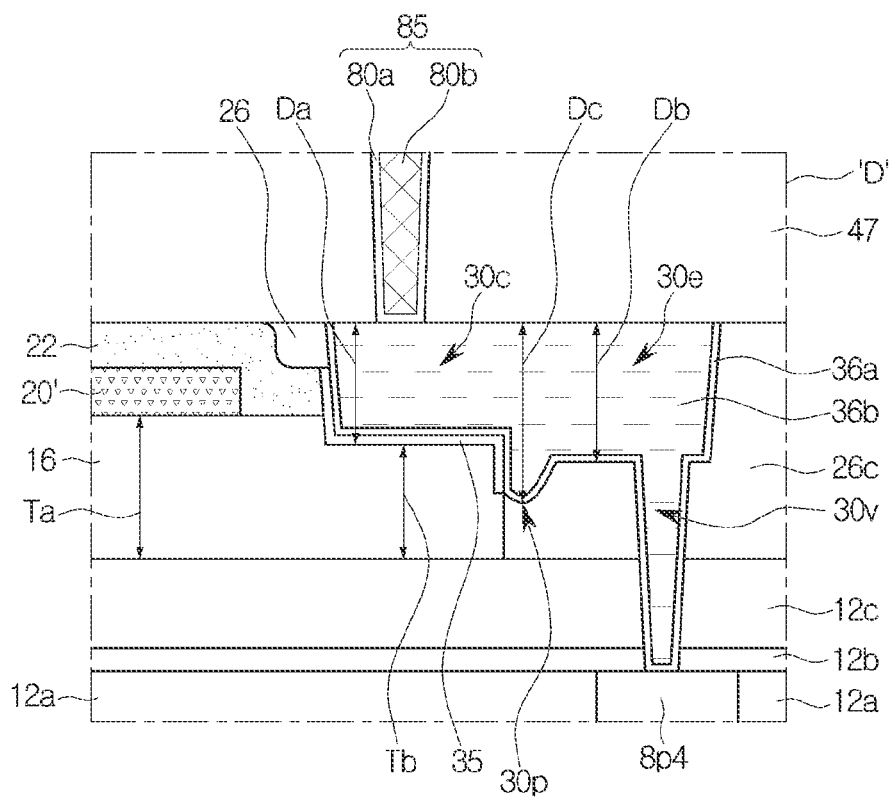

In the description below, a modified example of the pattern structure 14 described in the aforementioned example embodiment with reference to FIG. 2B will be described. FIG. 13 is an enlarged diagram illustrating a modified example of a portion marked "D" in FIG. 2B.

Referring to FIG. 13, in the pattern structure 14, the sacrificial pattern layer 18 (in FIG. 2B) may be replaced with an intermediate pattern layer 20'. Thus, the pattern structure 14 may not include the sacrificial pattern layer 18 (in FIG. 2B) as in FIG. 2B.

Figure 14:
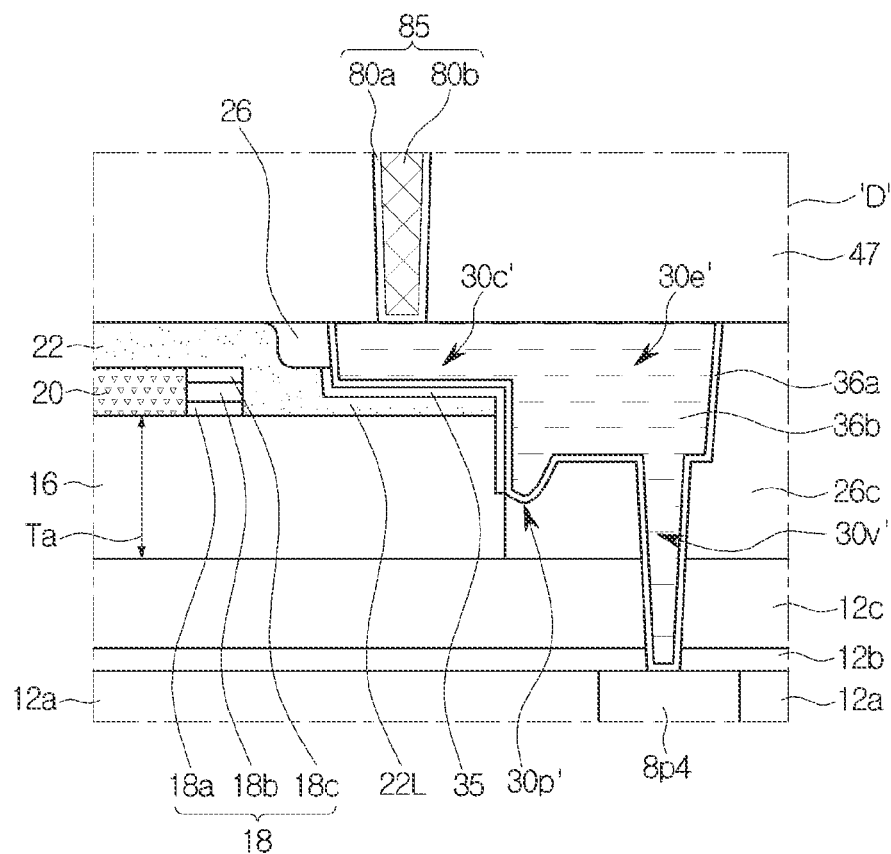

In the description below, a modified example of the contact pattern 30 described in FIGS. 2B, 6B, and 12 will be described with reference to FIG. 14. FIG. 14 is an enlarged diagram illustrating a modified example of region "D" in FIG. 2B.

Referring to FIG. 14, a modified contact pattern 30' may include a contact portion 30c', an extension portion 30e', a lower protrusion portion 30p', and a via portion 30v'.

The contact portion 30c' may overlap the pattern structure 14 and may be in contact with the upper pattern layer 22. A portion 22L of the upper pattern layer 22 may be interposed between the contact portion 30c' and the lower pattern layer 16. The extension portion 30e' may extend from the contact pattern 30' and may be in contact with a lateral surface of the upper pattern layer 22 and a portion of a lateral surface of the lower pattern layer 16. The lower protrusion portion 30p' and the via portion 30v' may correspond to the lower protrusion 30p and the via portion 30v described in FIG. 6B, respectively. The contact pattern 30' may include the metal-semiconductor compound layer 35, the pad barrier layer 36a, and the pad gap-fill layer 36b.

Figure 15:
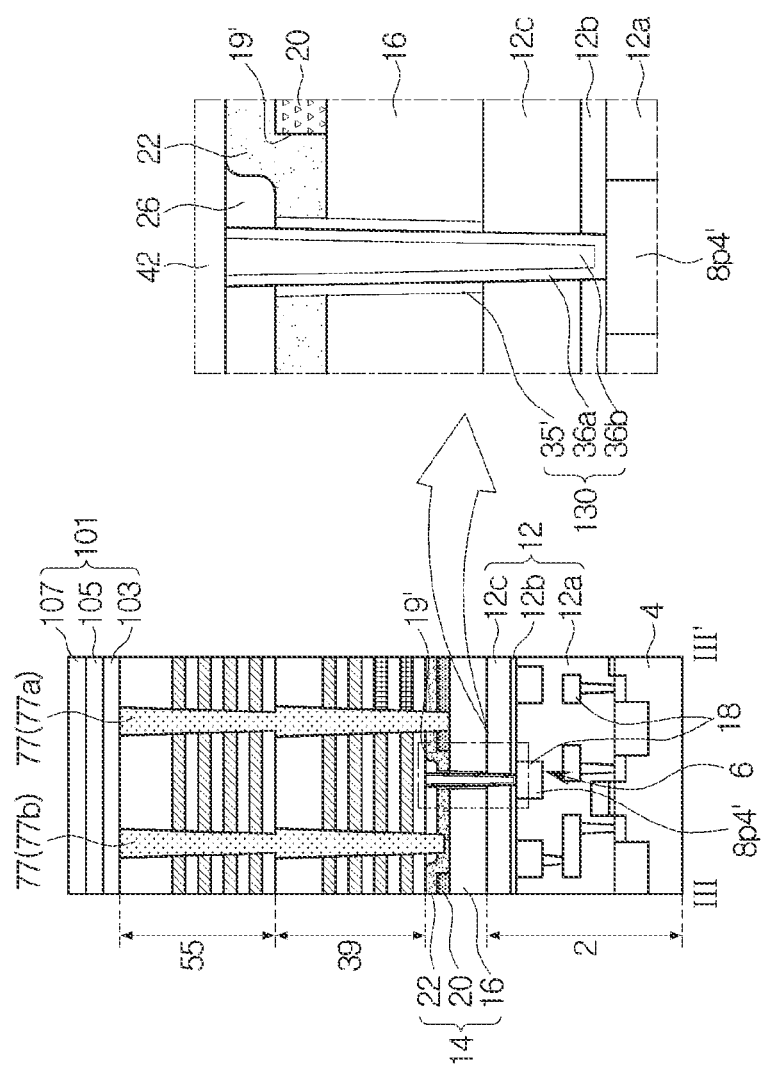
FIG. 15 is a cross-sectional diagram illustrating a modified example of a semiconductor device.

In the description below, a modified example of a semiconductor device will be described with reference to FIG. 15. FIG. 15 is a cross-sectional diagram along line III-III' in FIG. 1 illustrating a modified example of a semiconductor device.

Referring to FIGS. 1 and 15, the lower structure 2, the pattern structure 14, the first and second upper structures 39 and 55, and the separation structures 77, described with reference to FIGS. 1, 2A, and 2B, may be provided.

An internal contact pattern 130 penetrating the pattern structure 14 may be disposed in a portion of the pattern structure 14 in which the lower pattern layer 16 is in contact with the upper pattern layer 22 through an opening 19' of the intermediate pattern layer 20.

The internal contact pattern 130 may be in contact with a lower pad 8p4' of the lower wiring structure 8 penetrating the lower pattern layer 16 and the upper pattern layer 22 in contact with each other and extending downwardly.

The internal contact pattern 130 may include the pad gap-fill layer 36b, and the pad barrier layer 36a covering a lateral surface and a bottom surface of the pad gap-fill layer 36b, described with reference to FIGS. 2A, 2B, 6A, and 6B. The internal contact pattern 130 may further include a metal-semiconductor compound layer 35' disposed between the pad barrier layer 36a and the pattern structure 14.

In an example embodiment, both the internal contact pattern 130 and the contact pattern 360 (in FIG. 2B) may be disposed.

In another example embodiment, one of the internal contact pattern 130 and the contact pattern 360 (in FIG. 2B) may not be provided.

Figure 16:
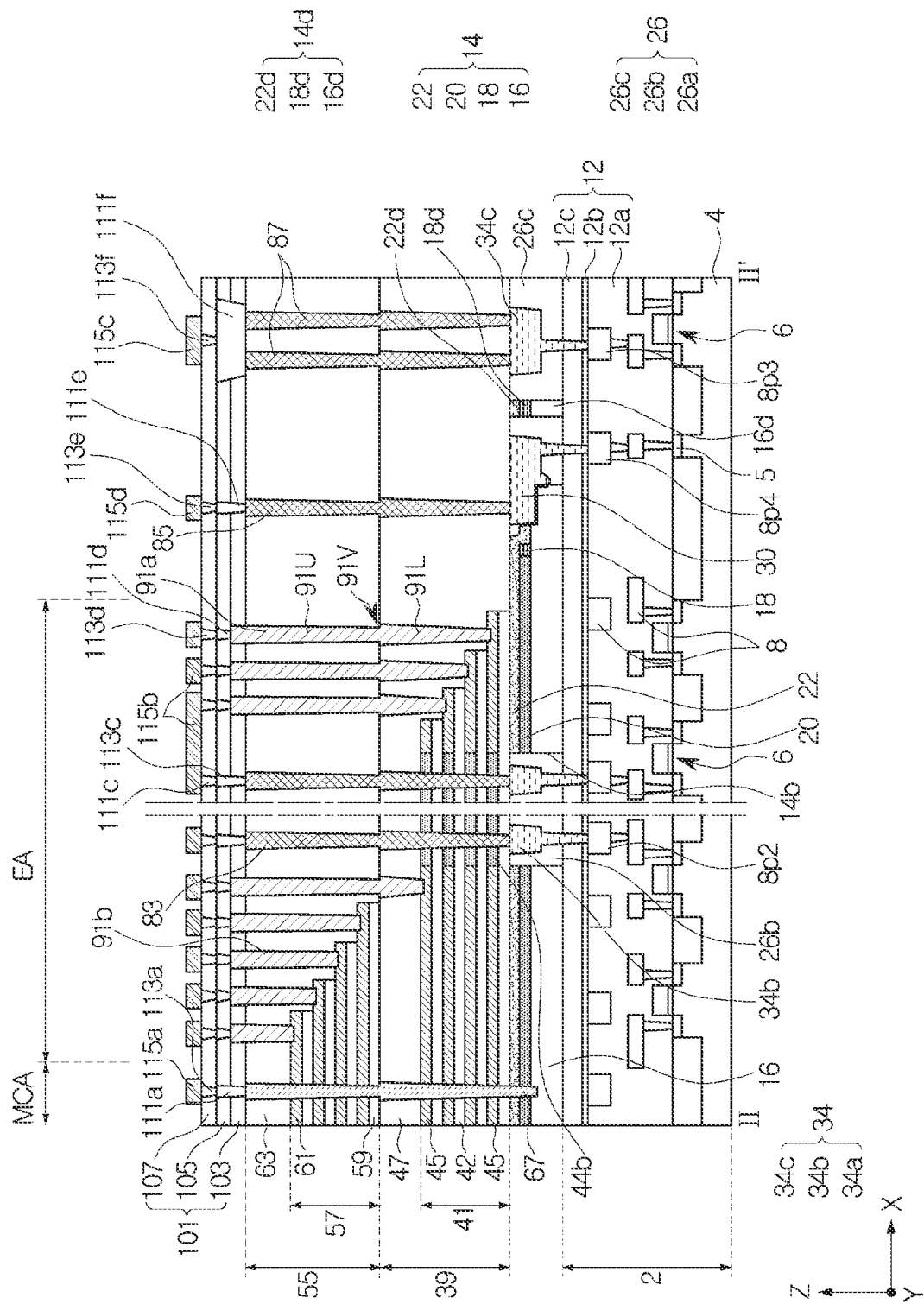
FIG. 16 is a cross-sectional diagram illustrating another modified example of a semiconductor device.

In the description below, a modified example of the gate contact plugs 91 in FIG. 2B will be described in FIG. 16. FIG. 16 is a cross-sectional diagram along line II-II' in FIG. 1.

Referring to FIG. 16, the gate contact plugs 91 (in FIG. 2B) may include first gate contact plugs 91a on the lower gate pad 45p (in FIG. 11) of the lower gate layers 45 and second gate contact plugs 91b on the upper gate pads 61p (in FIG. 11) of the upper gate layers 61.

The first gate contact plugs 91a may have a cross-sectional surface structure similar to the first internal contact plug 81, the second internal contact plug 83, the source contact plug 85 and the external contact plug 87. For example, each of the first gate contact plugs 91a may include a lower vertical portion 91L in the first upper structure 39, an upper vertical portion 91U in the second upper structure 55, and an intermediate portion 91V disposed between the lower vertical portion 91L and the upper vertical portion 91U. In the first gate contact plugs 91a, the intermediate portion 91V may be substantially the same as the intermediate portion 80V of each of the first internal contact plug 81, the second internal contact plug 83, the source contact plug 85, and the external contact plug 87 described with reference to FIGS. 6A, 6B, and 7. In the first gate contact plugs 91a, the intermediate portion 91V may be modified the same as the intermediate portions 80V in FIGS. 8A and 8B.

Figure 17:
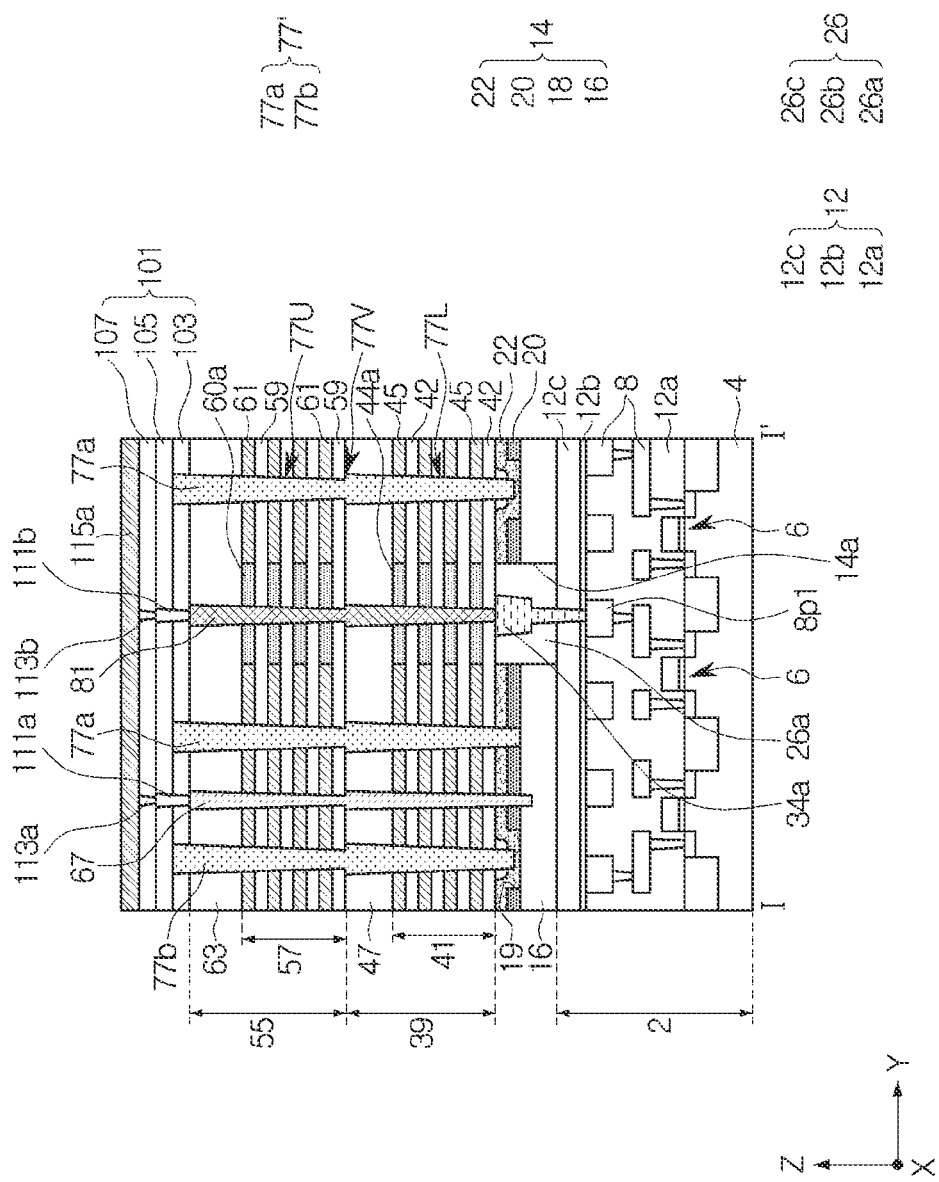
FIG. 17 is a cross-sectional diagram illustrating another modified example of a semiconductor device.

In the description below, a modified example of the separation structures 77 in FIG. 2A will be described. FIG. 17 is a cross-sectional diagram along line I-I' in FIG. 1.

Referring to FIG. 17, the separation structures 77 (in FIG. 2A) may be modified to separation structures 77' extending upwardly from a portion penetrating the second upper structure 55 and penetrating the first upper insulating layer 103. Accordingly, an upper surface of the separation structure 77' may be disposed on a level higher than upper surfaces of the memory vertical structures 67, the first and second internal contact plugs 81 and 83 (in FIGS. 2A and 2B, respectively), the source contact plug 85 (in FIG. 2B) and the external contact plug 87 (in FIG. 2B). Each of the separation structure 77' may include the intermediate portion 77V described with reference to FIG. 2A.

Figure 18:
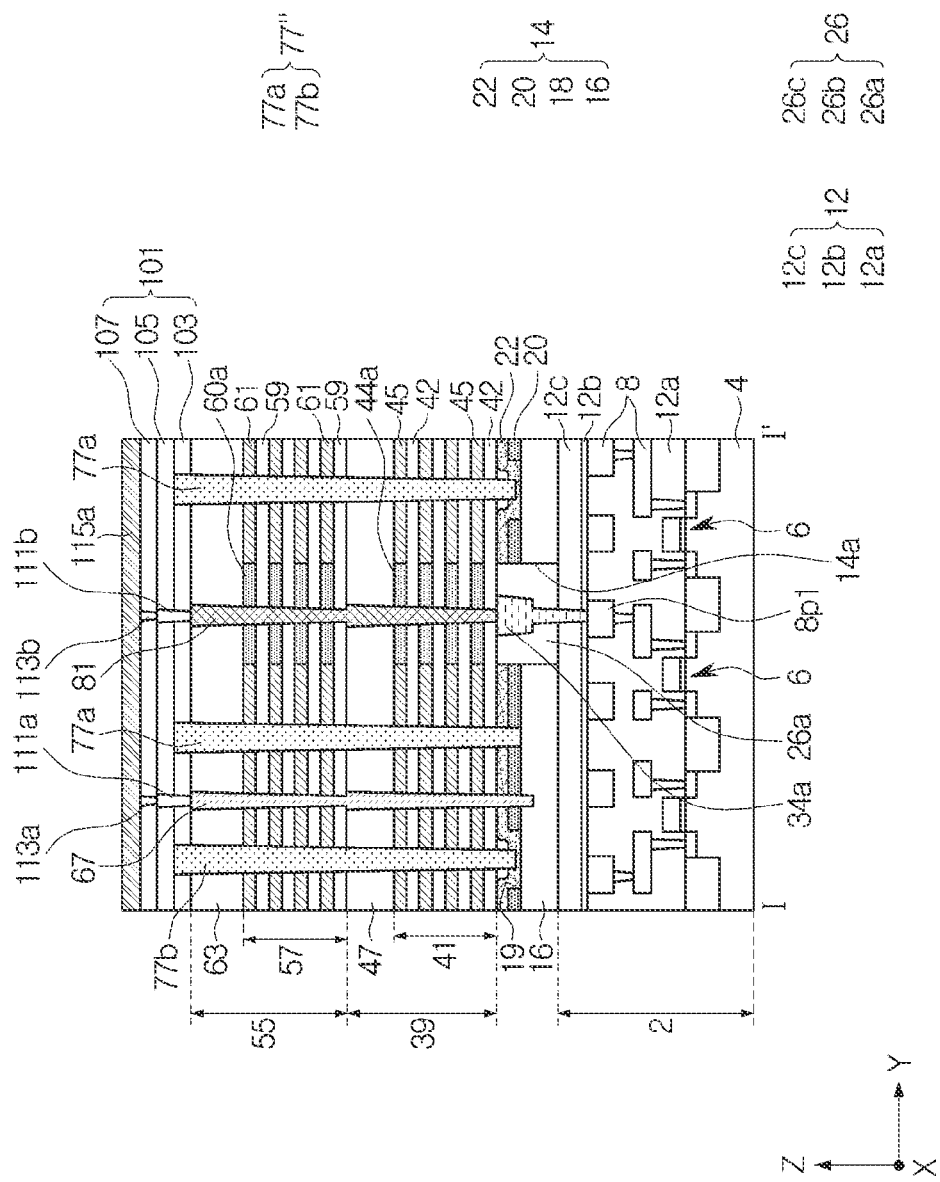
FIG. 18 is a cross-sectional diagram illustrating another modified example of a semiconductor device.

In the description below, a modified example of the separation structures 77' in FIG. 17 will be described with reference to FIG. 18. FIG. 18 is a cross-sectional diagram along line I-I'.

Referring to FIG. 18, the separation structures 77' in FIG. 17 may be modified to the separation structures 77" which do not include an intermediate portion. Accordingly, each of the separation structures 77" may have a lateral surface having a predetermined slope.

Figure 19A:
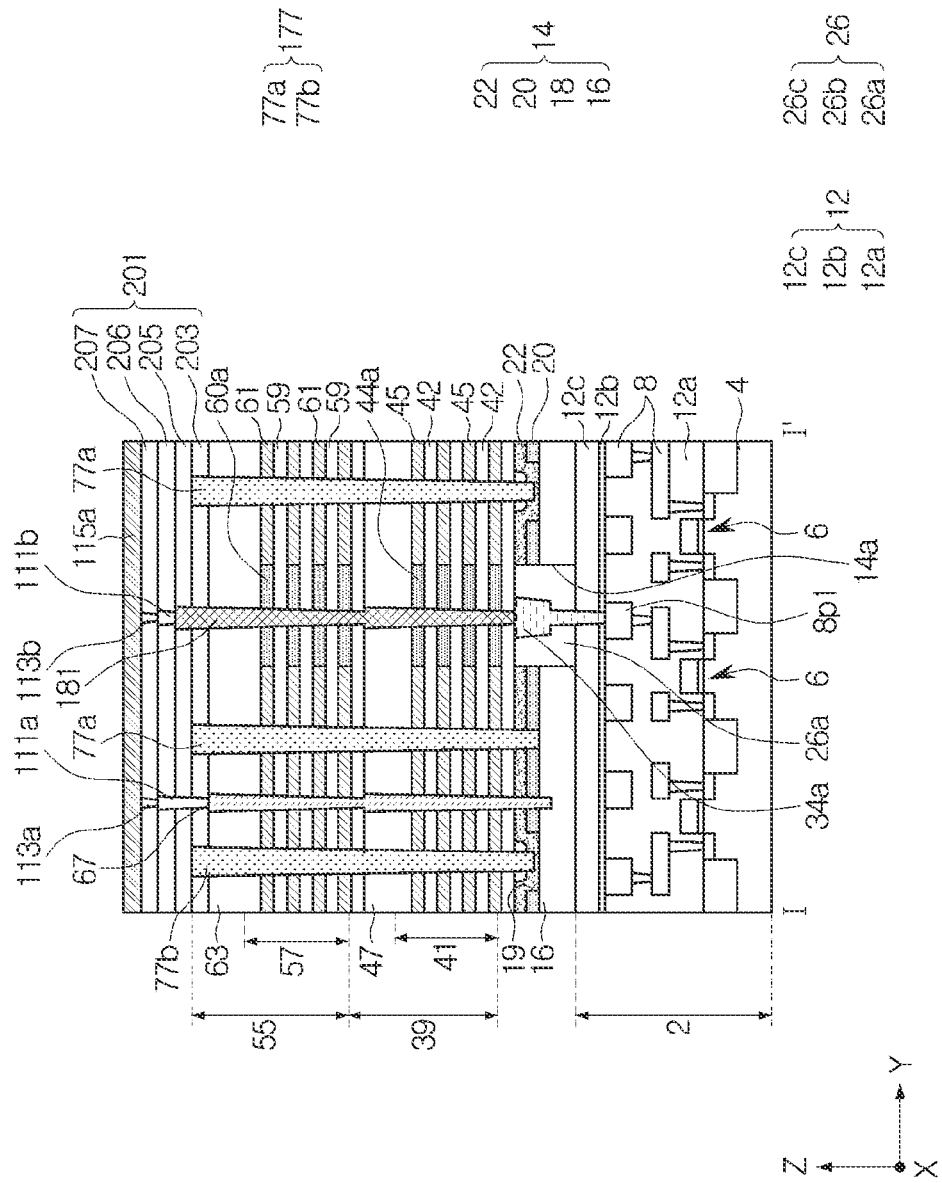
FIGS. 19A and 19B are other modified examples of a semiconductor device.
Figure 19B:
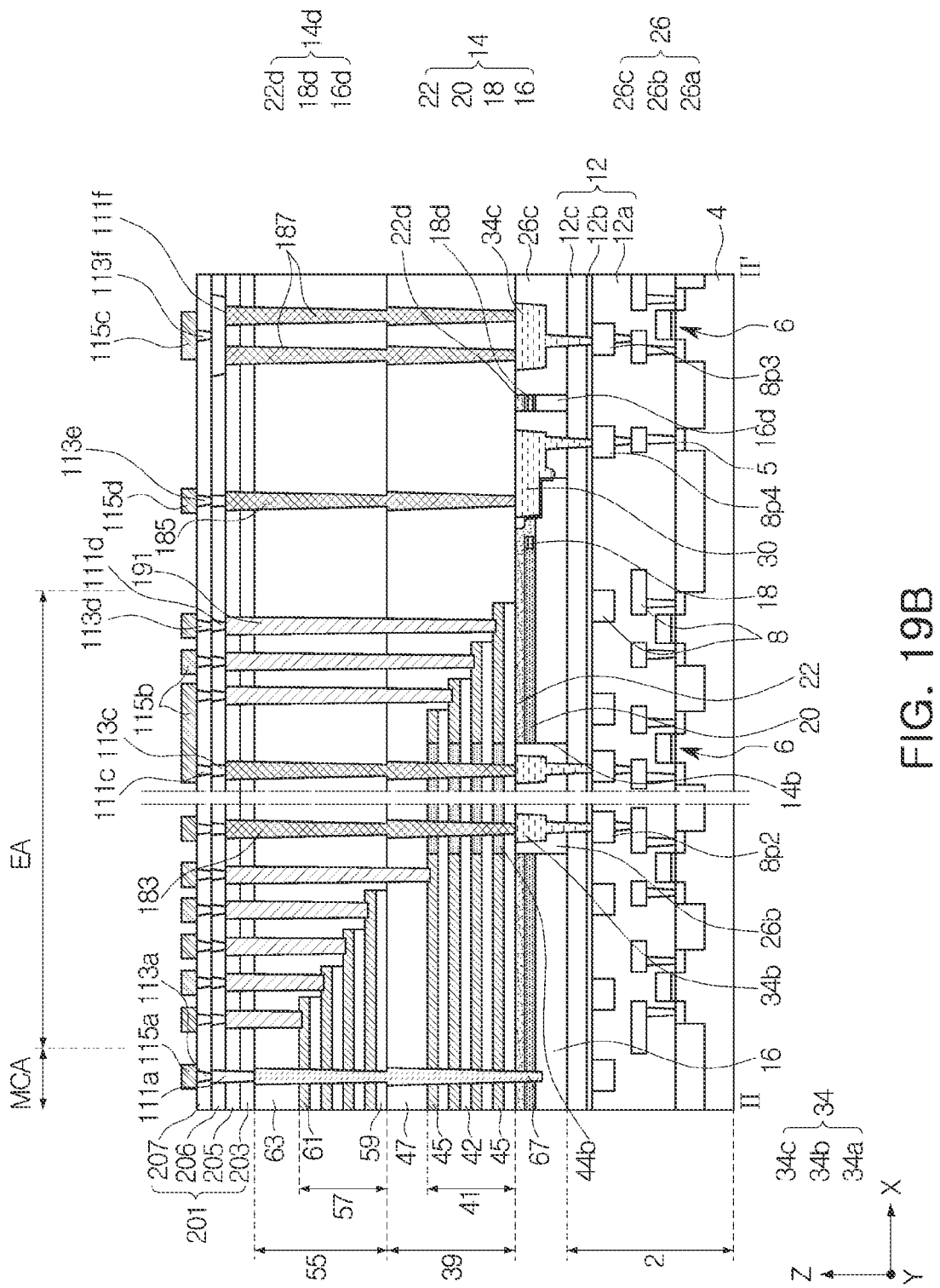

In the description below, a modified example of a semiconductor device will be described with reference to FIGS. 19A and 19B. FIG. 19A is a cross-sectional diagram along line I-I' in FIG. 1, and FIG. 19B is a cross-sectional diagram along line II-II' in FIG. 1. In the modified example described with reference to FIGS. 19A and 19B, a modified portion of the semiconductor device described with reference to FIGS. 2A and 2B will be described.

Referring to FIGS. 1, 19A, and 19B, the upper insulating structure 101 in FIGS. 2A and 2B may be modified to an upper insulating structure 201 including first, second, third, and fourth upper insulating layers 203, 205, 206, and 207 stacked in order.

In an example embodiment, the separation structures 77 in FIG. 2A may be modified to separation structures 177 extending upwardly from a portion penetrating the second upper structure 55 and penetrating the first upper insulating layer 203, and the separation structures 177 may not include the intermediate portion 77V as in FIG. 2B. Accordingly, each of the separation structures 177 may have a lateral surface having a predetermined slope.

In an example embodiment, the first internal contact plug 81 may be modified to a first internal contact plug 181 extending upwardly from a portion penetrating the second upper structure 55 and penetrating the first and second insulating layers 203 and 205.

In an example embodiment, the second internal contact plug 83, the source contact plug 85, and the external contact plug 87 in FIG. 2B may be modified to a second internal contact plug 183, a source contact plug 185, and an external contact plug 187, respectively, which may extend upwardly from a portion penetrating the second upper structure 55 and may penetrate the first and second upper insulating layers 203 and 205.

In an example embodiment, the gate contact gate 91 in FIG. 2B may be modified to a gate contact plug 191 which may extend upwardly from a portion penetrating the second upper structure 55 and may penetrate the first and second upper insulating layers 203 and 205.

The second internal contact plug 183, the source contact plug 185, the external contact plug 187, and the gate contact plug 191 may have upper surfaces coplanar with one another.

The separation structures 177 may have upper surfaces higher than an upper surface of the memory vertical structure 67 and lower than upper surfaces of the second internal contact plug 183, the source contact plug 185, the external contact plug 187, and the gate contact plug 191.

Figure 20:
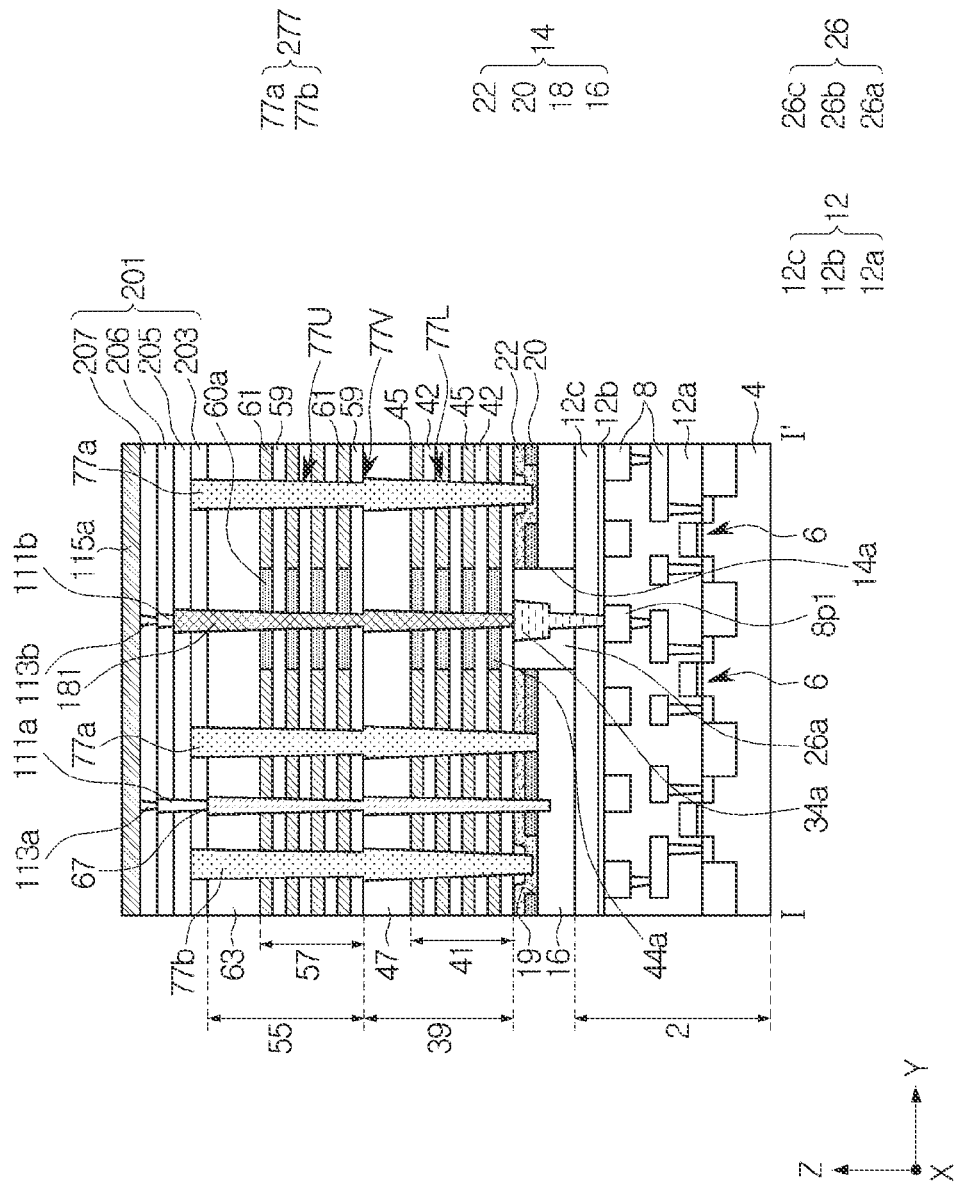
FIG. 20 is a cross-sectional diagram illustrating another modified example of a semiconductor device.

In the description below, modified examples of the separation structures 177 in FIG. 19A and the source contact plug 185 and the external contact plug 187 in FIG. 19B will be described with reference to FIGS. 20 and 21. FIG. 20 is a cross-sectional diagram taken long I-I' in FIG. 1, and FIG. 21 is a cross-sectional diagram taken long II-II' in FIG. 1.

Figure 21:
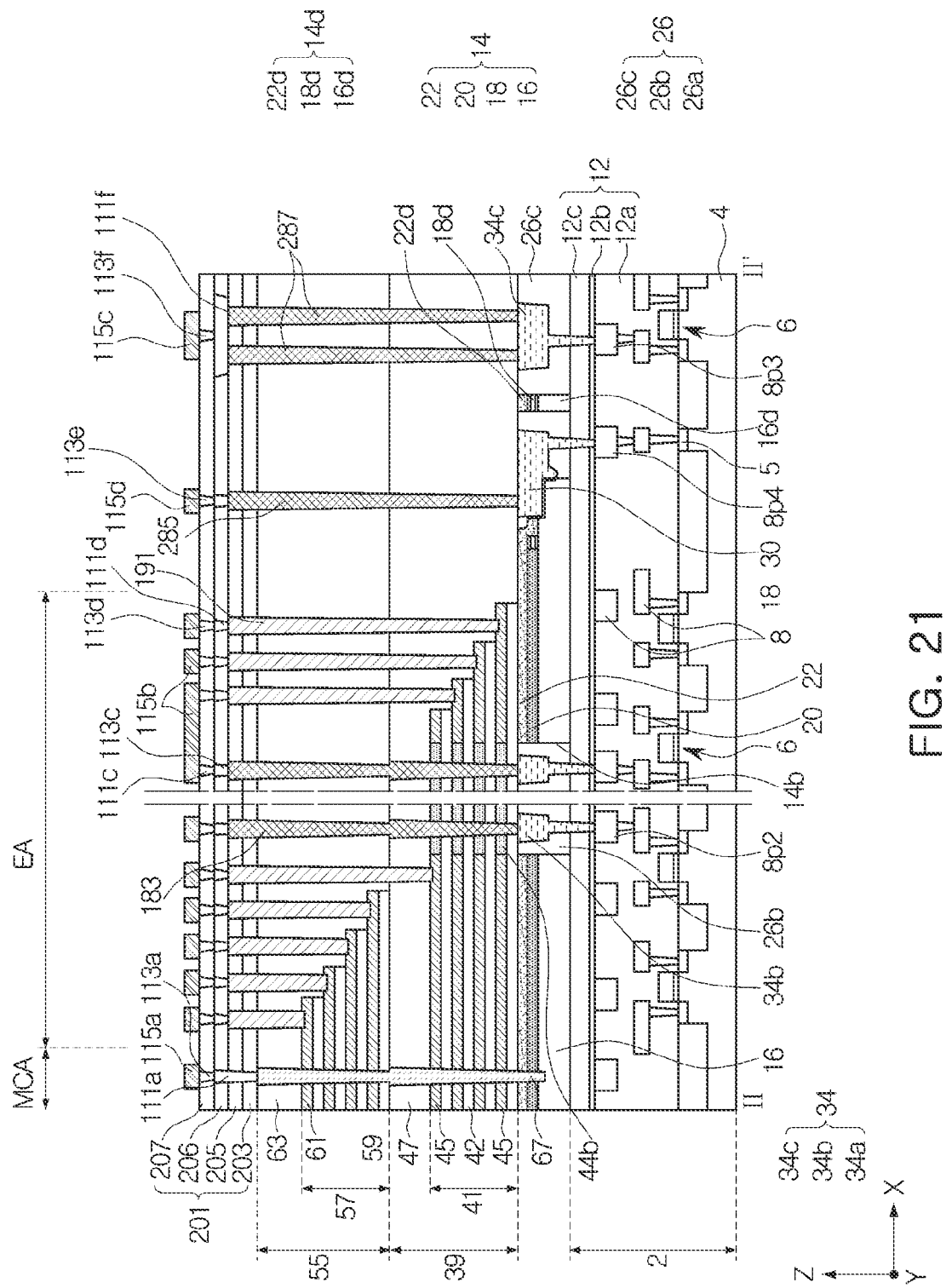
FIG. 21 is a cross-sectional diagram illustrating another modified example of a semiconductor device.

Referring to FIGS. 20 and 21, the separation structures 177 in FIG. 19A may be modified to separation structures 277 including the intermediate portion 77V as in FIG. 2A. The source contact plug 185 and the external contact plug 187 in FIG. 19B may be modified to a source contact plug 285 and an external contact plug 287, each of which does not include an intermediate portion and has a lateral surface substantially having a predetermined slope, respectively.

Figure 22:
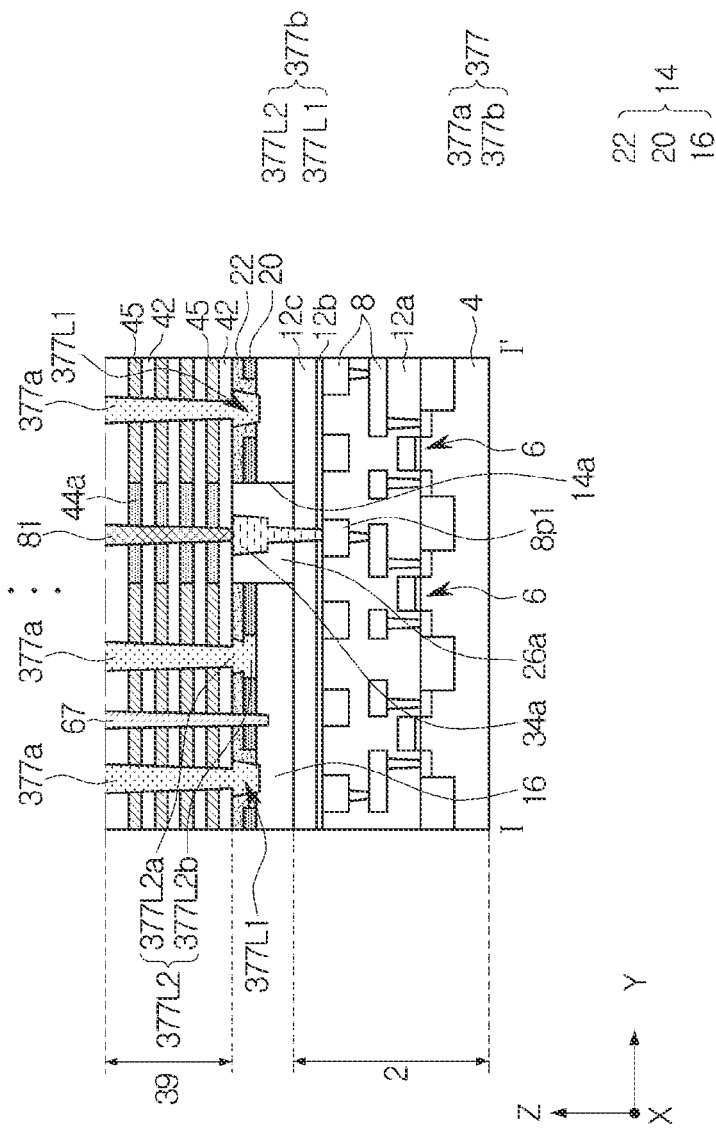
FIG. 22 is a cross-sectional diagram illustrating another modified example of a semiconductor device.

In the description below, a modified example of each of various separation structures 77, 77', 77," 177, and 277 (in FIGS. 2A, 17, 18, 19A, and 20, respectively), described in the aforementioned example embodiment, will be described with reference to FIG. 22. FIG. 22 is a cross-sectional diagram illustrating a common portion of the various separation structures 77, 77', 77," 177, and 277 (in FIGS. 2A, 17, 18, 19A, and 20, respectively), described in the aforementioned example embodiment.

Referring to FIG. 22, a separation structure 377 which may replace a lower portion of each of the separation structures 77, 77'. 77," 177, and 277 (in FIGS. 2A, 17, 18, 19A, and 20, respectively).

Each of the separation structures 377 may include a vertical portion 377a penetrating the first upper structure 39 and a lower portion 377b extending from the vertical portion 377a into the lower structure, the pattern structure 14, for example. In each of the separation structures 377, a maximum width of the lower portion 377b adjacent to the vertical portion 377a penetrating the first upper structure 39 may be greater than a width of the vertical portion 377a adjacent to the lower portion 377b.

In each of the separation structures 377, the lower portion 377b may include first and second portions 377L1 and 377L2. For example, in each of the separation structures 377, the first lower portion 377L1 may be disposed in a portion in which the upper pattern layer 22 of the pattern structure 14 is directly in contact with the lower pattern layer 16, and the second lower portion 377L2 may be disposed in a portion in which the intermediate pattern layer 20 and the upper pattern layer 22 are stacked in order. The first lower portion 377L1 may penetrate the upper pattern layer 22 and may be directly in contact with the lower pattern layer 16. The second lower portion 377L2 may include a first portion 377L2a penetrating the upper pattern layer 22 and a second portion 377L2b penetrating the intermediate pattern layer 20.

The first lower portion 377L1 may have a width decreasing from an upper portion to a lower portion. The first lower portion 377L1 may have a lateral surface having a negative slope. In the second lower portion 377L2, the first lower portion 377L1 and the second lower portion 377L2 may have lateral surfaces having different slopes. In the second lower portion 377L2, the second portion 377L2b may have a lateral surface having a negative slope to have a width decreasing from an upper portion to a lower portion.

A maximum width of the first lower portion 377L1 may be greater than a width of a vertical portion 377a penetrating the first upper structure 39 adjacent to the first lower portion 377L1. A width of a vertical portion 377a penetrating the first upper structure 39 adjacent to the second lower portion 377L2 may be less than a maximum width of the first portion 377L2a of the second lower portion 377L2. In the second lower portion 377L2, a width of the first portion 377L2a adjacent to the second portion 377L2b may be less than a width of the second portion 377L2b adjacent to the first portion 377L2a.

Figure 23:
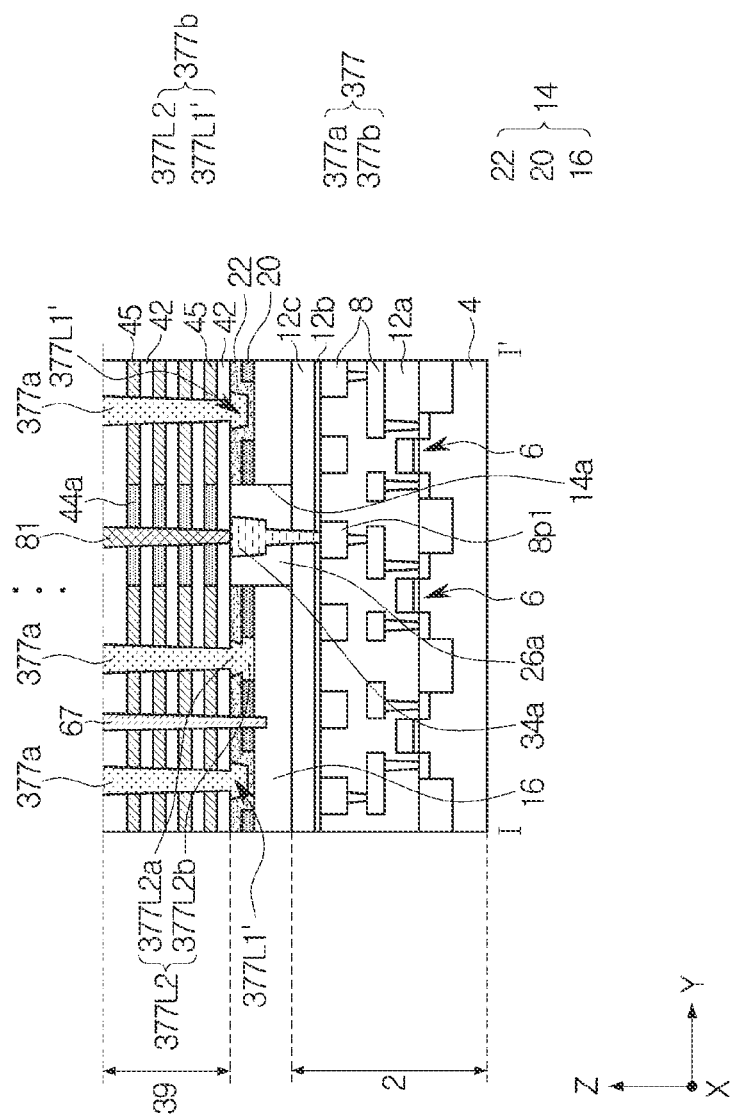
FIG. 23 is a cross-sectional diagram illustrating another modified example of a semiconductor device.

In the description below, a modified example of the separation structure 377 described with reference to FIG. 22 will be described with reference to FIG. 23. FIG. 23 is a cross-sectional diagram illustrating a common portion of the separation structures 77, 77', 77," 177, and 277 (in FIGS. 2A, 17, 18, 19A, and 20, respectively), described in the aforementioned example embodiment.

Referring to FIG. 23, a first portion 377L1' which may replace the first portion 377L1 (in FIG. 22) of the separation structure 377 described with reference to FIG. 22 may be provided. A bottom surface of the first portion 377L1' may be disposed in the upper pattern layer 22 and may be spaced apart from the lower pattern layer 16. Accordingly, a portion of the upper pattern layer 22 may be disposed between a bottom surface of the first portion 377L1' of the separation structure 377 and the lower pattern layer 16.

Figure 24:
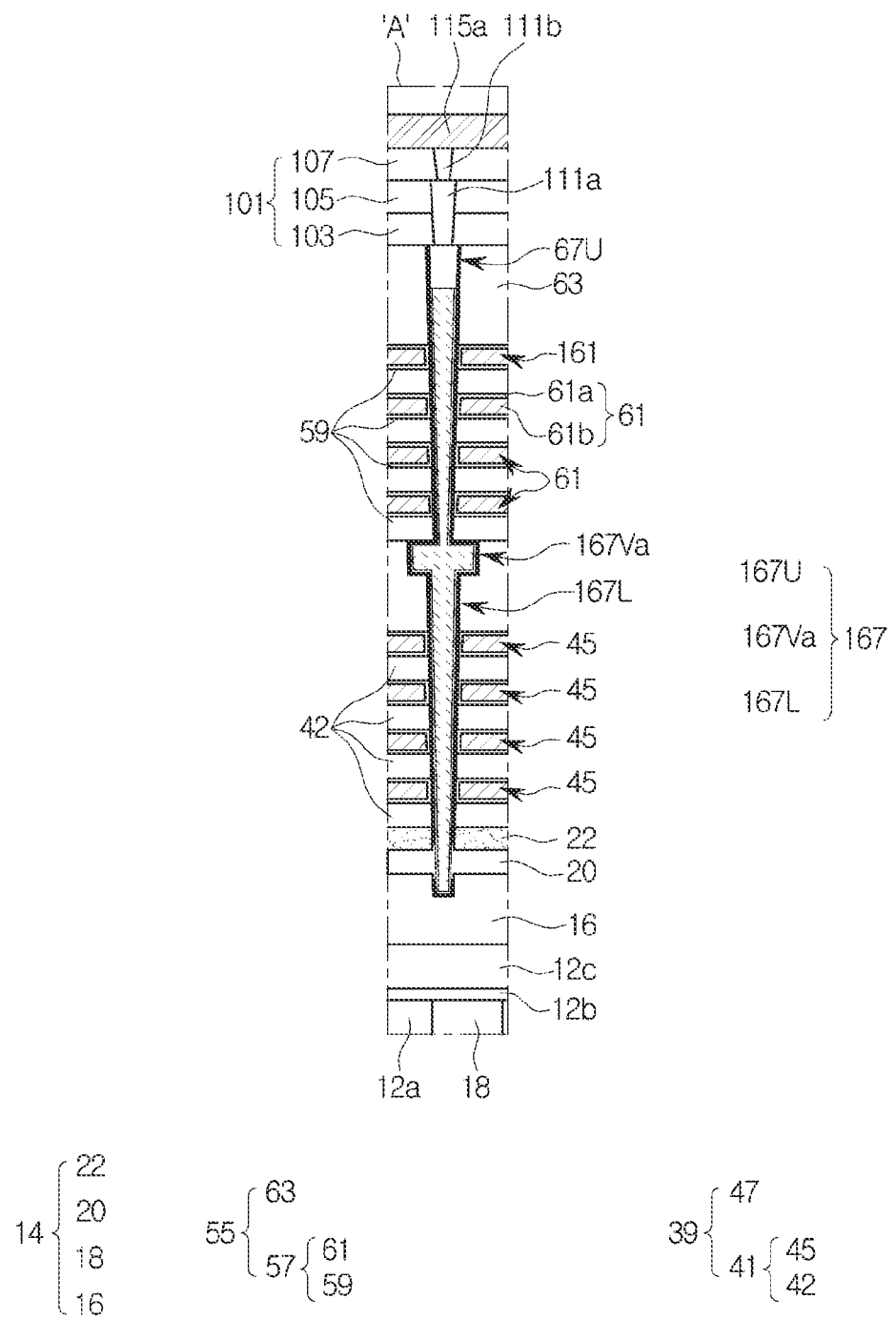
FIGS. 24, 25, and 26 are cross-sectional diagrams illustrating portions of another modified example of a semiconductor device.

In the description below, a memory vertical structure 167 which may replace the memory vertical structure 67 (in FIGS. 2A and 3) will be described with reference to FIG. 24. FIG. 24 is an enlarged diagram illustrating a portion of a modified example of region marked "A" in FIG. 2A.

Referring to FIG. 24, the memory vertical structure 167 may include a lower vertical portion 167L in the first upper structure 39, an upper vertical portion 167U in the second upper structure 55, and an intermediate portion 167Va disposed between the lower vertical portion 167L and the upper vertical portion 167U.

In the memory vertical structure 167, the intermediate portion 167Va may be greater than a width of the upper vertical portion 167U adjacent to the intermediate 167Va. In the memory vertical structure 167, the intermediate portion 167Va may be greater than a width of the lower vertical portion 167L adjacent to the intermediate portion 167Va.

In an example embodiment, a thickness of the intermediate portion 167Va may be greater than a thickness of each of the lower and upper gate layers 45 and 61.

Figure 25:
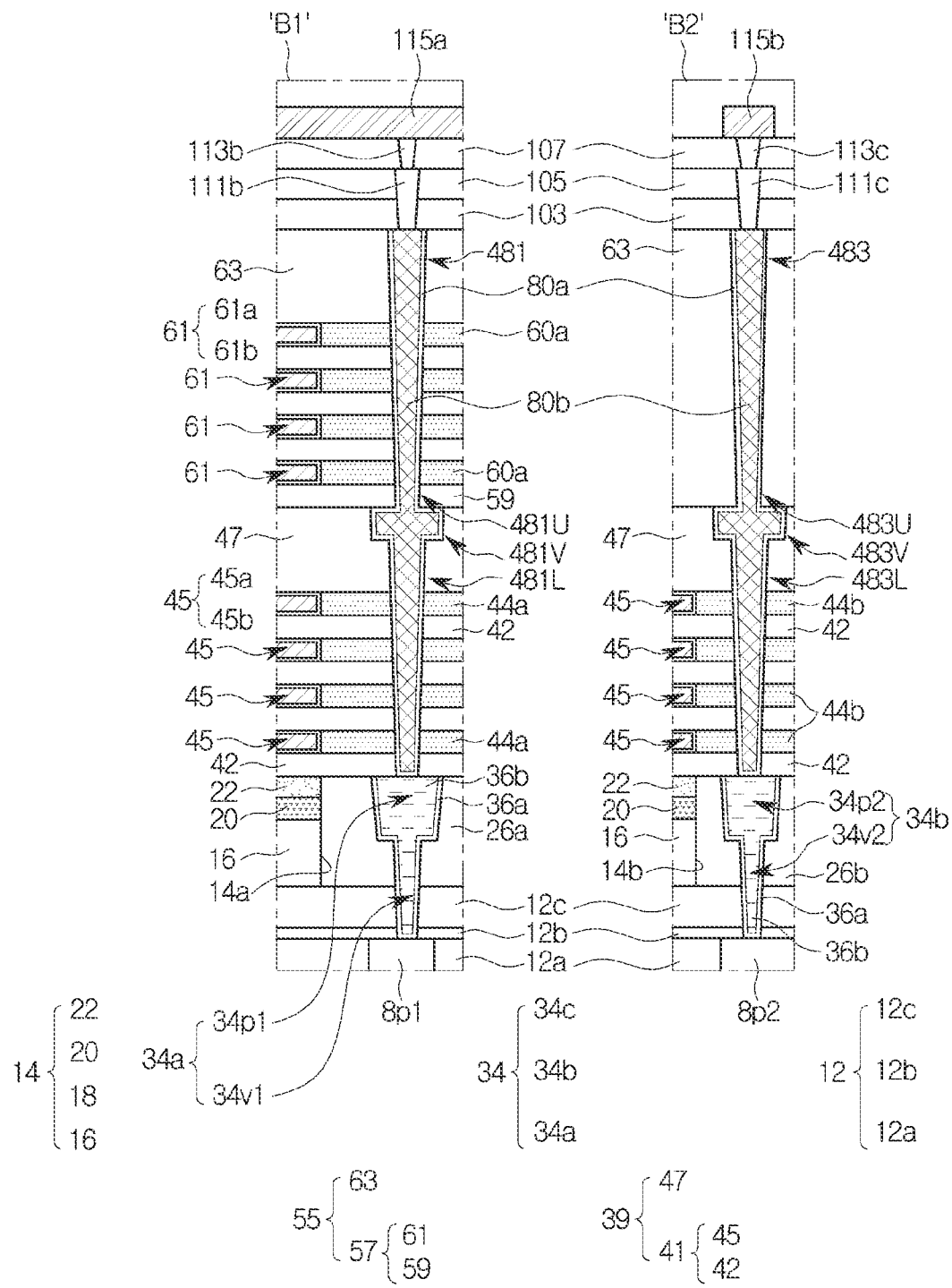

In the description below, a first internal contact plug 481, a second internal contact plug 483, a source contact plug 485, and an external contact plug 487 which may replace the first internal contact plug 81 (in FIGS. 2A and 6A), the second internal contact plug 83 (in FIGS. 2A and 6A), source contact plug 85 (in FIGS. 2B and 6B), and the external contact plug 87 (in FIGS. 2B and 6B), respectively, will be described with reference to FIGS. 25 and 26. FIG. 25 is an enlarged diagram illustrating a portion of a modified example of regions marked "B1" in FIG. 2A and "B2" in FIG. 2B, and FIG. 26 is an enlarged diagram illustrating a portion of a modified example of regions marked "B3" and "B4" in FIG. 2B.

Figure 26:
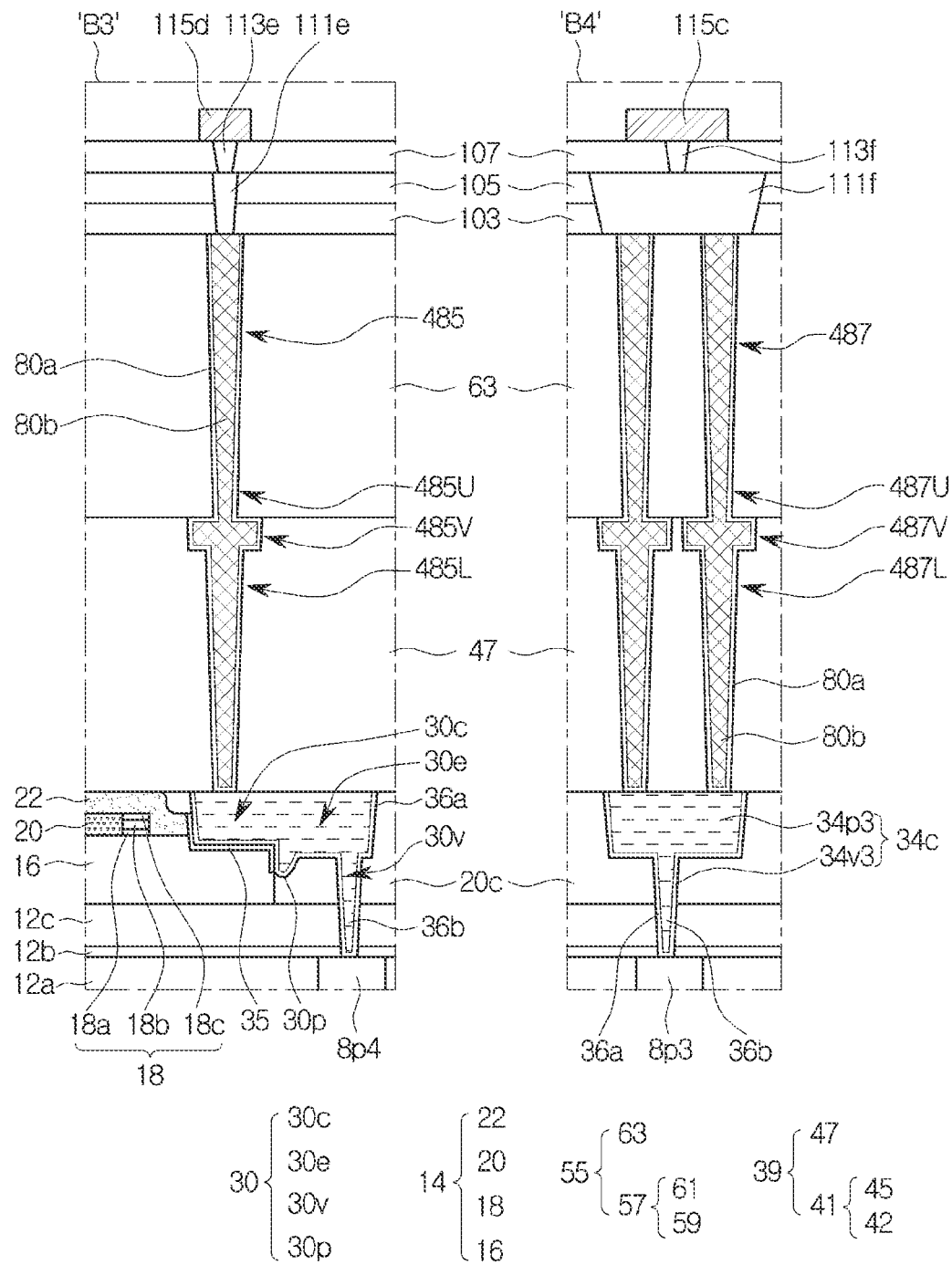

Referring to FIGS. 25 and 26, the first internal contact plug 481 (in FIG. 25) may include a lower vertical portion 481L in the first upper structure 39, an upper vertical portion 481U in the second upper structure 55, and an intermediate portion 481V disposed between the lower vertical portion 481L and the upper vertical portion 481U, and the second internal contact plug 483 (in FIG. 25) may include a lower vertical portion 483L in the first upper structure 39, an upper vertical portion 483U in the second upper structure 55, and an intermediate portion 483V disposed between the lower vertical portion 483L and the upper vertical portion 483U. The source contact plug 485 (in FIG. 26) may include a lower vertical portion 485L in the first upper structure 39, an upper vertical portion 485U in the second upper structure 55, and an intermediate portion 485V disposed between the lower vertical portion 485L and the upper vertical portion 485U, and the external contact plug 487 (in FIG. 26) may include a lower vertical portion 487L in the first upper structure 39, an upper vertical portion 487U in the second upper structure 55, and an intermediate portion 487V disposed between the lower vertical portion 487L and the upper vertical portion 487U.

In the first internal contact plug 481, the second internal contact plug 483, the source contact plug 485, and the external contact plug 487, each of the intermediate portions 481V, 483V, 485V, and 487V may have a width greater than a width of each of the upper vertical portions 481U, 483U, 485U, and 487U adjacent to the intermediate portions 481V, 483V, 485V, and 487V, and may be greater than a width of each of the lower vertical portions 481L, 483L, 485L, and 487L adjacent to the intermediate portions 481V, 483V, 485V, and 487V.

In an example embodiment, a thickness of each of the intermediate portions 481V, 483V, 485V, and 487V may be greater than a thickness of each of the lower and upper gate layers 45 and 61.

Each of the first internal contact plug 481, the second internal contact plug 483, the source contact plug 485, and the external contact plug 487 may include the contact gap-fill layer 80b and the contact barrier layer 80a covering a bottom surface and a lateral surface of the contact gap-fill layer 80b, similarly to the first internal contact plug 81 (in FIGS. 2A and 6A), the second internal contact plug 83 (in FIGS. 2A and 6A), the source contact plug 85 (in FIGS. 2B and 6B), and the external contact plug 87 (in FIGS. 2B and 6B), respectively.

A plurality of the external contact plugs 487 may be disposed on a single external pad pattern 34c. Accordingly, the plurality of external contact plugs 487 may be disposed on a single external pad pattern 34c.

In the first internal contact plug 481, the second internal contact plug 483, the source contact plug 485, and the external contact plug 487, the intermediate portions 481V, 483V, 485V, and 487V may be applied to the first internal contact plug 81 (in FIGS. 2A and 6A), the second internal contact plug 83 (in FIGS. 2A and 6A), the source contact plug 85 (in FIGS. 2B and 6B), and the external contact plug 87 (in FIGS. 2B and 6B), respectively, and may also be applied to the first internal contact plug 181 (in FIG. 19A) the second internal contact plug 183 (in FIG. 19B), the source contact plug 185 (in FIG. 19A), and the external contact plug 187 (in FIG. 19A), respectively, the modified examples described in the aforementioned example embodiment.

Figure 27:
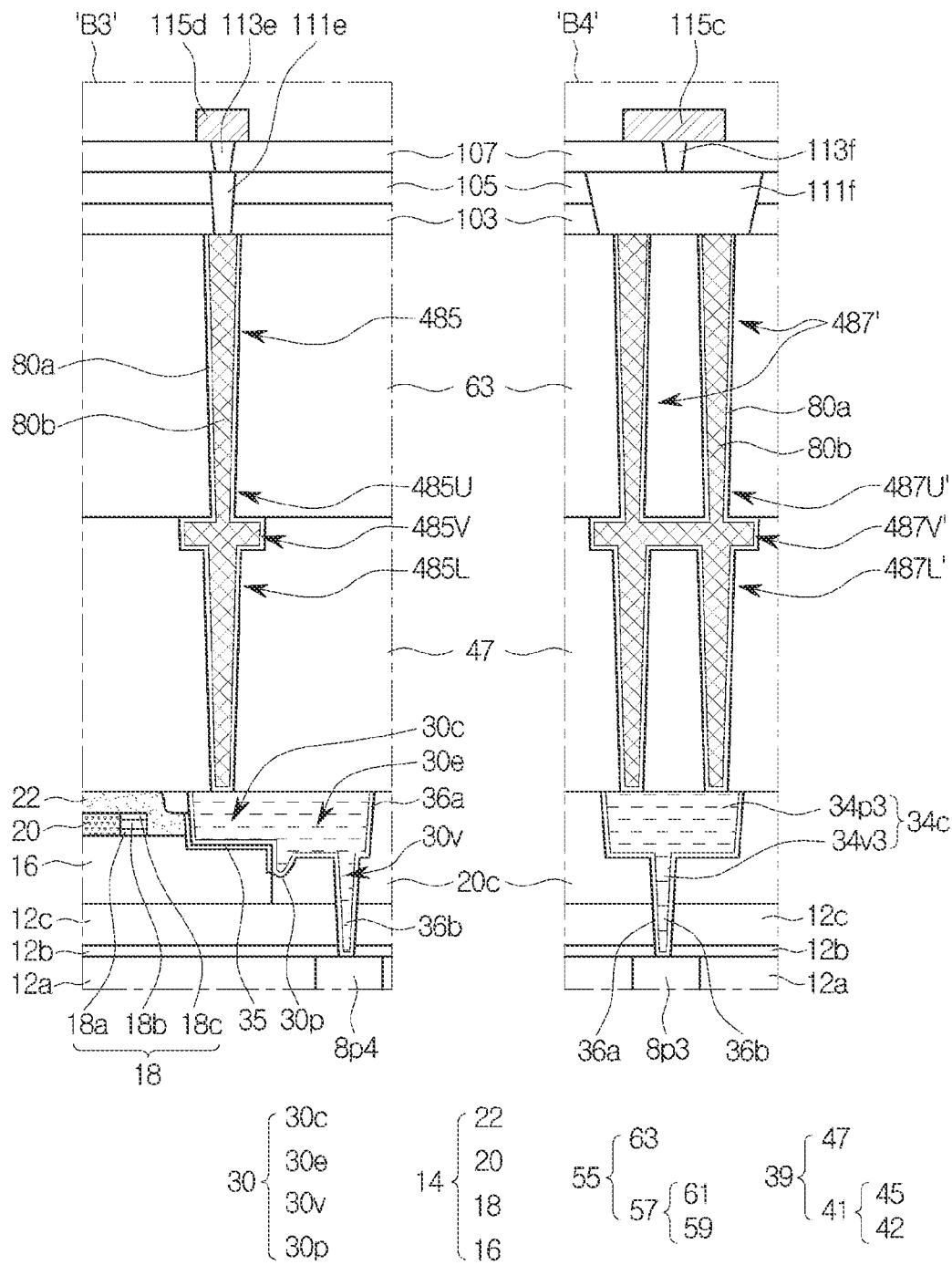
FIG. 27 is a cross-sectional diagram illustrating a portion of another modified example of a semiconductor device.

In the description below, an external contact plug 487' which may replace the external contact plug 487 (in FIG. 26) described with reference to FIG. 26 will be described with reference to FIG. 27. FIG. 27 is an enlarged diagram illustrating a portion of a modified example of the example illustrated in FIG. 26.

Referring to FIG. 27, the external contact plug 487' may include a plurality of lower vertical portions 487L' in the first upper structure 39, a plurality of upper vertical portions 487U' in the second upper structure 55, and a single intermediate portion 487V' connecting the plurality of lower vertical portions 487L' to the plurality of upper vertical portions 487U'.

In the external contact plug 487', the plurality of lower vertical portions 487L' may be in contact with the external pad pattern 34c. In the external contact plug 487', the plurality of upper vertical portions 487U' may be in contact with the sixth lower connection plug 111f.

In the external contact plug 487', the plurality of lower vertical portions 487L', the intermediate portion 487V', and the plurality of upper vertical portions 487U' may be integrated with one another without a boundary surface therebetween.

The external contact plug 487' may include a contact gap-fill layer 80b and a contact barrier layer 80a covering a lateral surface and a bottom surface of the contact gap-fill layer 80b, similarly to the external contact plug 87 (in FIGS. 2B and 6B). The contact gap-fill layer 80b may be configured as a single material layer which may extend along central portions of the plurality of lower vertical portions 487L', the intermediate portion 487V', and the plurality of upper vertical portions 487U' without a boundary surface.

Figure 28A:
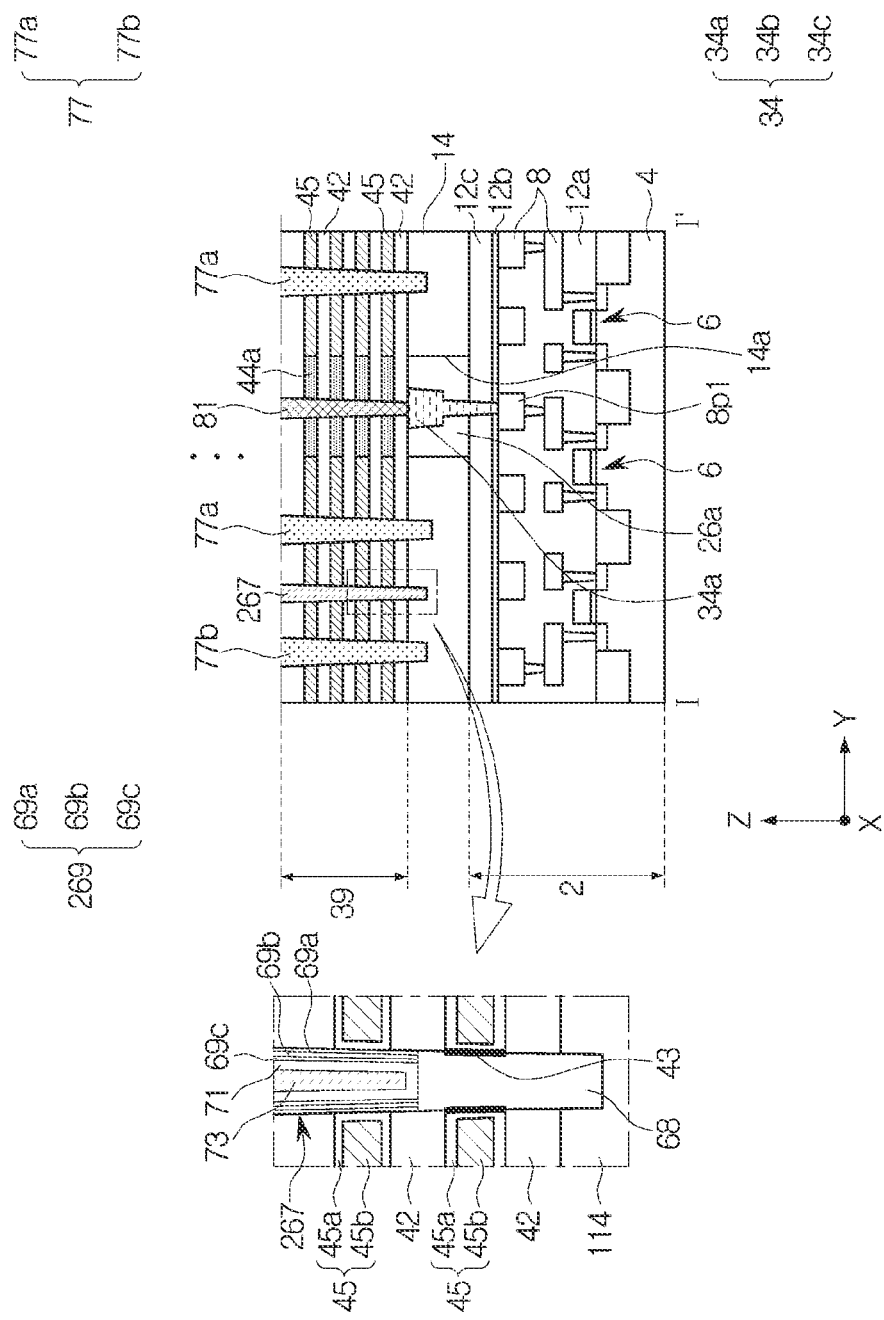
FIGS. 28A and 28B are cross-sectional diagrams illustrating another modified example of a semiconductor device.

In the description below, a pattern structure 114, a dummy pattern 114d, and a memory vertical structure 267 which may replace the pattern structure 14 (in FIGS. 2A and 2B), the dummy pattern 14d (in FIG. 2B), and the memory vertical structure 67 (in FIGS. 2A, 2B, and 3), respectively, described with reference to FIGS. 2A and 2B, will be described with reference to FIGS. 28A and 28B. FIG. 28A is a cross-sectional diagram illustrating a portion of a region taken along line I-I' in FIG. 1, and FIG. 28B is a cross-sectional diagram illustrating a portion of a region taken along line II-II' in FIG. 1.

Figure 28B:
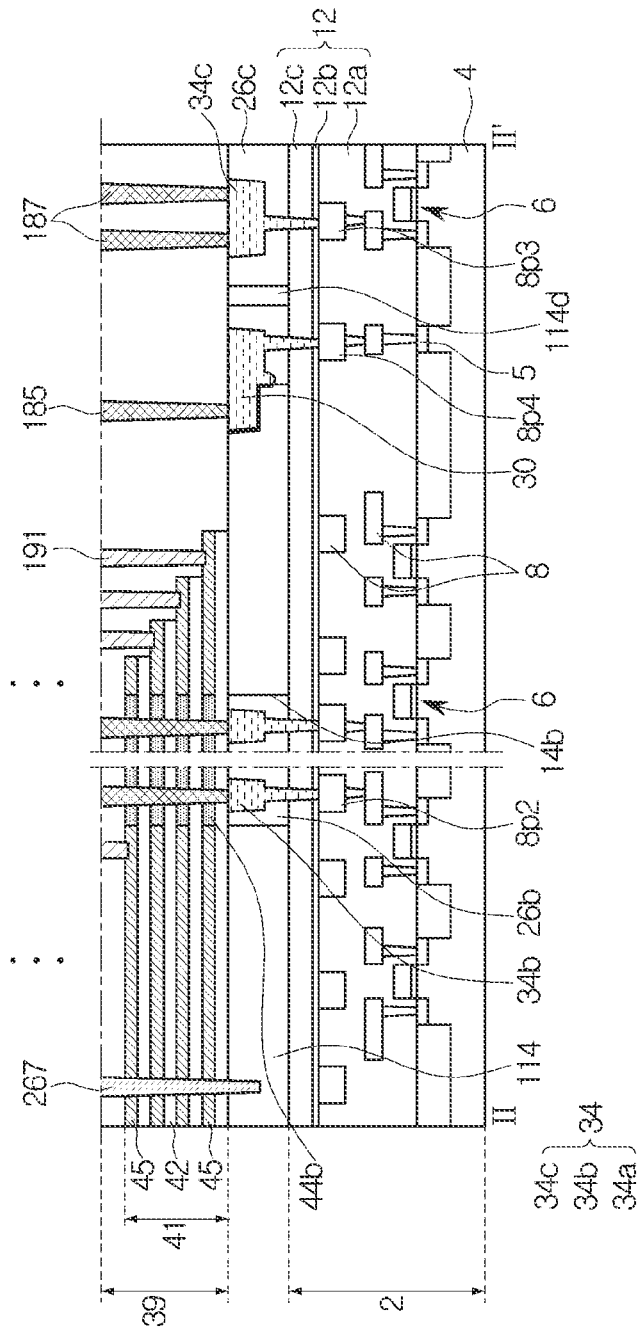

Referring to FIGS. 28A and 28B, the pattern structure 14 (in FIGS. 2A and 2B) described with reference to FIGS. 2A and 2B may be replaced with the pattern structure 114 which may be configured as a single material layer. The pattern structure 14 may be formed of polysilicon having a planar upper surface. The dummy pattern 14d (in FIG. 1) described with reference to FIG. 2B may be replaced with the dummy pattern 114d which may be configured as a single material layer. The dummy pattern 114d may have a material and a thickness the same as those of the pattern structure 114.

The memory vertical structure 67 (in FIG. 13) described with reference to FIGS. 2A and 2B may be replaced with a memory vertical structure 267 which may further include a lower semiconductor layer 68. The memory vertical structure 267 may include the lower semiconductor layer 68 in contact with the pattern structure 114 and extending in the vertical direction Z, a core region 73 spaced apart from the lower semiconductor layer 68 on the lower semiconductor layer 68, a channel layer 71 interposed between the core region 73 and the lower semiconductor layer 68 and extending to a lateral surface of the core region 73, and a data storage structure 269 covering an external surface of the channel layer 71. The data storage structure 269 may include a first dielectric layer 69a, a data storage layer 69b, and a second dielectric layer 69c, similarly to the data storage structure 69 (in FIG. 3) in FIG. 3.

A gate insulating layer 43 may be disposed between a lowermost lower gate layer of the lower gate layers 45 and the lower semiconductor layer 68 of the memory vertical structure 267.

Figure 29A:
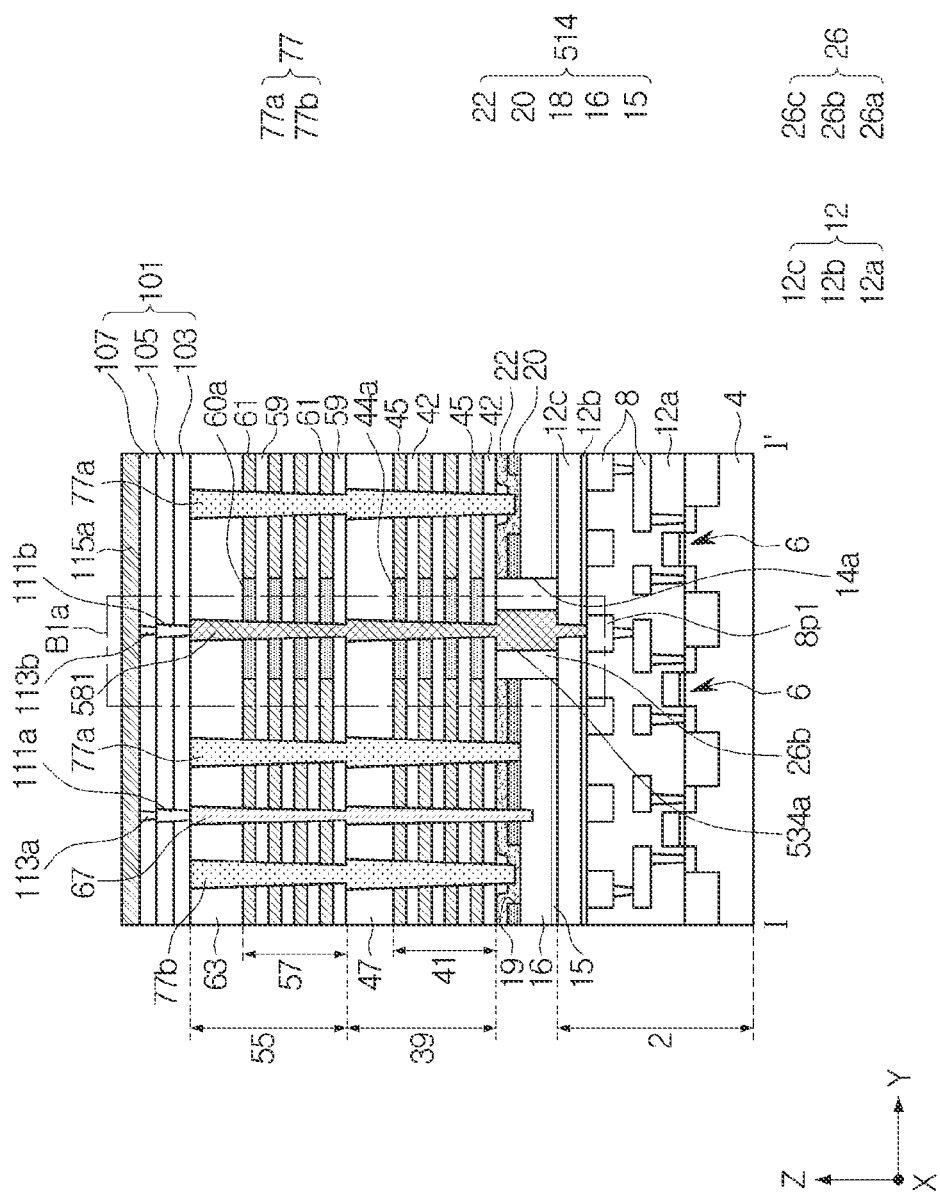
FIGS. 29A and 29B are cross-sectional diagrams illustrating another modified example of a semiconductor device.
Figure 29B:
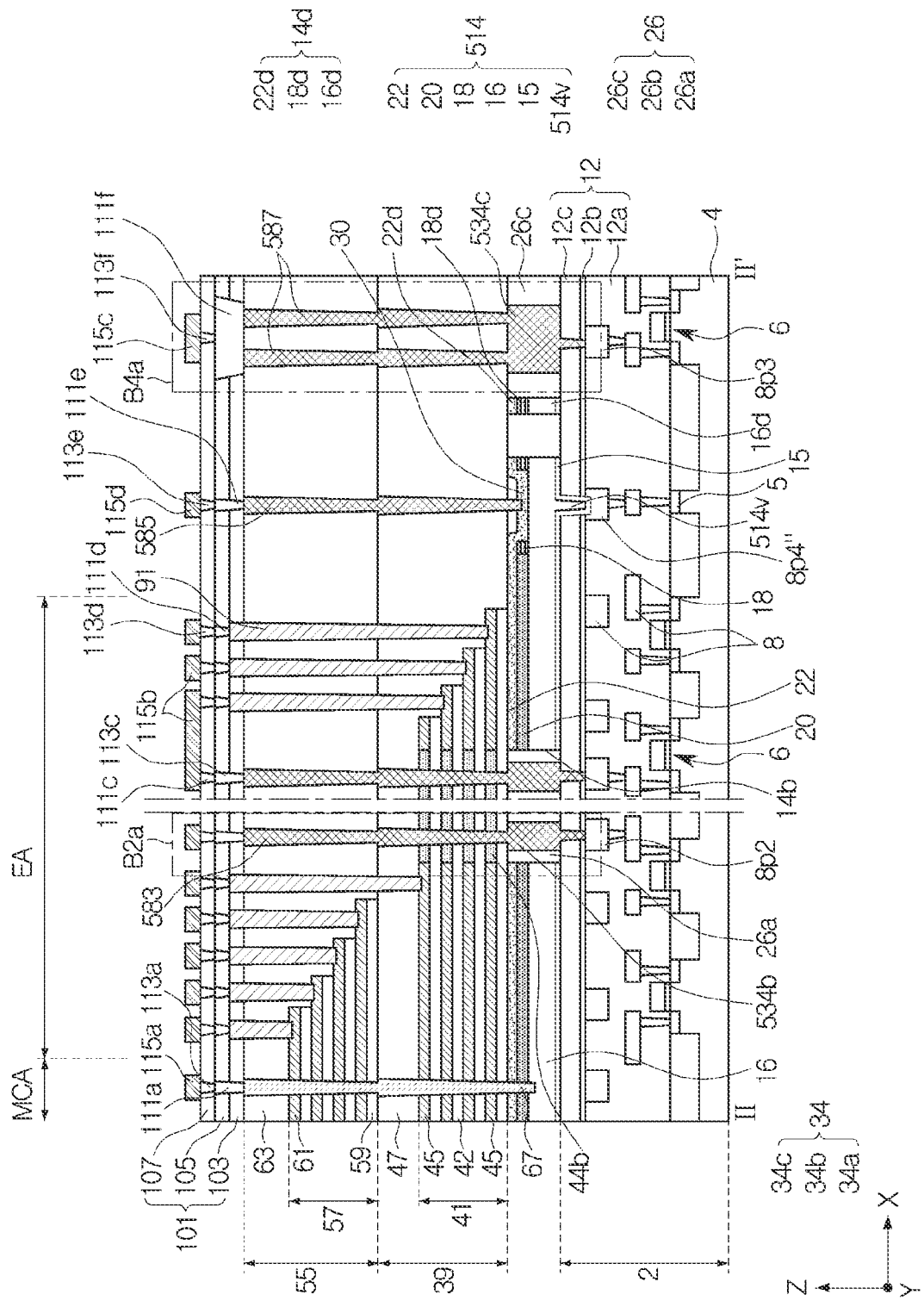
Figure 30A:
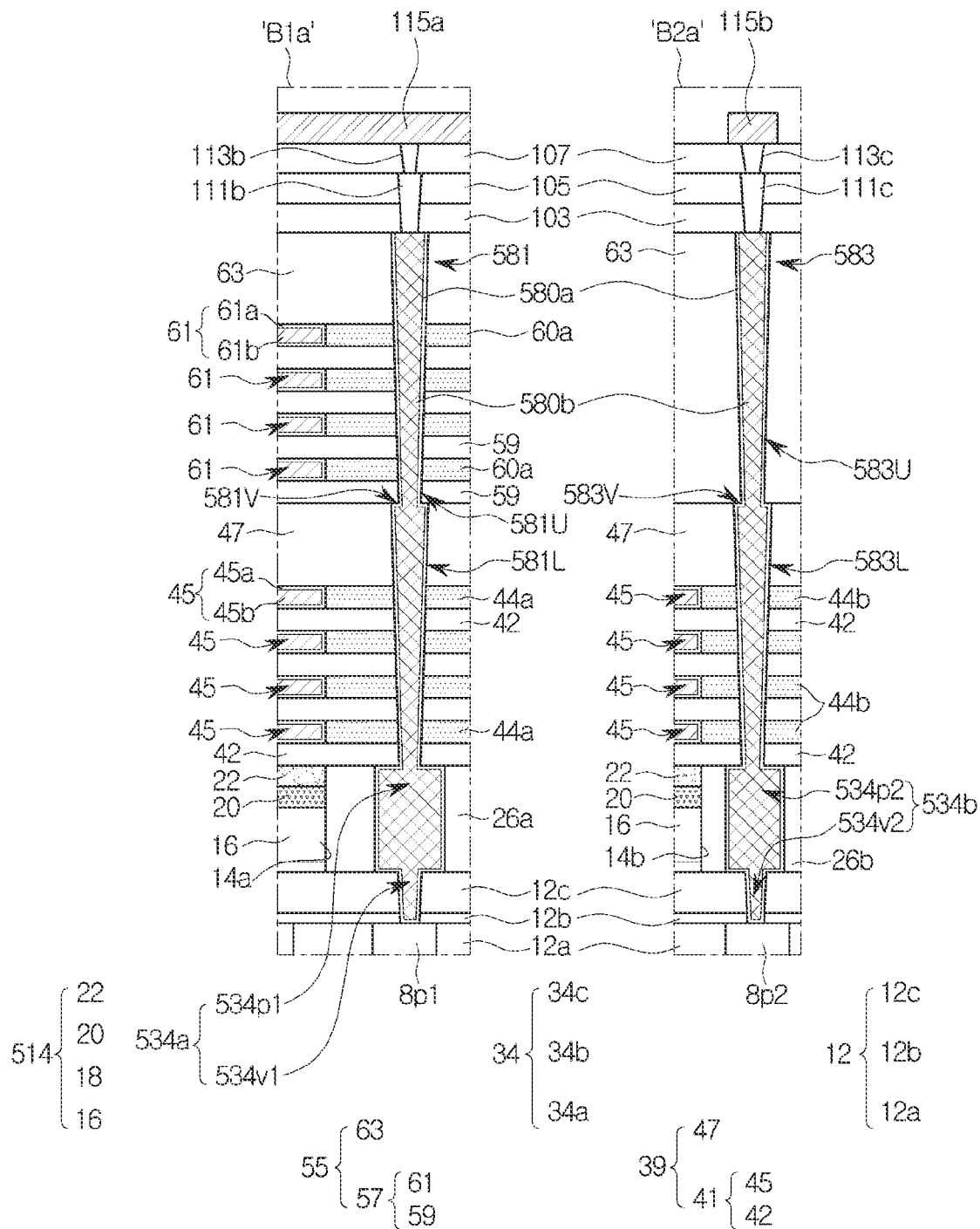
FIGS. 30A, 30B, and 31 are enlarged cross-sectional diagrams illustrating various other modified examples of a semiconductor device.
Figure 30B:
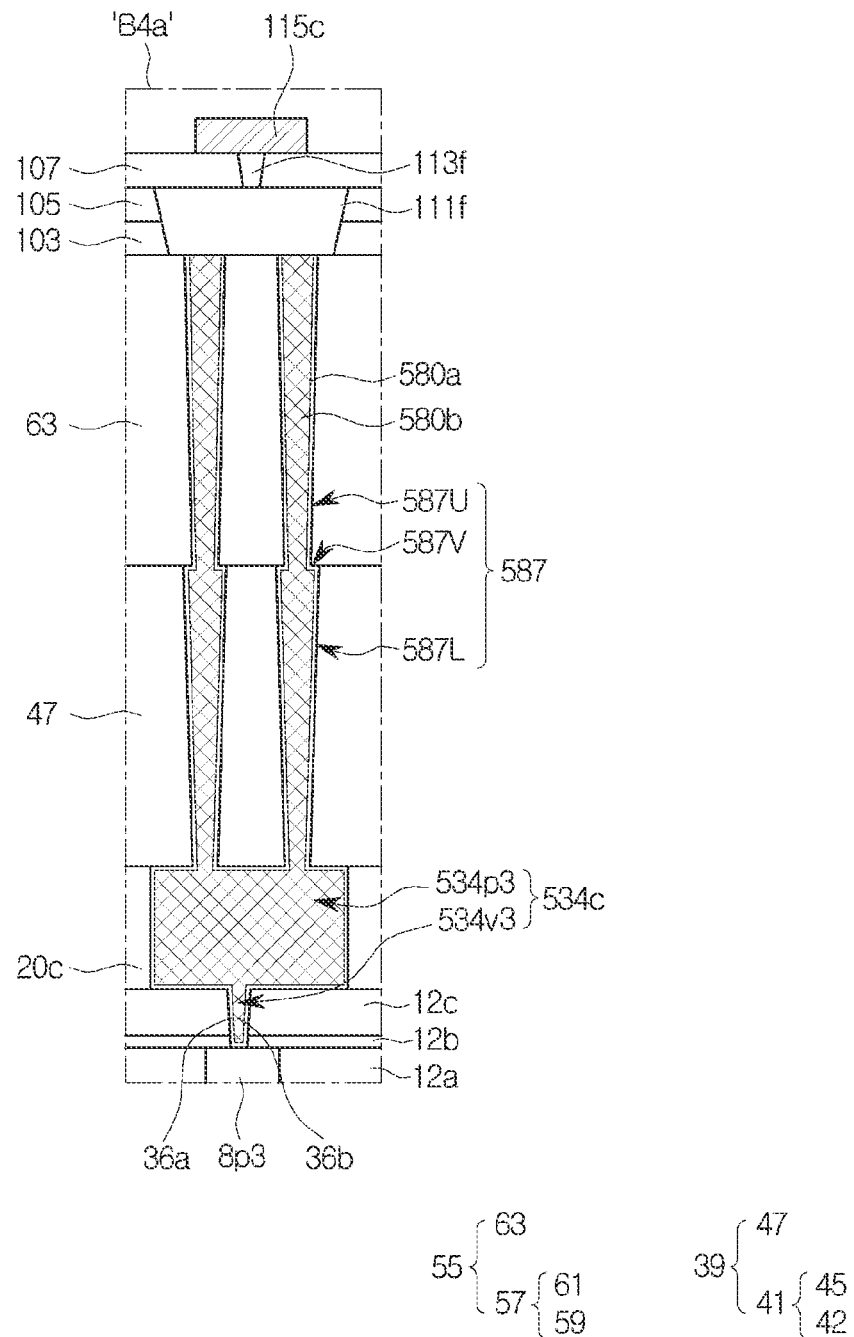

In the description below, a pattern structure 514 which may replace the pattern structure 14 (in FIGS. 2A and 2B) described in the aforementioned example embodiment, a source contact plug 585 (in FIG. 29B) which may replace the source contact plug 85 (in FIGS. 2B and 6B) described in the aforementioned example embodiment, a first internal contact plug 581 (in FIGS. 29A and 30A) which may replace the first internal pad pattern 34a (in FIGS. 2A and 6A) and the first internal contact plug 81 (in FIGS. 2A and 6A), described in the aforementioned example embodiment, a second internal contact plug 583 (in FIGS. 29B and 30A) which may replace the second internal pad pattern 34b (in FIGS. 2B and 6A) and the second internal contact plug 83 (in FIGS. 2A and 6A), described in the aforementioned example embodiment, and an external contact plug 587 (in FIGS. 29B and 30B) which may replace the external pad pattern 34c (in FIGS. 2B and 6B) and the external contact plug 87 (in FIGS. 2B and 6B). FIG. 29A is a cross-sectional diagram illustrating a region taken along line I-I' in FIG. 1. FIG. 28B is a cross-sectional diagram illustrating a region taken along line II-II' in FIG. 1. FIG. 30A is an enlarged diagram illustrating portions of regions marked "B1a" in FIG. 29A and "B2a" in FIG. 29B. FIG. 30B is an enlarged diagram illustrating a portion of region marked "B4a" in FIG. 29B.

Referring to FIGS. 29A, 29B, 30A, and 30B, the pattern structure 514 which may replace the pattern structure 14 (in FIGS. 2A and 2B) described in the aforementioned example embodiment may include the lower pattern layer 16, the intermediate pattern layer 20, the upper pattern layer 22, and the sacrificial pattern layer 18, similarly to the pattern structure 14 (in FIGS. 2A and 2B). The pattern structure 514 may further include a pattern protrusion portion 514v extending from the lower pattern layer 16 up to an upper portion of a lower pad 8p4" of the lower wiring structure 8 and spaced apart from the lower pad 8p4". The lower pattern layer 16 and the pattern protrusion portion 514v may be integrated with each other.

The source contact plug 585 (in FIG. 29B) which may replace the source contact plug 85 (in FIGS. 2B and 6B) described in the aforementioned example embodiment may be directly in contact with the pattern structure 514. For example, the source contact plug 585 (in FIG. 29B) may be directly in contact with the upper pattern layer 22.

The pattern structure 514 may further include a lower barrier layer 15 which may conformally cover lower portions of the lower pattern layer 16 and the pattern protrusion portion 514v. The lower barrier layer 15 may be in contact with the pattern protrusion portion 514v and the lower pad 8p4". The pattern protrusion portion 514v may be grounded to a ground region 5 of the substrate 4 through the pattern protrusion portion 514V and the lower barrier layer 15. The lower pad 8p4" may include a metal such as tungsten, and the lower barrier layer 15 may include metal nitride such as TiN.

The first internal contact plug 581 (in FIGS. 29A and 30A) which may replace the first internal pad pattern 34a (in FIGS. 2A and 6A) and the first internal contact plug 81 (in FIGS. 2A and 6A), described in the aforementioned example embodiment, may include a plug upper vertical portion 581U in the second upper structure 55, a plug lower vertical portion 581L in the first upper structure 39, a plug intermediate portion 581V disposed between the plug upper vertical portion 581U and the plug lower vertical portion 581L, and a pad pattern portion 534a continuously extending from the plug lower vertical portion 581L. In the first internal contact plug 581 (in FIGS. 29A and 30A), the pad pattern portion 534a may include a pad portion 534p1 penetrating the first intermediate insulating layer 26a and having a thickness the same as a thickness of the pattern structure 514, and a via portion 534v1 extending downwardly from the pad portion 534p1 and in contact with the first lower pad 8p1. In the first internal contact plug 581 (in FIGS. 29A and 30A), the plug upper vertical portion 581U, the plug lower vertical portion 581L, the plug intermediate portion 581V, the pad portion 534p1, and the via portion 534v1 may be integrated with one another. The configuration in which the elements may be integrated with one another may indicate that one of the material layers may be continuously disposed without a boundary surface among the elements.

The second internal contact plug 583 (in FIGS. 29B and 30A) which may replace the second internal pad pattern 34b (in FIGS. 2B and 6A) and the second internal contact plug 83 (in FIGS. 2A and 6A), described in the aforementioned example embodiment, may include a plug upper vertical portion 583U in the second upper structure 55, a plug lower vertical portion 583L in the first upper structure 39, a plug intermediate portion 583V disposed between the plug upper vertical portion 583U and the plug lower vertical portion 583L, and a pad pattern portion 534b continuously extending from the plug lower vertical portion 583L. In the second internal contact plug 583 (in FIGS. 29B and 30A), the pad pattern portion 534b may include a pad portion 534p2 penetrating the second intermediate insulating layer 26b and having a thickness the same as a thickness of the pattern structure 514, and a via portion 534v2 continuously extending downwardly from the pad portion 534p2 without a boundary surface and in contact with the second lower pad 8p2. In the second internal contact plug 583 (in FIGS. 29B and 30A), the plug upper vertical portion 583U, the plug lower vertical portion 583L, the plug intermediate portion 583V, the pad portion 534p2, and the via portion 534v2 may be integrated with one another.

The external contact plug 587 (in FIGS. 29B and 30B) which may replace the external pad pattern 34c (in FIGS. 2B and 6B) and the external contact plug 87 (in FIGS. 2B and 6B) may include a plug upper vertical portion 587U in the second upper structure 55, a plug lower vertical portion 587L in the first upper structure 39, a plug intermediate portion 587V disposed between the plug upper vertical portion 587U and the plug lower vertical portion 587L, and a pad pattern portion 534c continuously extending downwardly from the plug lower vertical portion 587L. In the external contact plug 587 (in FIGS. 29B and 30B), the pad pattern portion 534c may include a pad portion 534p3 penetrating the external intermediate insulating layer 26c and having a thickness the same as a thickness of the pattern structure 514, and a via portion 534v3 continuously extending downwardly from the pad portion 534p3 without a boundary surface and in contact with the third lower pad 8p3. In the external contact plug 587 (in FIGS. 29B and 30B), the plug upper vertical portion 587U, the plug lower vertical portion 587L, the plug intermediate portion 587V, the pad portion 534p3, and the via portion 534v3 may be integrated with one another.

Each of the first internal contact plug 581 (in FIGS. 29A and 30A), the second internal contact plug 583 (in FIGS. 29B and 30A), and the external contact plug 587 (in FIGS. 29B and 30B) may include a contact gap-fill layer 580b and a contact barrier layer 580a covering a bottom surface and a lateral surface of the contact gap-fill layer 580b. The contact barrier layer 580a may include metal nitride such as TiN, and the contact gap-fill layer 580b may include a metal such as W, or the like.

Figure 31:
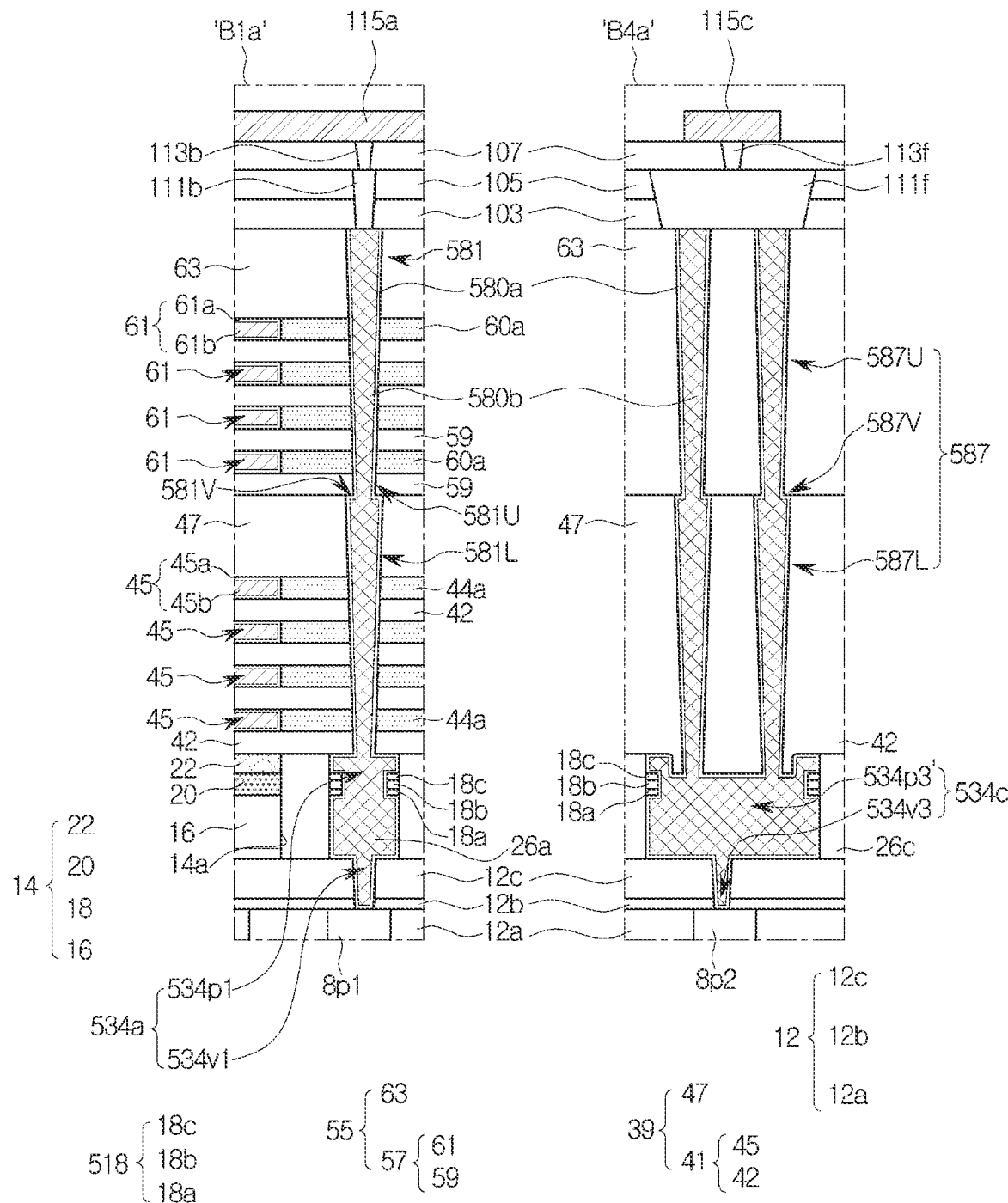

In the description below, a pad portion 534p1' which may replace the pad portion 534p1 of the first internal contact plug 581 (in FIGS. 29A and 30A) described in the aforementioned example embodiment, and a pad portion 534p3' which may replace the pad portion 534p3 of the external contact plug 587 (in FIGS. 29B and 30B) will be described with reference to FIG. 31. FIG. 31 is an enlarged diagram illustrating portions of modified examples of regions marked "B1a" in FIG. 29A and "B4a" in FIG. 29B.

Referring to FIG. 31, each of the pad portion 534p', which may replace the pad portion 534p1 (in FIG. 30A) of the first internal contact plug 581 described in the aforementioned example embodiment, and the pad portion 534p3', which may replace the pad portion 534p3 (in FIG. 30B) of the external contact plug 587, may include a recessed lateral surface portion, and a pad sacrificial pattern 518 filling the recessed lateral surface portion of the pad portions 534p1' and 534p3' may be disposed. A central portion of an upper surface of the pad portion 534p3' of the external contact plug 587 may be recessed.

The pad sacrificial pattern 518 may be formed of a thickness and a material the same as those of the pad sacrificial pattern 18 (in FIG. 6B) described in the aforementioned example embodiment. Accordingly, the pad sacrificial pattern 518 may include the first layer 18a, the second layer 18b, and the third layer 18c stacked in order.

Figure 32:
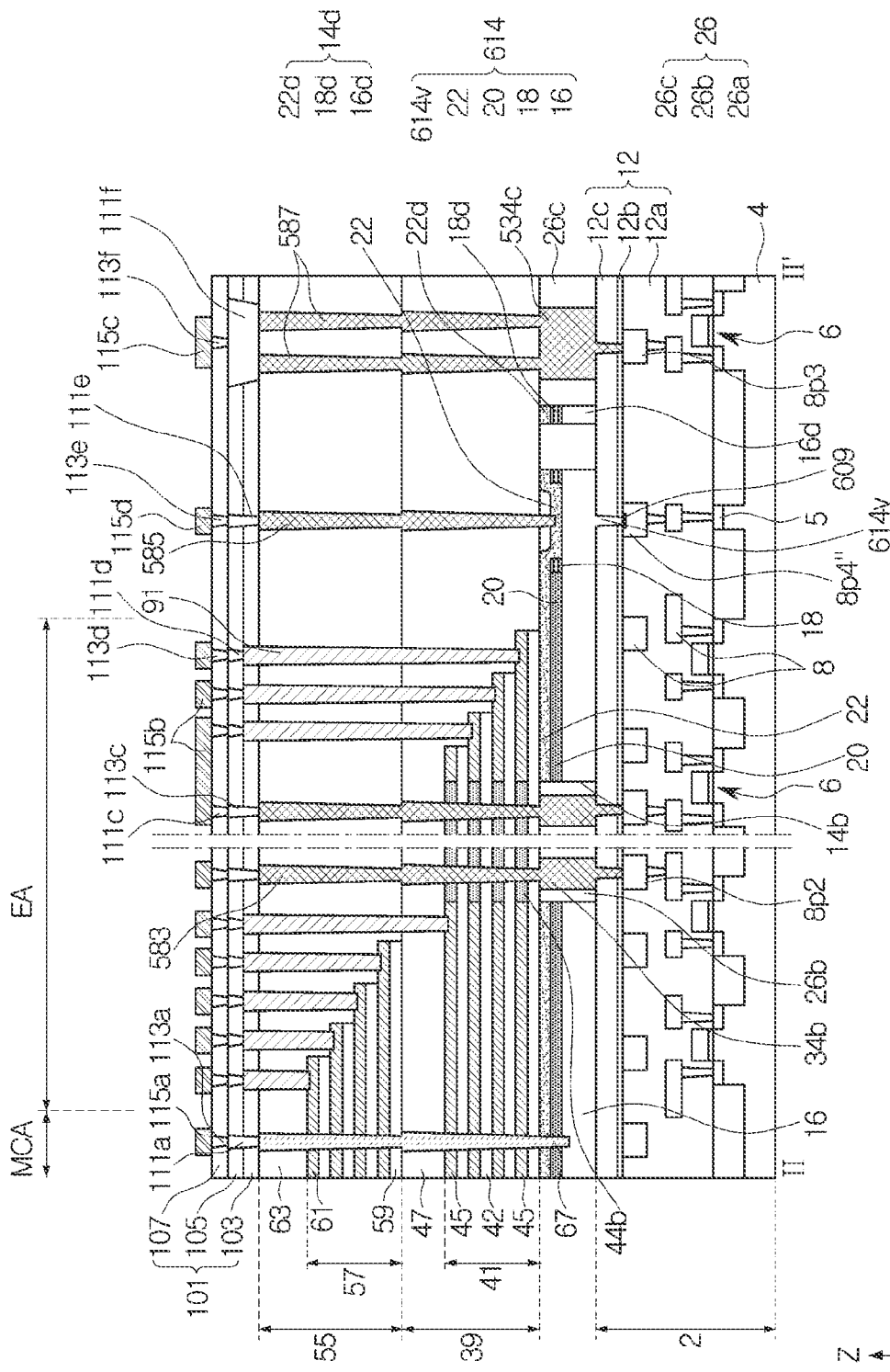
FIG. 32 is a cross-sectional diagram illustrating another modified example of a semiconductor device.

In the description below, a pattern structure 614 which may replace the pattern structure 514 (in FIGS. 29A and 29B) will be described with reference to FIG. 32. FIG. 32 is a cross-sectional diagram illustrating a region taken along line II-II' in FIG. 1.

Referring to FIG. 32, the pattern structure 614 which may replace the pattern structure 514 (in FIGS. 29A and 29B) may include the lower pattern layer 16, the intermediate pattern layer 20, the upper pattern layer 22, and the sacrificial pattern layer 18, similarly to the pattern structure 14 (in FIGS. 2A and 2B). The pattern structure 614 may further include a pattern protrusion 614v which may extend from the lower pattern layer 16 to an upper portion of a lower pad 8p4" of the lower wiring structure 8 and spaced apart from the lower pad 8p4".

The region of the lower pad 8p4" in contact with the pattern protrusion 614v may be configured as a nitrified region 609 which has been nitrified. For example, when the lower pad 8p4" is formed of a first metal, a partial region of the lower pad 8p4" in contact with the pattern protrusion 614v may be configured as the nitrified region 609 formed of the first metal. For example, when the lower pad 8p4" includes tungsten, the nitrified region 609 may be formed of tungsten nitride.

In the description below, an example of a method of manufacturing a semiconductor device will be described with reference to FIGS. 33A to 39B. In FIGS. 33A to 39B, FIGS. 33a, 34a, 35a, 36a, 37, 38a, and 39a are cross-sectional diagrams illustrating a region along line I-I' in FIG. 1, and FIGS. 33b, 34b, 35b, 36b, 38b, and 39b are cross-sectional diagrams illustrating a region along line II-II' in FIG. 1.

Figure 33A:
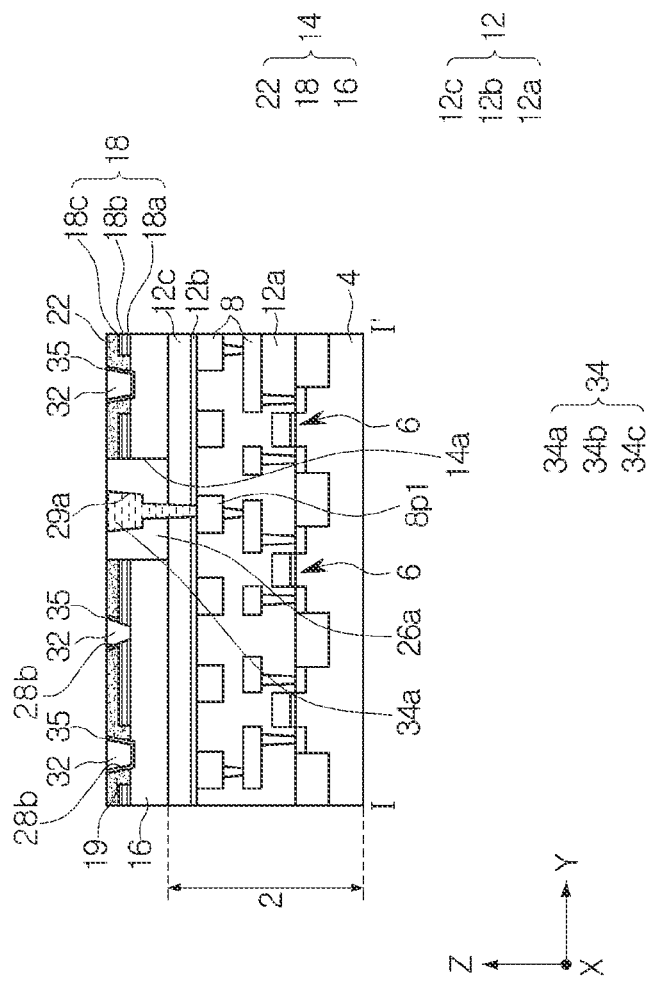
FIGS. 33A to 39B are cross-sectional diagrams illustrating an example embodiment of a method of manufacturing a semiconductor device.
Figure 33B:
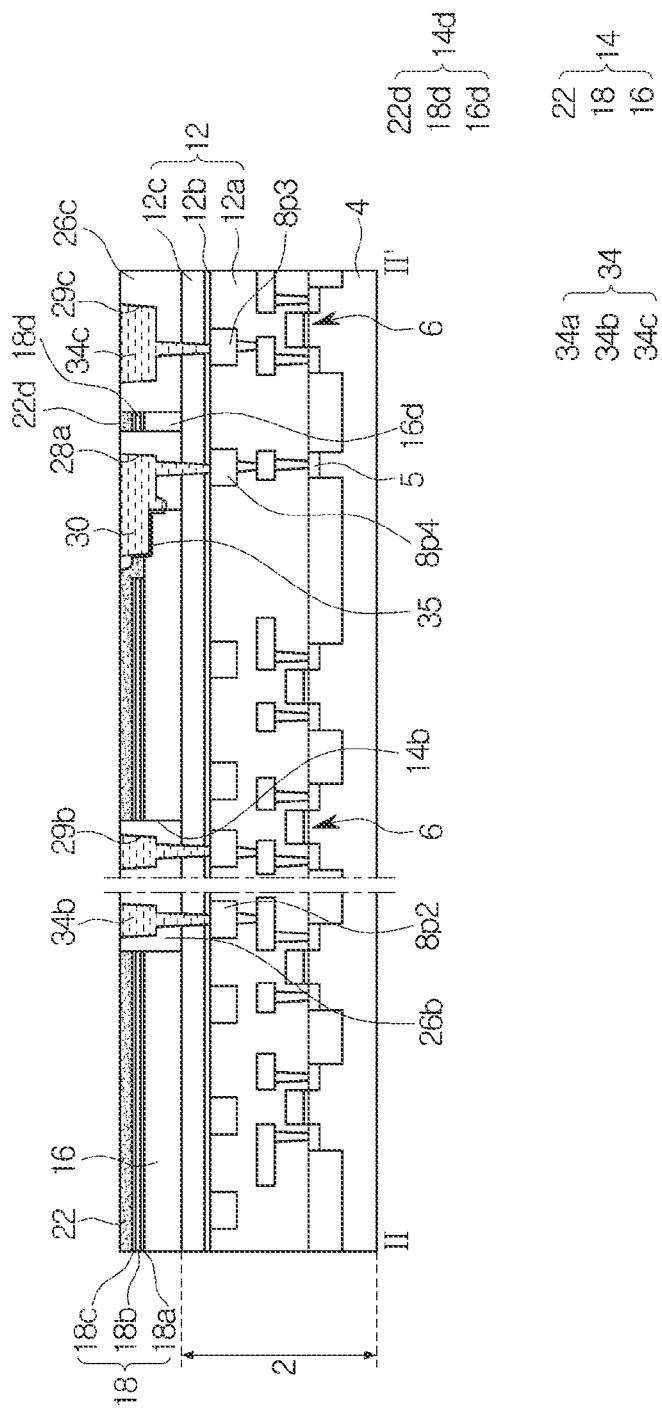

Referring to FIGS. 1, 33A, and 33B, a lower structure 2 may be formed. The forming the lower structure 2 may include forming a lower integration circuit 6, a lower wiring structure 8, and a lower insulating structure 12 on a substrate 4.

The lower integration circuit 6 may be configured as a semiconductor substrate such as single crystalline silicon. The lower integration circuit 6 may be a circuit for operating a memory cell array of a memory device such as a flash memory or a variable resistive memory. The lower wiring structure 8 may include first to fourth lower pads 8p1, 8p2, 8p3, and 8p4. The lower insulating structure 12 may include a first lower insulating layer 12a covering the lower integration circuit 6 and the lower wiring structure 8, an etch stop layer 12b on the first lower insulating layer 12a, and a second lower insulating layer 12c on the etch stop layer 12b.

A pattern structure 14 having a first internal opening 14a and a second internal opening 14b, and a dummy pattern 14d may be formed on the lower structure 2.

The forming the pattern structure 14 and the dummy pattern 14d may be simultaneously formed by forming the lower pattern layer 16 on the lower structure 2, forming a sacrificial pattern layer 18 on the lower pattern layer 16, forming an upper pattern layer 22 in contact with the lower pattern layer 16 on the sacrificial pattern layer 18 through the opening 19, and patterning the lower pattern layer 16, the sacrificial pattern layer 18, and the upper pattern layer 22.

The dummy pattern 14d may include the lower pattern layer 16, the sacrificial pattern layer 18, and the upper pattern layer 22 stacked in order.

The pattern structure 14 may include the lower pattern layer 16, the sacrificial pattern layer 18 having the opening 19 on the lower pattern layer 16, and the upper pattern layer 22 covering the sacrificial pattern layer 18 and in contact with the lower pattern layer 16 through the opening 19.

The lower pattern layer 16 may be formed of polysilicon having N-type conductivity, for example.

In an example embodiment, the sacrificial pattern layer 18 may include a first layer 18a, a second layer 18b, and a third layer 18c. The first and third layers 18a and 18c may be formed of silicon oxide, and the second layer 18b may be formed of silicon nitride.

The upper pattern layer 22 may be formed of polysilicon having N-type conductivity, for example.

Thereafter, an insulating layer may be formed, and the insulating layer may be planarized until upper surfaces of the pattern structure 14 and the dummy pattern 14d are exposed, thereby forming an intermediate insulating structure 26.

The intermediate insulating structure 26 may include a first intermediate insulating layer 26a remaining in the first internal opening 14a, a second intermediate insulating layer 26b remaining in the second internal opening 14b, and an external intermediate insulating layer 26c surrounding an external surface of the pattern structure 14 and a lateral surface of the dummy pattern 14d.

In an example embodiment, a contact pattern 30 and pad patterns 34 may be formed simultaneously.

In another example embodiment, a sacrificial metal pattern 32 may be formed together while the contact pattern 30 and the pad patterns 34 are formed.

The forming the contact pattern 30, the sacrificial metal pattern 32, and the pad patterns 34 may include forming openings 28a, 28b, 29a, 29b, and 29c, forming a metal-semiconductor compound layer 35 by a silicide process, and performing a deposition process and a planarization process, thereby forming a contact barrier layer and a contact gap-fill layer remaining in the openings 28a, 28b, 29a, 29b, and 29c. The contact barrier layer may cover a lateral surface and a bottom surface of the contact gap-fill layer.

The openings 28a, 28b, 29a, 29b, and 29c may include a source contact opening 28a, a sacrificial pattern opening 28b, a first internal pad opening 29a, a second internal pad opening 29b, and an external pad opening 29c. The first internal pad opening 29a may penetrate the first intermediate insulating layer 26a and may downwardly extend to expose the first lower pad 8p1, the second internal pad opening 29b may penetrate the second intermediate insulating layer 26b and may extend downwardly to exposed the second lower pad 8p2, and the external pad opening 29c may penetrate the external intermediate insulating layer 26c and may extend downwardly to expose the third lower pad 8p3. The source contact opening 28a may expose a portion of the pattern structure 14 and may extend downwardly in the external intermediate insulating layer 26c to expose the fourth lower pad 8p4, and the sacrificial pattern opening 28b may expose a portion of the pattern structure 14.

The contact pattern 30 may be formed in the source contact opening 28a, and the sacrificial metal pattern 32 may be formed in the sacrificial pattern opening 28b.

The pad patterns 34 may include a first internal pad pattern 34a formed in the first internal pad opening 29a, a second internal pad pattern 34b formed in the second internal pad opening 29b, and an external pad pattern 34c formed in the external pad opening 29c.

Each of the pad patterns 34, the contact pattern 30, and the sacrificial metal pattern 32 may include a contact barrier layer and a contact gap-fill layer in common.

In an example embodiment, the contact pattern 30 and the sacrificial metal pattern 32 may further include the metal-semiconductor compound layer 35 interposed between the contact barrier layer and the lower pattern layer 16 of the pattern structure 14 and between the contact barrier layer and the upper pattern layer 22 of the pattern structure 14.

The sacrificial metal pattern 32 may be used to form lower portions of the separation structures 377 (in FIG. 22) as described in the aforementioned example embodiment with reference to FIG. 22. In another example embodiment, the forming the sacrificial metal pattern 32 may not be performed. For example, to form lower portions of the separation structures 77 (in FIG. 2A) as described in the aforementioned example embodiment with reference to FIG. 2A, the sacrificial metal pattern 32 may not be provided. In the description below, an example in which the sacrificial metal pattern 32 is formed will be described.

Figure 34A:
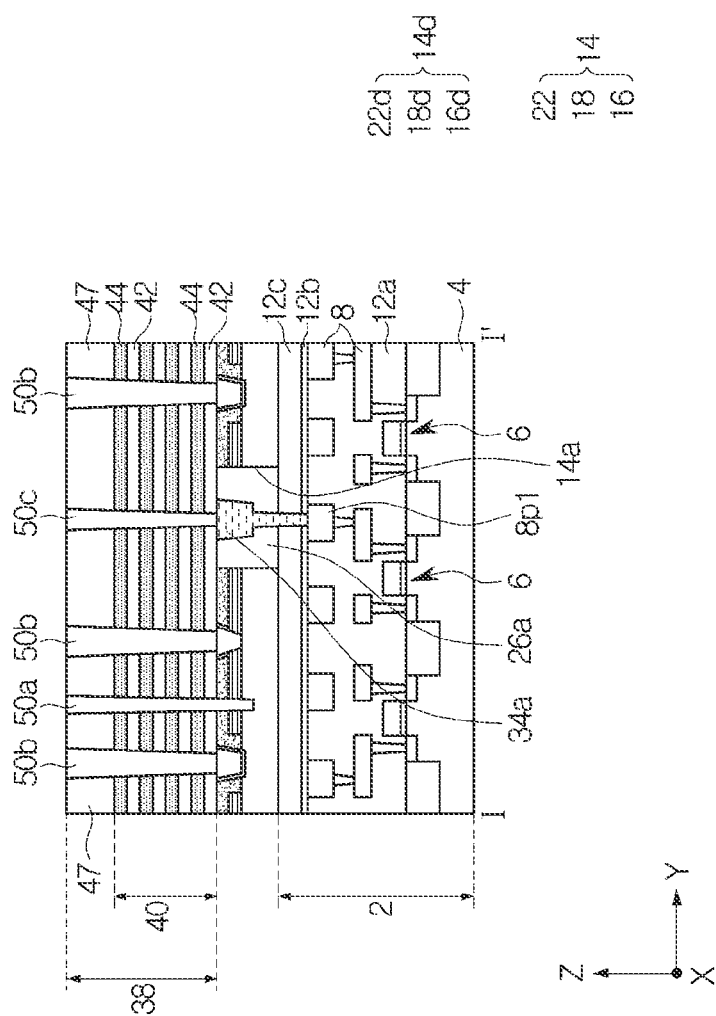
Figure 34B:
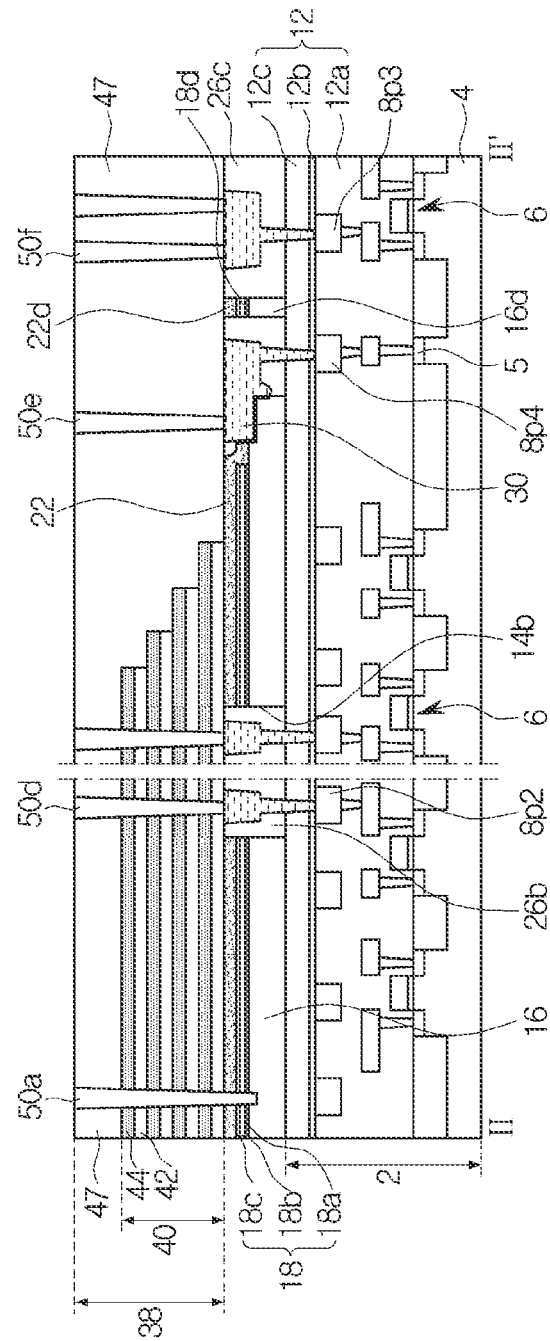

Referring to FIGS. 1, 34A, and 34B, a first preliminary upper structure 38 may be formed on a structure including the pad patterns 34, the contact pattern 30, and the sacrificial metal pattern 32 formed therein.

The forming the first preliminary upper structure 38 may include forming a first preliminary stack structure 40 and forming a first capping insulating layer 47 covering the first preliminary stack structure 40. The first capping insulating layer 47 may have a planar upper surface.

The forming the first preliminary stack structure 40 may include forming lower interlayer insulating layers 42 and first mold layers 44 alternately stacked, and patterning the lower interlayer insulating layers 42 and the first mold layers 44 to form a staircase structure.

Lower sacrificial patterns 50a to 50f penetrating the first preliminary upper structure 38 may be formed.

The lower sacrificial patterns 50a to 50f may include a channel lower sacrificial pattern 50a, a separation lower sacrificial pattern 50b, a first contact lower sacrificial pattern 50c, a second contact lower sacrificial pattern 50d, a third contact lower sacrificial pattern 50e, and an external contact lower sacrificial pattern 50f.

The channel lower sacrificial pattern 50a may penetrate the first preliminary upper structure 38 and may extend into the lower pattern layer 16 of the pattern structure 14.

The separation lower sacrificial pattern 50b may penetrate the first preliminary upper structure 38 and may be in contact with the sacrificial metal pattern 32.

The first contact lower sacrificial pattern 50c may penetrate the first preliminary upper structure 38 and may be in contact with the first internal pad pattern 34a, the second contact lower sacrificial pattern 50d may penetrate the first preliminary upper structure 38 and may be in contact with the second internal pad pattern 34b, the third contact lower sacrificial pattern 50e may penetrate the first preliminary upper structure 38 and may be in contact with the contact pattern 30, and the fourth contact lower sacrificial pattern 50e may penetrate the first preliminary upper structure 38 and may be in contact with the external pad pattern 34c.

Figure 35A:
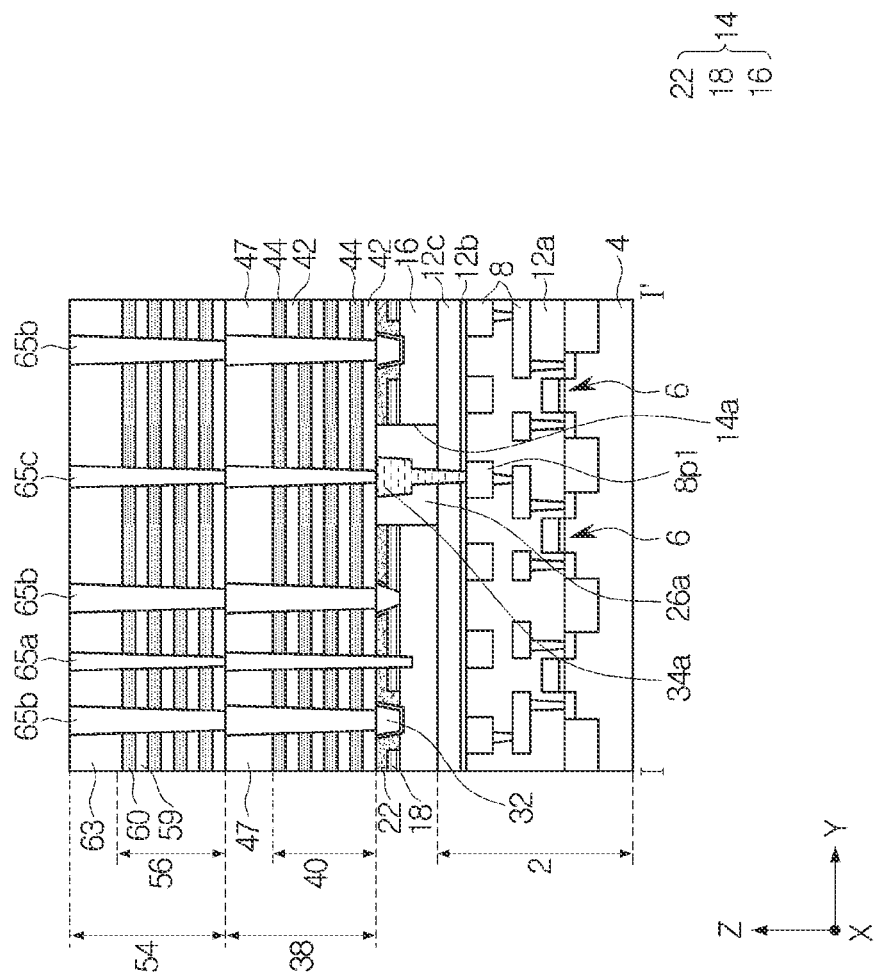
Figure 35B:
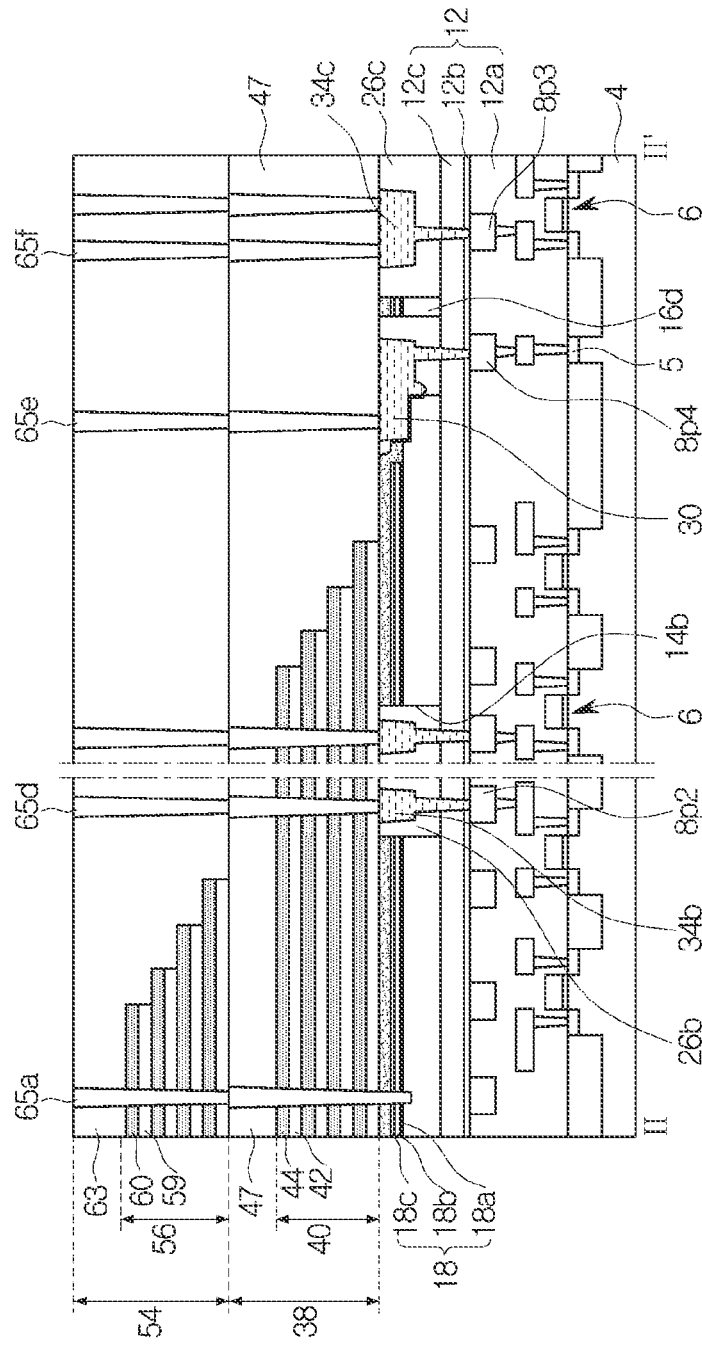

Referring to FIGS. 1, 35A, and 35B, a second preliminary upper structure 54 may be formed on the lower sacrificial patterns 50a to 50f and the first preliminary upper structure 38.

The forming the second preliminary upper structure 54 may include forming a second preliminary stack structure 56 and forming a second capping insulating layer 63 covering the second preliminary stack structure 56. The second capping insulating layer 63 may have a planar upper surface.

The forming the second preliminary stack structure 56 may include forming the upper interlayer insulating layers 59 and second mold layers 60 alternately stacked and patterning the upper interlayer insulating layers 59 and second mold layers 60 to form a staircase structure.

Upper sacrificial patterns 65a to 65f penetrating the second preliminary upper structure 54 may be formed.

The upper sacrificial patterns 65a to 65f may include a channel upper sacrificial pattern 65a, a separation upper sacrificial pattern 65b, a first contact upper sacrificial pattern 65c, a second contact upper sacrificial pattern 65d, a third contact upper sacrificial pattern 65e, and an external contact upper sacrificial pattern 65f.

The upper sacrificial patterns 65a to 65f may be vertically aligned to correspond to the lower sacrificial patterns 50a to 50f, respectively.

Figure 36A:
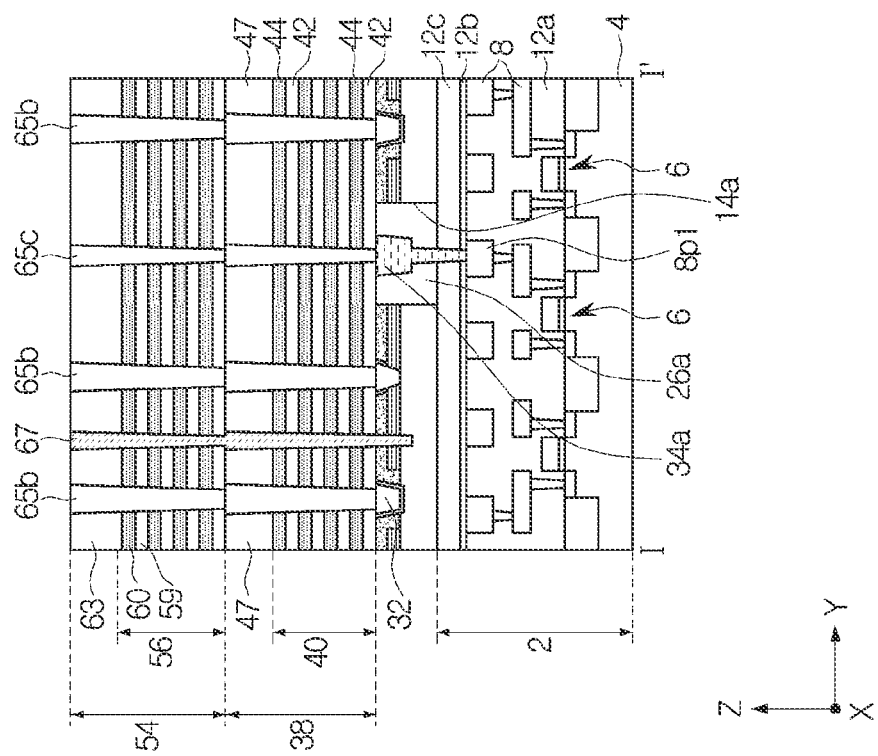
Figure 36B:
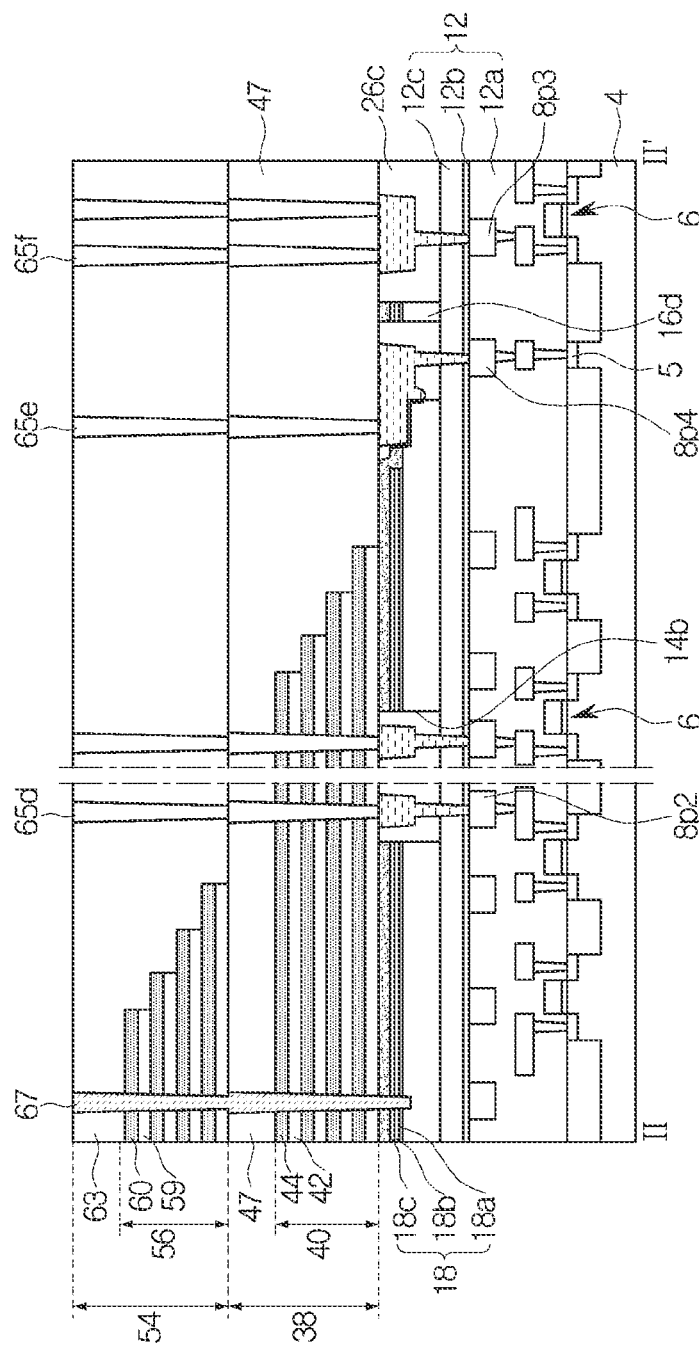

Referring to FIGS. 1, 36A, and 36B, a hole may be formed by selectively removing the channel lower sacrificial pattern 50a and the channel upper sacrificial pattern 65a stacked or aligned in order, and a memory vertical structure 67 may be formed in the hole.

In an example embodiment, the memory vertical structure 67 may include a channel layer which may be formed of a semiconductor material and a data storage layer which may store data.

Figure 37:
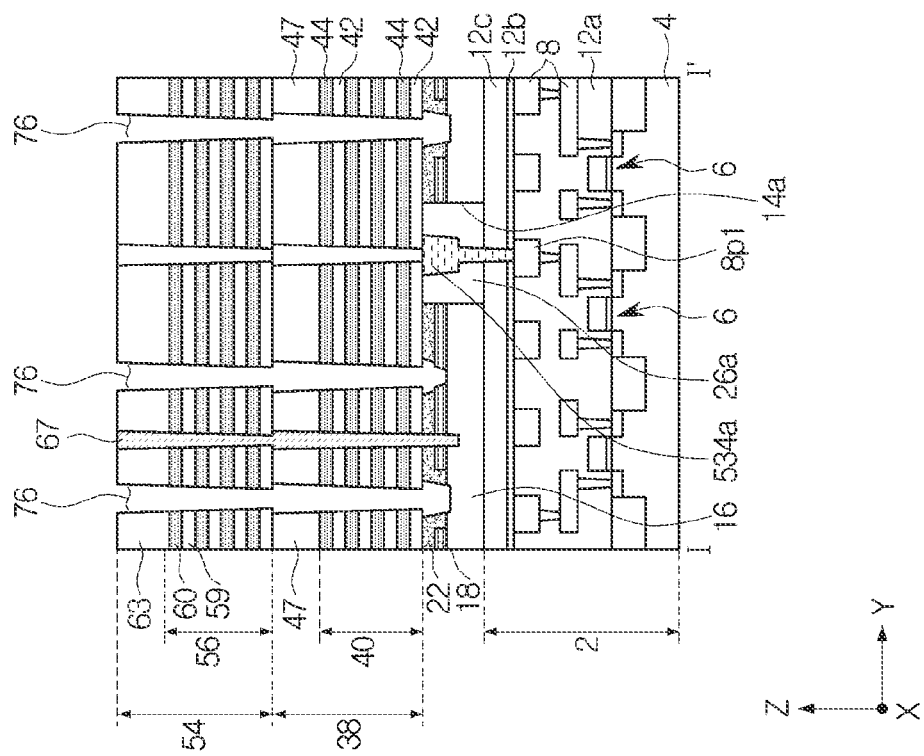

Referring to FIGS. 1 and 37, a separation trench 76 may be formed by selectively removing the separation lower sacrificial pattern 50b and the separation upper sacrificial pattern 65b stacked or aligned in order and removing the sacrificial metal pattern 32.

By the separation trench 76, a portion of the sacrificial pattern layer 18 of the pattern structure 14 may be exposed.

Figure 38A:
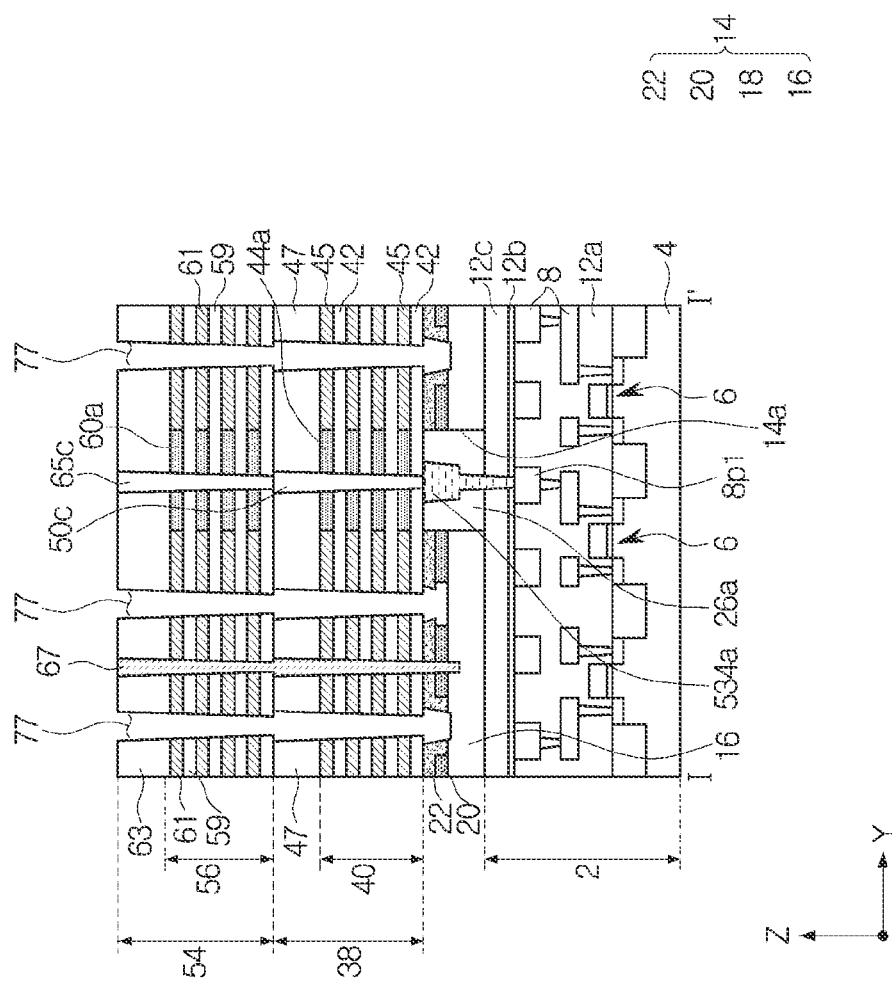
Figure 38B:
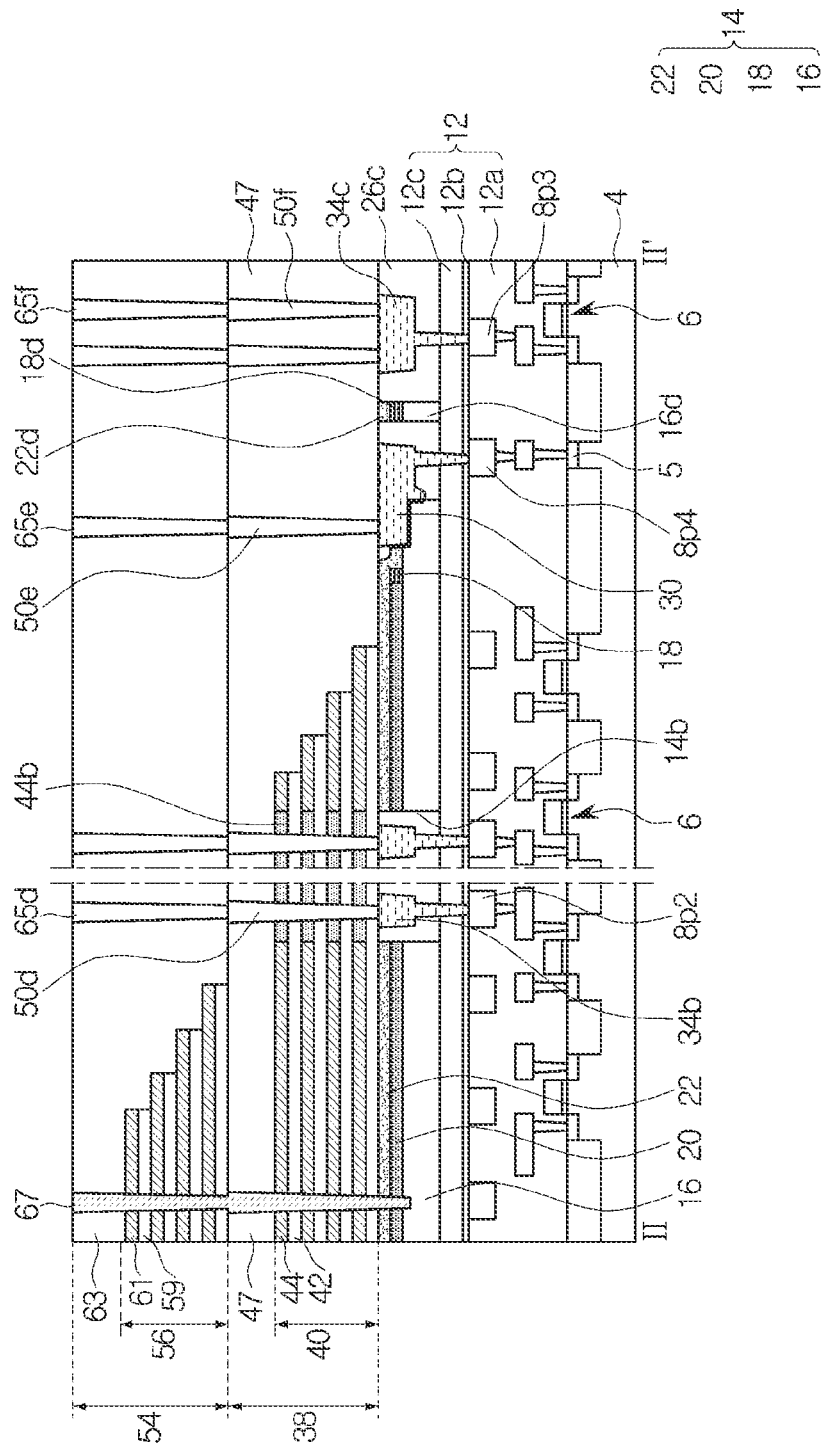

Referring to FIGS. 1, 38A, and 38B, a lower empty space may be formed by etching the sacrificial pattern layer 18 of the pattern structure 14 exposed by the separation trench 76, and the intermediate pattern layer 20 which may till the lower empty space may be formed. Accordingly, the pattern structure 14 may include the intermediate pattern layer 20. The intermediate pattern layer 20 may be formed of polysilicon having N-type conductivity, for example.

In an example embodiment, a portion of the sacrificial pattern layer 18 of the pattern structure 14 may remain. For example, an end portion of the sacrificial pattern layer 18 of the pattern structure 14 which does not overlap the first and second mold layers 44 and 60 may remain.

Gate empty spaces and mold layers 44a, 44b, and 60a which may remain may be formed by partially etching the first and second mold layers 44 and 60 exposed by the separation trench 76, and lower and upper gate layers 45 and 61 filling the gate empty spaces may be formed. The lower gate layers 45 may be formed in empty spaces formed by etching the first mold layers 44, and the upper gate layers 61 may be formed in empty spaces formed by etching the second mold layers 60. The mold layers 44a, 44b, and 60a which may remain may be configured as the first and second lower mold layers 44a and 44b and the upper mold layers 60a described with reference to FIGS. 2A and 2B.

In an example embodiment, the first and second mold layers 44 and 60 may remain in a region overlapping the first internal opening 14a and a region overlapping the second internal opening 14b.

The first preliminary stack structure 40 may be formed as a first stack structure 41 including the lower gate layers 45, and the second preliminary stack structure 56 may be formed as a second stack structure 57 including the upper gate layers 61.

The first preliminary upper structure 38 may be formed as a first upper structure 39 including the first stack structure 41, and the second preliminary upper structure 54 may be formed as a second upper stack structure 55 including the second stack structure 57.

Figure 39A:
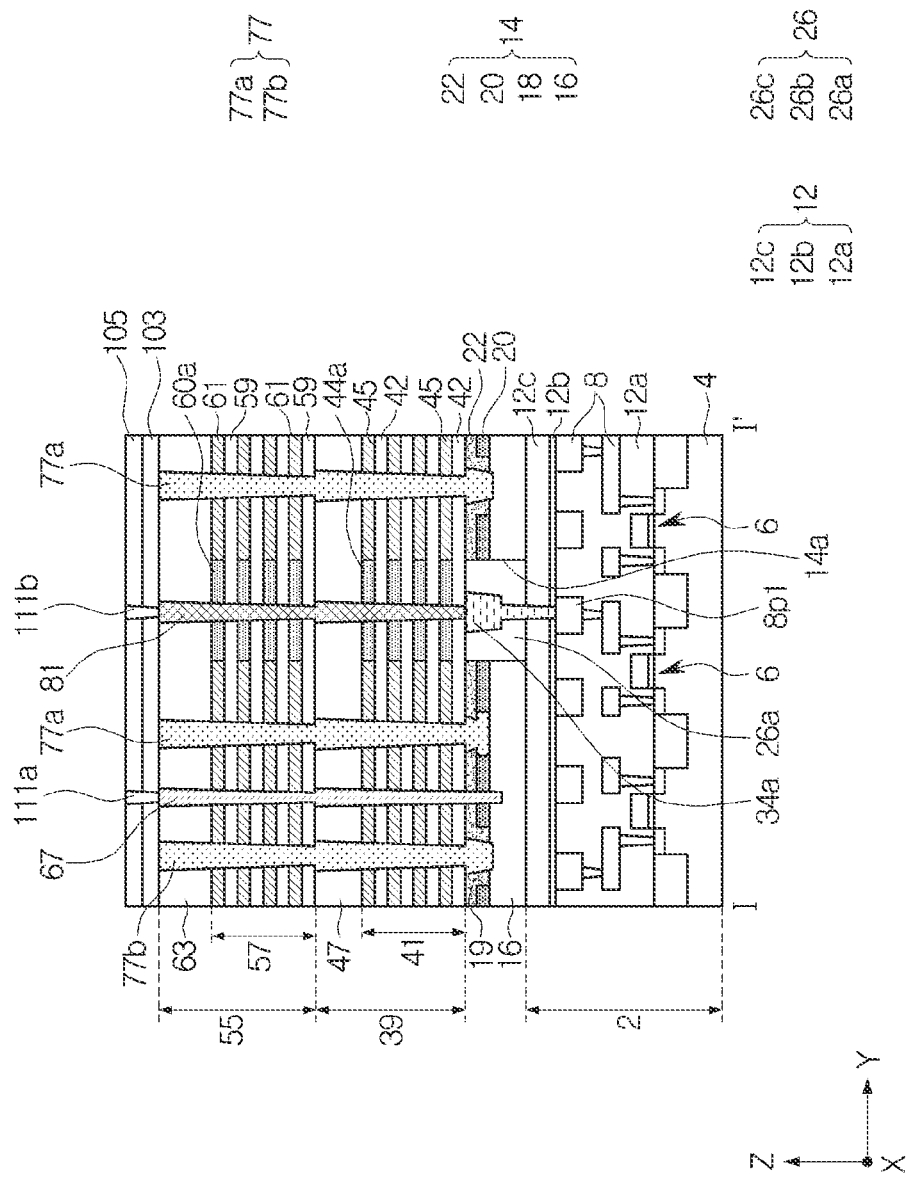
Figure 39B:
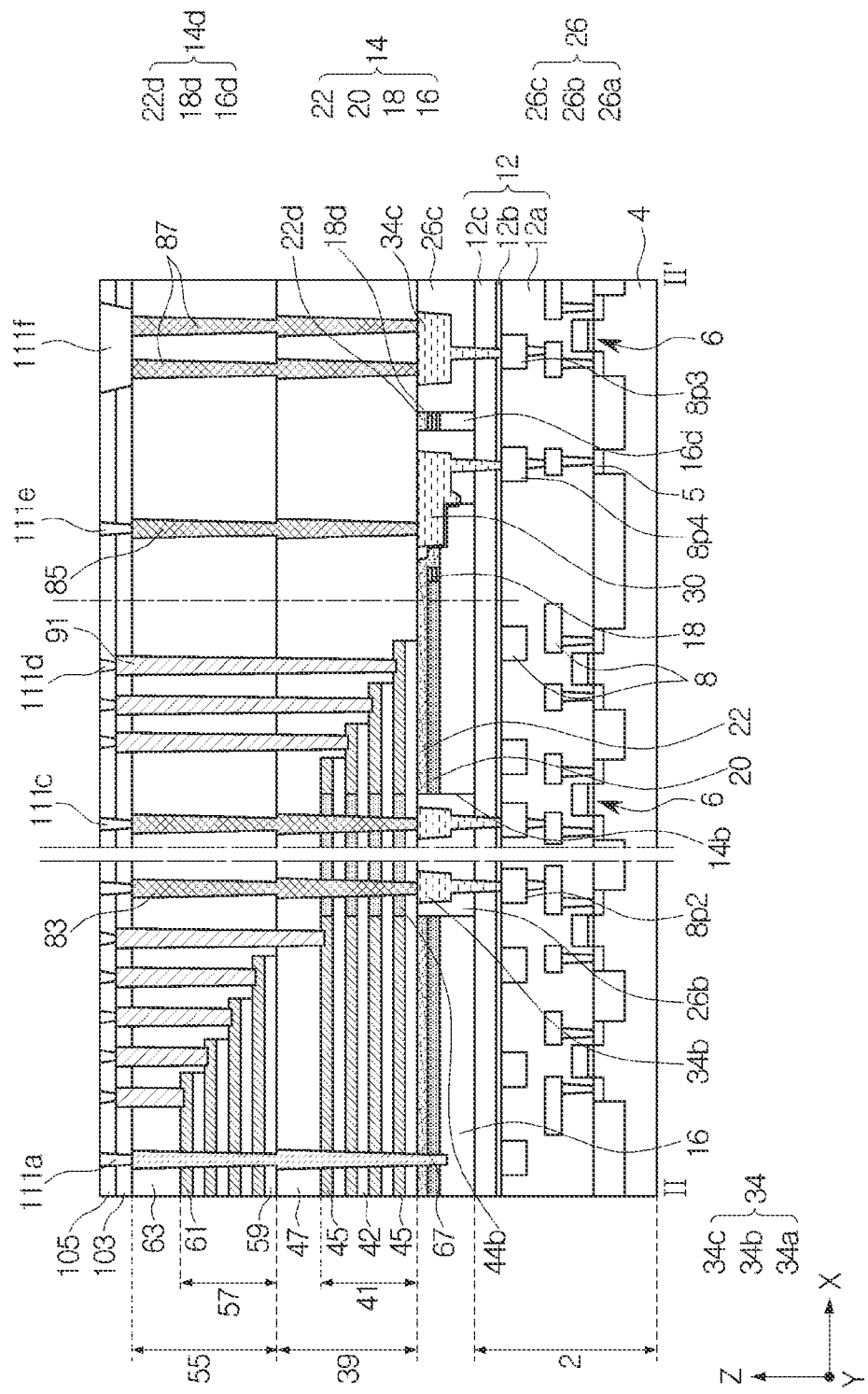

Referring to FIGS. 1, 39A, and 39B, a separation structure 77 filling the separation trench 76 may be formed. In an example embodiment, the separation structure 77 may be formed of an insulating material. In another example embodiment, the separation structure 77 may be formed as a conductive material layer and an insulating spacer surrounding a lateral surface of the conductive material layer.

Contact holes may be formed by simultaneously removing the first contact lower sacrificial pattern 50c and the first contact upper sacrificial pattern 65c stacked or aligned in order, the second contact lower sacrificial pattern 50d and the second contact upper sacrificial pattern 65d stacked or aligned in order, the third contact lower sacrificial pattern 50e and the third contact upper sacrificial pattern 65e stacked or aligned in order, and the external contact lower sacrificial pattern 50f and the external contact upper sacrificial pattern 65f stacked or aligned in order, and the contact holes may be filled with a conductive material, thereby forming contact plugs 81, 83, 85, and 87.

The contact plugs 81, 83, 85, and 87 may include a first internal contact plug 81 disposed in a contact hole formed by removing the first contact lower sacrificial pattern 50c and the first contact upper sacrificial pattern 65c stacked or aligned in order, a second internal contact plug 83 disposed in a contact hole formed by removing the second contact lower sacrificial pattern 50d and the second contact upper sacrificial pattern 65d stacked or aligned in order, a source contact plug 85 disposed in a contact hole formed by removing the third contact lower sacrificial pattern 50e and the third contact upper sacrificial pattern 65e stacked or aligned in order, and a external contact plug 87 disposed in a contact hole formed by removing the external contact lower sacrificial pattern 50f and the external contact upper sacrificial pattern 65f stacked or aligned in order.

A first upper insulating layer 103 may be formed on the second upper stack structure 55 and the contact plugs 81, 83, 85, and 87.

Gate contact holes for exposing pad regions of the lower and upper gate layers 45 and 61 may be formed by patterning the first upper insulating layer 103 and the first and second capping insulating layers 47 and 63, and gate contact plugs 91 may be formed in the gate contact holes.

A second upper insulating layer 105 may be formed on the first upper insulating layer 103. Thereafter, the first to sixth lower connection plugs 111a to 111f described with reference to FIGS. 2A and 2B may be formed.

Referring back to FIGS. 1, 2A, and 2B, a third upper insulating layer 107 may be formed on the second upper insulating layer 105. Thereafter, the first to sixth upper connection plugs 113a to 113f described with reference to FIGS. 2A and 2B may be formed on the first to sixth lower connection plugs 111a to 111f. The bit lines 115a, the gate connection wirings 115b, the source connection wiring 115d, and the external connection wiring 115c, described with reference to FIGS. 2A and 2B, may be formed on the first to sixth upper connection plugs 113a to 113f.

In the description below, another example embodiment of a method of manufacturing a semiconductor device will be described with reference to FIGS. 40A to 41B. In FIGS. 40A to 41B, FIGS. 40A and 41A are cross-sectional diagrams illustrating a region along line I-I' in FIG. 1, and FIGS. 41A and 41B are cross-sectional diagrams illustrating a region along line II-II' in FIG. 1. In the description below, the other example embodiment of a method of manufacturing a semiconductor device will be described briefly by referring to the method described with reference to FIGS. 33A to 39B.

Figure 40A:
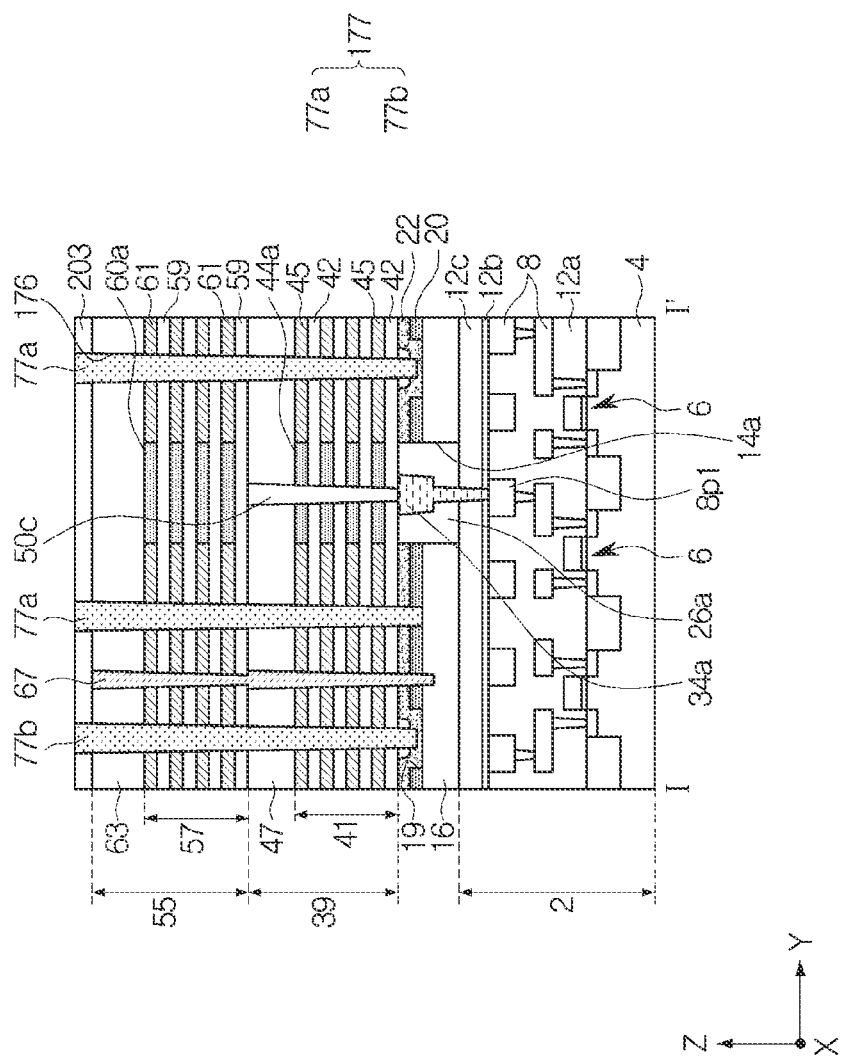
FIGS. 40A to 41B are cross-sectional diagrams illustrating another example embodiment of a method of manufacturing a semiconductor device.
Figure 40B:
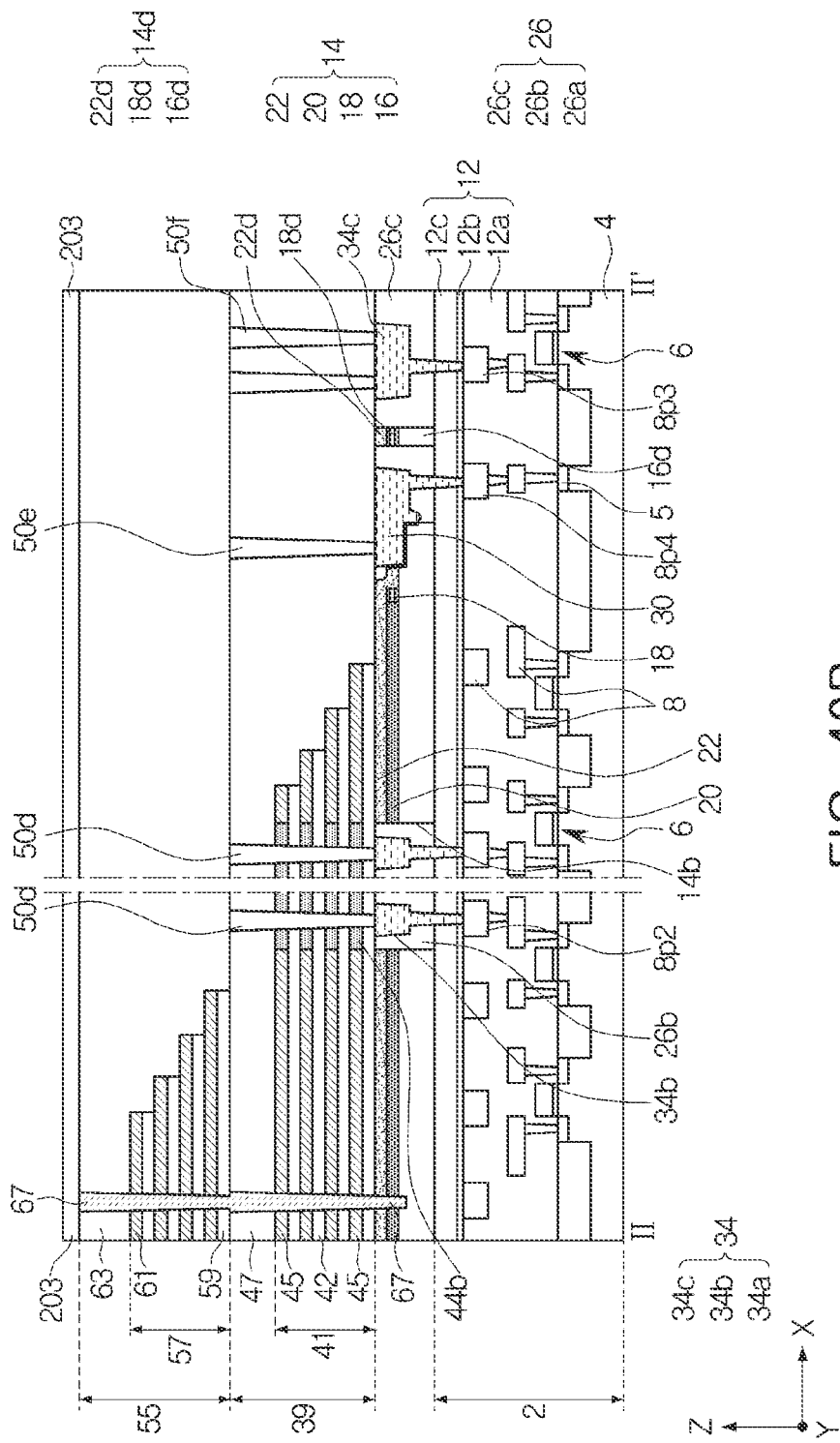
Figure 41A:
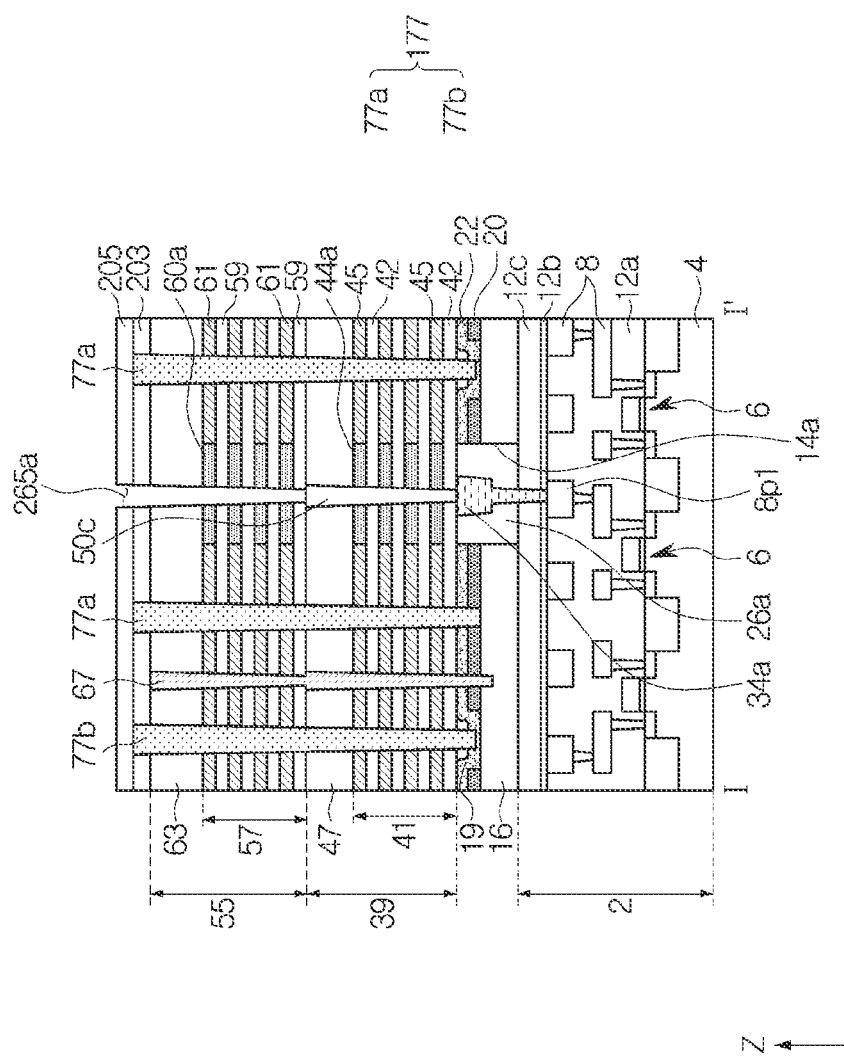
Figure 41B:
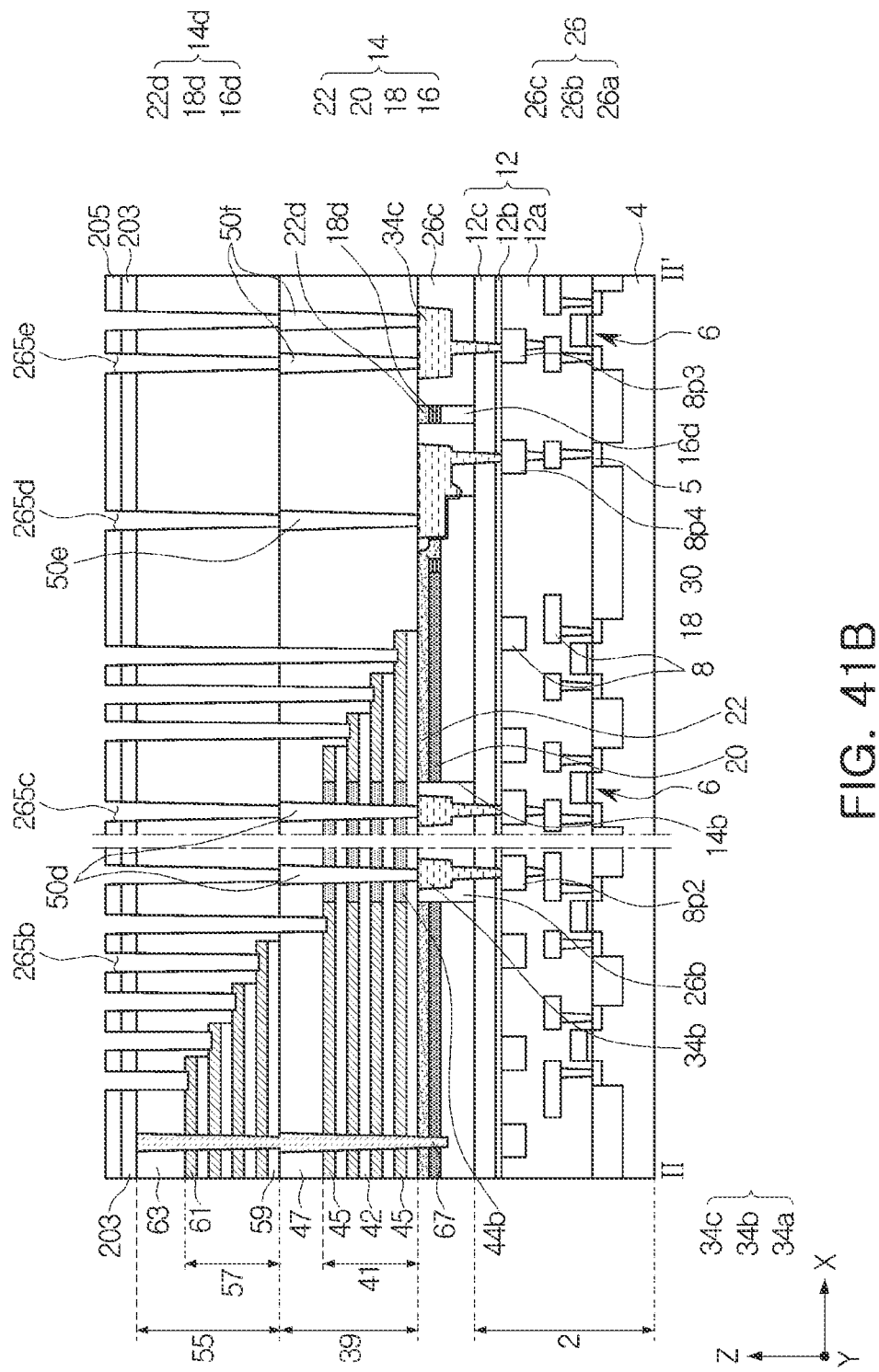

Referring to FIGS. 1, 40A, and 40B, the lower structure 2, the pattern structure 14, the dummy pattern 14d, the intermediate insulating structures 26a, 26b, and 26c, and the pad patterns 34 described with reference to FIGS. 33A and 33B may be formed. The sacrificial metal pattern 32 described in FIG. 33A may be formed or may not be provided. In the description below, an example in which the sacrificial metal pattern 32 is not provided will be described.

The first preliminary upper structure 38 (in FIGS. 34A and 34B) as in FIGS. 34A and 34B may be formed, and the channel lower sacrificial pattern 50a (in FIGS. 34A and 34B), the first contact lower sacrificial pattern 50c, the second contact lower sacrificial pattern 50d, the third contact lower sacrificial pattern 50e, and the external contact lower sacrificial pattern 50f may be formed.

In an example embodiment, to form the separation structures 277 as illustrated in FIG. 20, the separation lower sacrificial pattern 50b (in FIGS. 34A and 34B) as in FIGS. 34A and 34B may be formed.

In another example embodiment, to form the separation structures 177 (in FIG. 19A) as in FIG. 19A, the forming the separation lower sacrificial pattern 50b (in FIGS. 34A and 34B) described with reference to FIGS. 34A and 34B may not be performed. In the description below, an example embodiment in which the forming the separation lower sacrificial pattern 50b (in FIGS. 34A and 34B) described with reference to FIGS. 34A and 34B is not performed will be described.

In an example embodiment, the second preliminary upper structure 54 (in FIGS. 35A and 35B) illustrated in FIGS. 35A and 35B may be formed, and the channel upper sacrificial pattern 65a (in FIGS. 35A and 35B) may be formed. In this case, the forming the separation upper sacrificial pattern 65b (in FIGS. 35A and 35B), the first contact upper sacrificial pattern 65c (in FIGS. 35A and 35B), the second contact upper sacrificial pattern 65d (in FIGS. 35A and 35B), the third contact upper sacrificial pattern 65e (in FIGS. 35A and 35B), and the external contact upper sacrificial pattern 65f (in FIGS. 35A and 35B), as described with reference to FIGS. 35A and 35B, may not be performed.

A first upper insulating layer 203 may be formed on the second preliminary upper structure 54 (in FIGS. 35A and 35B).

Separation trenches 176 penetrating the first upper insulating layer 203 and the second preliminary upper structure 54 (in FIGS. 35A and 35B) may be formed. The separation trenches 176 may expose the sacrificial pattern layer 18 (in FIG. 37), substantially similarly to the separation trenches 77 (in FIG. 37) described with reference to FIG. 37. Thereafter, the sacrificial pattern layer 18 (in FIG. 37) may be replaced with an intermediate pattern layer 20 by the same method described with reference to FIGS. 38A and 38B.

The gate empty spaces, and the first and second mold layers 44a, 44b, and 60a which may remain, described with reference to FIGS. 38A and 38B, may be formed by partially etching the first and second mold layers 44 and 60 (in FIG. 37) exposed by the separation trenches 176 by the same method described with reference to FIGS. 38A and 38B, and the lower and upper gate layers 45 and 61 may be formed in the gate empty spaces. Accordingly, the first upper structure 39 and the second upper stack structure 55 as in FIGS. 19A and 19B may be formed.

Separation structures 177 may be formed in the separation trenches 176. The separation structures 177 may be the same as in FIG. 19A.

Referring to FIGS. 1, 41A, and 41B, a second upper insulating layer 205 may be formed on the first upper insulating layer 203.

In an example embodiment, a first contact upper contact hole 265a penetrating the first and second upper insulating layers 203 and 205, extending downwardly, and exposing the first contact lower sacrificial pattern 50c, a second contact upper contact hole 265c exposing the second contact lower sacrificial pattern 50d, a third contact upper contact hole 265d exposing the third contact lower sacrificial pattern 50e, and an external upper contact hole 265e exposing the external contact lower sacrificial pattern 50f may be formed.

In an example embodiment, while the first to third contact upper contact holes 265a, 265c, and 265d and the external upper contact hole 265e are formed, gate contact holes 265b simultaneously exposing pad regions of the lower and upper gate layers 45 and 61 may be formed.

In another example embodiment, the forming the gate contact holes 265b may include forming gate contact holes exposing pad regions of at least some of the lower gate layers 45, forming the first to third contact upper contact holes 265a, 265c, and 265d and the external upper contact hole 265e, and forming gate contact holes exposing pad regions of the remaining upper and lower gate layers 45 and 61.

Thereafter, the first to third contact lower sacrificial patterns 50c, 50d, and 50e and the external contact lower sacrificial pattern 50f exposed by the first to third contact upper contact holes 265a, 265c, and 265d and the external upper contact hole 265e may be removed. Thereafter, processes of depositing and planarizing a conductive material layer may be performed, thereby forming the first and second internal contact plugs 181 and 183 (in FIGS. 19A and 19B), the source contact plug 185 (in FIG. 19B), and the external contact plug 187 (in FIG. 19B), described with reference to FIGS. 19A and 19B.

According to the aforementioned example embodiments, at least two of the separation structures 77, the memory vertical structure 67, the first internal contact plug 81, the second internal contact plug 83, the source contact plug 85, and the external contact plug 87 may have a lateral surface having at least one bent portion. Accordingly, processes for forming the at least two of the separation structures 77, the memory vertical structure 67, the first internal contact plug 81, the second internal contact plug 83, the source contact plug 85, and the external contact plug 87 may be merged. Accordingly, productivity of the semiconductor device may improve.

According to the aforementioned example embodiments, as at least two of the separation structures 77, the memory vertical structure 67, the first internal contact plug 81, the second internal contact plug 83, the source contact plug 85, and the external contact plug 87 include a lateral surface having at least one bent portion, the at least two elements may be formed on a higher level and a defect may decrease. Accordingly, integration density of the semiconductor device may increase, and reliability of the semiconductor device may improve.

According to the aforementioned example embodiments, the first internal contact plug 81, the second internal contact plug 83, the source contact plug 85, and the external contact plug 87 may be disposed on a metallic pattern (e.g., the contact pattern 30 and the pad patterns 34) disposed on a level the same as a level of at least a portion of the pattern structure including polysilicon. By providing the metallic pattern, the contact pattern 30 and the pad patterns 34, the first internal contact plug 81, the second internal contact plug 83, the source contact plug 85, and the external contact plug 87 may be stably formed. Accordingly, integration density of the semiconductor device may increase, and reliability of the semiconductor device may improve.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the example embodiments have been shown and described above, it will be apparent to those skilled in the art that modifications and variations could be made without departing from the scope of the present disclosure as defined by the appended claims.

What is claimed is:

1. A semiconductor device comprising:
a lower structure;
a pattern structure on the lower structure;
a first stack structure and a second stack structure on the lower structure
a separation structure penetrating through the first stack structure;
a memory vertical structure penetrating through the first stack structure and contacting the pattern structure; and
a contact plug penetrating through the second stack structure,
wherein the first stack structure includes first insulating layers and conductive layers alternately stacked in a vertical direction,
wherein the second stack structure includes second insulating layers and third insulating layers alternately stacked in the vertical direction,
wherein the third insulating layers include a material different from a material of the second insulating layers,
wherein the contact plug includes:
a first plug portion penetrating through a plurality of lower insulating layers of the third insulating layers; and
a second plug portion penetrating through a plurality of upper insulating layers of the third insulating layers, and
wherein a lateral surface of the contact plug includes a bent portion between a lateral surface of the first plug portion and a lateral surface of the second plug portion.

2. The semiconductor device of claim 1, further comprising:
a pad pattern between the lower structure and the second stack structure,
wherein the pad pattern is spaced apart from the pattern structure,
wherein the contact plug contacts the pad pattern, and
wherein at least a portion of the pad pattern is at a same level as the pattern structure.

3. The semiconductor device of claim 2,
wherein at least a portion of the pad pattern includes a metal layer.

4. The semiconductor device of claim 2,
wherein the lower structure includes a circuit structure and a lower pad,
wherein the pad pattern includes a pad portion and a via portion below the pad portion,
wherein a width of the pad portion is greater than a width of the via portion,
wherein the pad portion contacts the contact plug, and
wherein the via portion contacts the lower pad.

5. The semiconductor device of claim 4,
wherein at least a portion of the pad portion is at a same level as the pattern structure.

6. The semiconductor device of claim 4,
wherein at least a portion of the via portion is at a lower level than the pattern structure.

7. The semiconductor device of claim 1,
wherein the first insulating layers are at a same level as the second insulating layers, and
wherein the conductive layers are at a same level as the third insulating layers.

8. The semiconductor device of claim 1,
wherein the memory vertical structure includes:
a core region;
a channel layer on a side surface of the core region; and
a dielectric layer on an external side surface of the channel layer and including a data storage material layer,
wherein the pattern structure includes a first polysilicon layer, and
wherein the channel layer contacts the first polysilicon layer.

9. The semiconductor device of claim 8,
wherein the pattern structure further includes a second polysilicon layer below the first polysilicon layer, and
wherein the second polysilicon layer is spaced apart from the channel layer.

10. The semiconductor device of claim 1,
wherein the memory vertical structure includes:
a first vertical portion penetrating through a plurality of lower conductive layers of the conductive layers; and
a second vertical portion penetrating through a plurality of upper conductive layers of the conductive layers,
wherein a lateral surface of the memory vertical structure includes a bent portion between a lateral surface of the first vertical portion and a lateral surface of the second vertical portion.

11. The semiconductor device of claim 10,
wherein the plurality of lower conductive layers are at a same level as the plurality of lower insulating layers, and
wherein the plurality of upper conductive layers are at a same level as the plurality of upper insulating layers.

12. The semiconductor device of claim 10, further comprising a conductive pattern contacting the pattern structure,
wherein at least a portion of the conductive pattern includes a metal layer, and
wherein at least a portion of the pattern structure includes a polysilicon layer.

13. A semiconductor device comprising:
a lower structure including a circuit structure;
a pattern structure on the lower structure;
a first stack structure and a second stack structure on lower structure;
the pattern structure between the first stack structure and the lower structure;
a separation structure penetrating through the first stack structure and contacting the pattern structure;
a memory vertical structure penetrating through the first stack structure and contacting the pattern structure; and
a vertical pillar penetrating through the second stack structure,
wherein the first stack structure includes first insulating layers and conductive layers alternately stacked in a vertical direction,
wherein the second stack structure includes second insulating layers and third insulating layers alternately stacked in the vertical direction,
wherein the third insulating layers include a material different from a material of the second insulating layers,
wherein the memory vertical structure includes:
a core region;
a channel layer on a side surface of the core region; and
a dielectric layer on an external side surface of the channel layer and including a data storage material layer,
wherein the pattern structure includes:
a first layer;
a second layer on the first layer; and
a third layer on the second layer, wherein the separation structure includes:
  a lower portion contacting the pattern structure; and
  an upper portion on the lower portion, and
wherein the lower portion of the separation structure includes:
  a first portion having a first width and contacting the second layer;
  a second portion on the first portion and having a second width smaller than the first width; and
  a third portion on the second portion and having a third width greater than the second width.

14. The semiconductor device of claim 13,
wherein at least a portion of the first portion is at a same level as the second layer, and
wherein the second portion is at a lower level than a lowermost conductive layer of the conductive layers.

15. The semiconductor device of claim 14,
wherein a lower surface of the first portion contacts the first layer,
wherein the first layer is a first polysilicon layer,
wherein the second layer is a second polysilicon layer, and
wherein the third layer is a third polysilicon layer.

16. The semiconductor device of claim 13,
wherein the first width of the first portion is greater than the third width of the third portion.

17. The semiconductor device of claim 13,
wherein at least a portion of the first portion is at a same level as the second layer, and
wherein the third portion is at a lower level than a lowermost conductive layer of the conductive layers.

18. The semiconductor device of claim 13,
wherein the lower portion of the separation structure further includes a fourth portion on the third portion and having a fourth width smaller than the third width.

19. The semiconductor device of claim 13, further comprising a pad pattern between the second stack structure and the lower structure,
wherein the vertical pillar contacts the pad pattern,
wherein at least a portion of the pad pattern is at a same level as the pattern structure,
wherein the vertical pillar includes:
  a first vertical portion penetrating through a plurality of lower insulating layers of the third insulating layers; and
  a second vertical portion penetrating through a plurality of upper insulating layers of the third insulating layers, and
wherein a lateral surface of the vertical pillar includes a bent portion between a lateral surface of the first vertical portion and a lateral surface of the second vertical portion.

20. The semiconductor device of claim 19, wherein at least one of the first layer, the second layer and the third layer includes a polysilicon layer, and
wherein the pad pattern includes a metal layer.

* * * * *